(12) United States Patent
Sirpal et al.

(10) Patent No.: US 9,152,179 B2
(45) Date of Patent: Oct. 6, 2015

(54) PORTRAIT DUAL DISPLAY AND LANDSCAPE DUAL DISPLAY

(71) Applicant: Z124, Georgetown (KY)

(72) Inventors: Sanjiv Sirpal, Oakville (CA); Mohammed Selim, Oakville (CA)

(73) Assignee: Z124, George Town (KY)

( * ) Notice: Subject to any disclaimer, the term of this patent is extended or adjusted under 35 U.S.C. 154(b) by 188 days.

(21) Appl. No.: 13/624,565

(22) Filed: Sep. 21, 2012

(65) Prior Publication Data

US 2013/0076672 A1 Mar. 28, 2013

Related U.S. Application Data

(60) Provisional application No. 61/539,884, filed on Sep. 27, 2011.

(51) Int. Cl.
| | | |
|---|---|---|
| *G06F 3/041* | (2006.01) | |
| *G09G 5/00* | (2006.01) | |
| *G06F 1/16* | (2006.01) | |
| *G06F 9/44* | (2006.01) | |
| *G06F 3/0481* | (2013.01) | |
| *G06F 3/0483* | (2013.01) | |
| *G06F 3/0488* | (2013.01) | |

(Continued)

(52) U.S. Cl.
CPC ............ *G06F 1/1641* (2013.01); *G06F 1/1616* (2013.01); *G06F 1/1692* (2013.01); *G06F 3/0481* (2013.01); *G06F 3/0483* (2013.01); *G06F 3/04883* (2013.01); *G06F 3/1423* (2013.01); *G06F 3/1438* (2013.01); *G06F 3/1446* (2013.01); *G06F 9/4443* (2013.01); *G09G 5/14* (2013.01); *E05Y 2900/606* (2013.01)

(58) Field of Classification Search
CPC ... G06F 3/0483; G06F 3/1423; G06F 3/1446; G06F 3/1438; G09G 5/14
USPC .............................. 345/158, 659, 689, 1.1, 1.3
See application file for complete search history.

(56) References Cited

U.S. PATENT DOCUMENTS

| | | |
|---|---|---|
| 5,396,630 A | 3/1995 | Banda et al. |
| 5,673,403 A | 9/1997 | Brown et al. |
| 5,764,984 A | 6/1998 | Loucks |

(Continued)

FOREIGN PATENT DOCUMENTS

| | | |
|---|---|---|
| JP | 7-219903 | 8/1995 |
| JP | 08-115144 | 5/1996 |

(Continued)

OTHER PUBLICATIONS

U.S. Appl. No. 13/843,086, filed Mar. 15, 2013, Reeves et al.

(Continued)

*Primary Examiner* — Aneeta Yodichkas
*Assistant Examiner* — Brent D Castiaux
(74) *Attorney, Agent, or Firm* — Sheridan Ross P.C.

(57) ABSTRACT

Methods and devices for controlling the displayed output associated with applications in connection with a multiple screen device are provided. More particularly, an application presented by the device in a dual portrait orientation can utilize the first screen to display control information, and can utilize the second screen to display content information. An application presented by the device in a dual landscape orientation can utilize both the first screen and the second screen to display content information.

20 Claims, 56 Drawing Sheets

(51) Int. Cl.
  *G06F 3/14*      (2006.01)
  *G09G 5/14*      (2006.01)

(56) References Cited

U.S. PATENT DOCUMENTS

| | | |
|---|---|---|
| 5,874,928 A | 2/1999 | Kou |
| 6,108,715 A | 8/2000 | Leach et al. |
| 6,157,959 A | 12/2000 | Bonham et al. |
| 6,178,503 B1 | 1/2001 | Madden et al. |
| 6,182,158 B1 | 1/2001 | Kougiouris et al. |
| 6,260,075 B1 | 7/2001 | Cabrero et al. |
| 6,477,585 B1 | 11/2002 | Cohen et al. |
| 6,486,890 B1 | 11/2002 | Harada et al. |
| 6,507,336 B1 | 1/2003 | Lunsford |
| 6,573,913 B1 | 6/2003 | Butler et al. |
| 6,694,368 B1 | 2/2004 | An et al. |
| 6,826,703 B2 | 11/2004 | Kawano et al. |
| 6,917,963 B1 | 7/2005 | Hipp et al. |
| 6,927,908 B2 | 8/2005 | Stark |
| 6,961,941 B1 | 11/2005 | Nelson et al. |
| 6,970,173 B2 | 11/2005 | Ciolac |
| 7,007,240 B1 | 2/2006 | Anderson et al. |
| 7,069,519 B1 | 6/2006 | Okude et al. |
| 7,127,723 B2 | 10/2006 | Endo et al. |
| 7,176,943 B2 | 2/2007 | Meyers et al. |
| 7,284,203 B1 | 10/2007 | Meeks et al. |
| 7,424,601 B2 | 9/2008 | Xu |
| 7,453,465 B2 | 11/2008 | Schmieder et al. |
| 7,478,341 B2 | 1/2009 | Dove |
| 7,489,503 B2 | 2/2009 | Maatta |
| 7,565,535 B2 | 7/2009 | Roberts et al. |
| 7,681,134 B1 | 3/2010 | Grechishkin et al. |
| 7,705,799 B2 | 4/2010 | Niwa |
| 7,880,728 B2 | 2/2011 | de los Reyes et al. |
| 7,949,633 B1 | 5/2011 | Shaver et al. |
| 7,950,008 B2 | 5/2011 | Bhide et al. |
| 7,960,945 B1 | 6/2011 | Onorato et al. |
| 8,194,001 B2 | 6/2012 | Miller et al. |
| 8,397,245 B2 | 3/2013 | Filali-Adib et al. |
| 8,704,777 B2 | 4/2014 | Small et al. |
| 2002/0010844 A1 | 1/2002 | Noel et al. |
| 2002/0015881 A1 | 2/2002 | Nakamura et al. |
| 2002/0130888 A1 | 9/2002 | Perry et al. |
| 2002/0157001 A1 | 10/2002 | Huang et al. |
| 2002/0158811 A1 | 10/2002 | Davis |
| 2003/0001848 A1 | 1/2003 | Doyle et al. |
| 2003/0017417 A1 | 1/2003 | Goodin et al. |
| 2003/0020954 A1 | 1/2003 | Udom et al. |
| 2003/0079010 A1 | 4/2003 | Osborn |
| 2003/0079205 A1 | 4/2003 | Miyao et al. |
| 2003/0115443 A1 | 6/2003 | Cepulis et al. |
| 2003/0131143 A1 | 7/2003 | Myers |
| 2003/0174172 A1 | 9/2003 | Conrad et al. |
| 2003/0177285 A1 | 9/2003 | Hunt et al. |
| 2003/0179541 A1 | 9/2003 | Sullivan |
| 2003/0226116 A1 | 12/2003 | Kuwata et al. |
| 2004/0137855 A1 | 7/2004 | Wiley et al. |
| 2004/0141085 A1 | 7/2004 | Nickel et al. |
| 2004/0226023 A1 | 11/2004 | Tucker |
| 2005/0034017 A1 | 2/2005 | Airaud et al. |
| 2005/0083642 A1 | 4/2005 | Senpuku et al. |
| 2005/0193267 A1 | 9/2005 | Liu et al. |
| 2005/0216594 A1 | 9/2005 | O'Brien et al. |
| 2005/0237587 A1 | 10/2005 | Nakamura |
| 2005/0246505 A1 | 11/2005 | McKenney et al. |
| 2005/0248501 A1 | 11/2005 | Kim |
| 2006/0005187 A1 | 1/2006 | Neil |
| 2006/0031572 A1 | 2/2006 | Feuerstein et al. |
| 2006/0107020 A1 | 5/2006 | Stillwell, Jr. et al. |
| 2006/0136828 A1 | 6/2006 | Asano |
| 2006/0139862 A1 | 6/2006 | Wang et al. |
| 2006/0183505 A1 | 8/2006 | Willrich |
| 2006/0187142 A1 | 8/2006 | Lesniak |
| 2006/0227806 A1 | 10/2006 | Tseng |
| 2006/0248404 A1 | 11/2006 | Lindsay et al. |
| 2007/0005661 A1 | 1/2007 | Yang |
| 2007/0014295 A1 | 1/2007 | Fernandes et al. |
| 2007/0022155 A1 | 1/2007 | Owens et al. |
| 2007/0033260 A1 | 2/2007 | Grouzdev et al. |
| 2007/0050751 A1 | 3/2007 | Husmann et al. |
| 2007/0067769 A1 | 3/2007 | Geisinger |
| 2007/0085759 A1* | 4/2007 | Lee et al. ............... 345/1.1 |
| 2007/0111750 A1 | 5/2007 | Stohr et al. |
| 2007/0136356 A1 | 6/2007 | Smith et al. |
| 2007/0156729 A1 | 7/2007 | Shaylor |
| 2007/0164923 A1 | 7/2007 | Kanai et al. |
| 2007/0182663 A1 | 8/2007 | Biech |
| 2007/0198760 A1 | 8/2007 | Han |
| 2007/0271522 A1 | 11/2007 | Son et al. |
| 2007/0285401 A1 | 12/2007 | Ohki et al. |
| 2007/0288941 A1 | 12/2007 | Dunshea et al. |
| 2008/0024388 A1 | 1/2008 | Bruce |
| 2008/0057910 A1 | 3/2008 | Thoresson et al. |
| 2008/0062625 A1 | 3/2008 | Batio |
| 2008/0071595 A1 | 3/2008 | Chang et al. |
| 2008/0082815 A1 | 4/2008 | Kawano et al. |
| 2008/0090525 A1 | 4/2008 | Joo |
| 2008/0119237 A1 | 5/2008 | Kim |
| 2008/0119731 A1 | 5/2008 | Becerra et al. |
| 2008/0126762 A1 | 5/2008 | Kelley et al. |
| 2008/0134061 A1 | 6/2008 | Banerjee et al. |
| 2008/0155103 A1 | 6/2008 | Bailey |
| 2008/0244599 A1 | 10/2008 | Hodson et al. |
| 2008/0282181 A1 | 11/2008 | Ferguson |
| 2008/0291283 A1 | 11/2008 | Achiwa et al. |
| 2008/0299951 A1 | 12/2008 | Karkanias et al. |
| 2009/0037649 A1 | 2/2009 | Xu |
| 2009/0055749 A1 | 2/2009 | Chatterjee et al. |
| 2009/0083829 A1 | 3/2009 | Peterson |
| 2009/0089569 A1 | 4/2009 | Baribault et al. |
| 2009/0100429 A1 | 4/2009 | Thoelke et al. |
| 2009/0109468 A1 | 4/2009 | Barclay et al. |
| 2009/0119580 A1 | 5/2009 | Rohrabaugh et al. |
| 2009/0138818 A1 | 5/2009 | Nemoto |
| 2009/0158299 A1 | 6/2009 | Carter |
| 2009/0164930 A1 | 6/2009 | Chen et al. |
| 2009/0176571 A1 | 7/2009 | Sternberg |
| 2009/0217071 A1 | 8/2009 | Huang et al. |
| 2009/0219254 A1 | 9/2009 | Lai et al. |
| 2009/0249247 A1 | 10/2009 | Tseng et al. |
| 2009/0249331 A1 | 10/2009 | Davis et al. |
| 2009/0256780 A1 | 10/2009 | Small et al. |
| 2009/0257657 A1 | 10/2009 | Temmermans et al. |
| 2009/0278806 A1 | 11/2009 | Duarte et al. |
| 2009/0298546 A1 | 12/2009 | Kim et al. |
| 2009/0305743 A1 | 12/2009 | Gouesbet et al. |
| 2009/0313440 A1 | 12/2009 | Kim et al. |
| 2009/0322690 A1 | 12/2009 | Hiltunen et al. |
| 2009/0327560 A1 | 12/2009 | Yalovsky |
| 2010/0005396 A1 | 1/2010 | Nason et al. |
| 2010/0007603 A1 | 1/2010 | Kirkup |
| 2010/0013863 A1 | 1/2010 | Harris |
| 2010/0037166 A1 | 2/2010 | Chandrasekar et al. |
| 2010/0046026 A1 | 2/2010 | Heo |
| 2010/0049775 A1 | 2/2010 | Rajawat |
| 2010/0060549 A1 | 3/2010 | Tsern |
| 2010/0063994 A1 | 3/2010 | Cook et al. |
| 2010/0064228 A1 | 3/2010 | Tsern |
| 2010/0064244 A1 | 3/2010 | Kilpatrick et al. |
| 2010/0064536 A1 | 3/2010 | Caskey et al. |
| 2010/0066763 A1 | 3/2010 | Macdougall et al. |
| 2010/0079355 A1 | 4/2010 | Kilpatrick, II et al. |
| 2010/0085274 A1 | 4/2010 | Kilpatrick et al. |
| 2010/0085301 A1 | 4/2010 | Cohen et al. |
| 2010/0085382 A1 | 4/2010 | Lundqvist et al. |
| 2010/0097386 A1 | 4/2010 | Kim et al. |
| 2010/0107163 A1 | 4/2010 | Lee |
| 2010/0110480 A1* | 5/2010 | Satake ............... 358/1.15 |
| 2010/0122271 A1 | 5/2010 | Labour et al. |
| 2010/0149121 A1 | 6/2010 | Alexander et al. |
| 2010/0157518 A1 | 6/2010 | Ladouceur et al. |
| 2010/0164836 A1 | 7/2010 | Liberatore |
| 2010/0177019 A1 | 7/2010 | Jeong et al. |
| 2010/0177047 A1 | 7/2010 | Brenneman et al. |

(56) References Cited

U.S. PATENT DOCUMENTS

| | | |
|---|---|---|
| 2010/0182265 A1 | 7/2010 | Kim et al. |
| 2010/0207903 A1* | 8/2010 | Kim et al. .................. 345/173 |
| 2010/0211769 A1 | 8/2010 | Shankar et al. |
| 2010/0227650 A1 | 9/2010 | Kim et al. |
| 2010/0245256 A1 | 9/2010 | Estrada et al. |
| 2010/0246119 A1 | 9/2010 | Collopy et al. |
| 2010/0250975 A1 | 9/2010 | Gill et al. |
| 2010/0251233 A1 | 9/2010 | Majewski et al. |
| 2010/0319008 A1 | 12/2010 | Ho |
| 2010/0321275 A1 | 12/2010 | Hinckley et al. |
| 2011/0012858 A1 | 1/2011 | Brookes et al. |
| 2011/0016299 A1 | 1/2011 | Galicia et al. |
| 2011/0016301 A1 | 1/2011 | Galicia et al. |
| 2011/0018901 A1 | 1/2011 | Boorman et al. |
| 2011/0025625 A1 | 2/2011 | Hirako |
| 2011/0034214 A1 | 2/2011 | Hong et al. |
| 2011/0063192 A1 | 3/2011 | Miller et al. |
| 2011/0093691 A1 | 4/2011 | Galicia et al. |
| 2011/0093836 A1 | 4/2011 | Galicia et al. |
| 2011/0096014 A1 | 4/2011 | Fuyuno et al. |
| 2011/0102314 A1 | 5/2011 | Roux |
| 2011/0113329 A1 | 5/2011 | Pusateri |
| 2011/0115713 A1 | 5/2011 | Altman et al. |
| 2011/0115737 A1 | 5/2011 | Fuyuno et al. |
| 2011/0126216 A1 | 5/2011 | Galicia et al. |
| 2011/0167492 A1 | 7/2011 | Ghosh et al. |
| 2011/0193806 A1* | 8/2011 | Kim et al. .................. 345/173 |
| 2011/0209102 A1 | 8/2011 | Hinckley et al. |
| 2011/0210922 A1* | 9/2011 | Griffin .................. 345/173 |
| 2011/0216064 A1 | 9/2011 | Dahl et al. |
| 2011/0225538 A1 | 9/2011 | Oyagi et al. |
| 2011/0239142 A1 | 9/2011 | Steeves et al. |
| 2011/0246904 A1 | 10/2011 | Pinto et al. |
| 2011/0260997 A1 | 10/2011 | Ozaki |
| 2011/0267478 A1 | 11/2011 | Jacobs |
| 2011/0273464 A1 | 11/2011 | Brunner et al. |
| 2011/0273475 A1 | 11/2011 | Herz et al. |
| 2011/0289444 A1 | 11/2011 | Winsky |
| 2011/0291964 A1 | 12/2011 | Chambers et al. |
| 2011/0312349 A1 | 12/2011 | Forutanpour |
| 2012/0005602 A1 | 1/2012 | Anttila et al. |
| 2012/0005691 A1 | 1/2012 | Wong et al. |
| 2012/0026069 A1 | 2/2012 | Ohsaki |
| 2012/0060089 A1 | 3/2012 | Heo et al. |
| 2012/0066581 A1 | 3/2012 | Spalink |
| 2012/0076197 A1 | 3/2012 | Byford et al. |
| 2012/0081278 A1 | 4/2012 | Freedman |
| 2012/0081353 A1 | 4/2012 | Yusupov et al. |
| 2012/0081354 A1 | 4/2012 | Yusupov et al. |
| 2012/0081380 A1 | 4/2012 | Reeves et al. |
| 2012/0081383 A1 | 4/2012 | Reeves et al. |
| 2012/0081396 A1 | 4/2012 | Yusupov et al. |
| 2012/0084480 A1 | 4/2012 | Reeves et al. |
| 2012/0084481 A1 | 4/2012 | Reeves et al. |
| 2012/0084542 A1 | 4/2012 | Reeves et al. |
| 2012/0084675 A1 | 4/2012 | Sirpal et al. |
| 2012/0084697 A1 | 4/2012 | Reeves |
| 2012/0084791 A1 | 4/2012 | Benedek et al. |
| 2012/0084792 A1 | 4/2012 | Benedek et al. |
| 2012/0084793 A1 | 4/2012 | Reeves et al. |
| 2012/0084798 A1 | 4/2012 | Reeves et al. |
| 2012/0086716 A1 | 4/2012 | Reeves et al. |
| 2012/0086717 A1 | 4/2012 | Liu |
| 2012/0089906 A1 | 4/2012 | Reeves et al. |
| 2012/0089992 A1 | 4/2012 | Reeves et al. |
| 2012/0094716 A1 | 4/2012 | Reeves |
| 2012/0172088 A1 | 7/2012 | Kirch et al. |
| 2012/0176413 A1 | 7/2012 | Kulik et al. |
| 2012/0188185 A1 | 7/2012 | Cassar |
| 2012/0278747 A1 | 11/2012 | Abraham et al. |
| 2012/0278750 A1 | 11/2012 | Abraham et al. |
| 2013/0019183 A1 | 1/2013 | Reeves et al. |
| 2013/0024778 A1 | 1/2013 | Reeves et al. |
| 2013/0167159 A1 | 6/2013 | Ricci et al. |
| 2014/0380203 A1 | 12/2014 | Freedman |
| 2015/0009237 A1 | 1/2015 | Sirpal et al. |

FOREIGN PATENT DOCUMENTS

| | | |
|---|---|---|
| JP | 2008-225546 | 9/2008 |
| KR | 1020020092969 | 12/2002 |
| KR | 100578592 | 5/2006 |
| KR | 1020060081997 | 7/2006 |
| KR | 100616157 | 8/2006 |
| KR | 100883208 | 2/2009 |
| KR | 1020100043434 | 4/2010 |
| WO | WO 2006/007589 | 7/2006 |
| WO | WO 2006/075859 | 7/2006 |
| WO | WO 2008/132924 | 11/2008 |
| WO | WO 2012/044510 | 4/2012 |
| WO | WO 2012/044518 | 4/2012 |
| WO | WO 2012/044645 | 4/2012 |
| WO | WO 2012/044738 | 4/2012 |
| WO | WO 2012/044872 | 4/2012 |

OTHER PUBLICATIONS

Dutko, "Domo Arigato Mr Androidato—An Introduction to the New Google Mobile Linux Framework, Android," Linux Journal, Mar. 2008, vol. 2008, Iss. 167, 9 pages.

Sud, et al., "Dynamic Migration of Computation Through Virtualization of the Mobile Platform," Mobile Networks and Applications, 2012, (published online Feb. 22, 2011), vol. 17, Iss. 2, pp. 206-215.

International Search Report and Written Opinion for International Patent Application No. PCT/US2012/046800, mailed Feb. 20, 2013, 9 pages.

International Search Report and Written Opinion for International Patent Application No. PCT/US2012/046802, mailed Feb. 20, 2013, 9 pages.

International Search Report for International Patent Application No. PCT/US2011/056149, mailed Apr. 24, 2012 ), 5 pages.

Written Opinion for International Patent Application No. PCT/US2011/056149, mailed Apr. 24, 2012, 4 pages.

International Preliminary Report on Patentability for International Patent Application No. PCT/US2011/056149, mailed Apr. 25, 2013, 6 pages.

International Preliminary Report on Patentability for International (PCT) Patent Application No. PCT/US2011/052822, mailed Apr. 11, 2013 7 pages.

International Preliminary Report on Patentability for International (PCT) Patent Application No. PCT/US2011/052598, mailed Apr. 11, 2013 9 pages.

International Preliminary Report on Patentability for International (PCT) Patent Application No. PCT/US2011/053835, mailed Apr. 11, 2013 6 pages.

International Search Report for International Patent Application No. PCT/US2011/053130, mailed Apr. 24, 2012, 5 pages.

Written Opinion for International Patent Application No. PCT/US2011/053130, mailed Apr. 24, 2012, 4 pages.

International Preliminary Report on Patentability for International Patent Application No. PCT/US2011/053130, mailed Apr. 11, 2013, 6 pages.

International Search Report for International Patent Application No. PCT/US2011/053826, mailed Apr. 27, 2012, 5 pages.

Written Opinion for International Patent Application No. PCT/US2011/053826, mailed Apr. 27, 2012, 4 pages.

International Preliminary Report on Patentability for International Patent Application No. PCT/US2011/053826, mailed Apr. 11, 2013, 6 pages.

International Search Report for International Patent Application No. PCT/US2011/052988, mailed May 3, 2012, 5 pages.

Written Opinion for International Patent Application No. PCT/US2011/052988, mailed May 3, 2012, 4 pages.

International Preliminary Report on Patentability for International Patent Application No. PCT/US2011/052988, mailed Apr. 11, 2013, 6 pages.

(56) References Cited

OTHER PUBLICATIONS

International Search Report for International Application No. PCT/US2011/054605, mailed Apr. 30, 2012, 5 pages.
Written Opinion for International Patent Application No. PCT/US2011/054605, mailed Apr. 30, 2012, 5 pages.
International Preliminary Report on Patentability for International Patent Application No. PCT/US2011/054605, mailed Apr. 11, 2013, 7 pages.
International Search Report for International Patent Application No. PCT/US2011/053909, mailed Apr. 30, 2012, 5 pages.
Written Opinion for International Patent Application No. PCT/US2011/053909, mailed Apr. 30, 2012, 4 pages.
International Preliminary Report on Patentability for International Patent Application No. PCT/US2011/053909, mailed Apr. 11, 2013, 6 pages.
International Search Report for International Patent Application No. PCT/US2011/054623, mailed Apr. 27, 2012, 5 pages.
Written Opinion for International Patent Application No. PCT/US2011/054623, mailed Apr. 27, 2012, 4 pages.
International Preliminary Report on Patentability for International Patent Application No. PCT/US2011/054623, mailed Apr. 11, 2013, 6 pages.
International Search Report for International Patent Application No. PCT/US2011/053037, mailed Mar. 20, 2012, 5 pages.
Written Opinion for International Patent Application No. PCT/US2011/053037, mailed Mar. 20, 2012, 6 pages.
International Preliminary Report on Patentability for International Patent Application No. PCT/US2011/053037, mailed Apr. 11, 2013, 8 pages.
International Search Report for International Patent Application No. PCT/US2011/053923, mailed Apr. 30, 2012, 5 pages.
Written Opinion for International Patent Application No. PCT/US2011/053923, mailed Apr. 30, 2012, 4 pages.
International Preliminary Report on Patentability for International Patent Application No. PCT/US2011/053923, mailed Apr. 11, 2013, 6 pages.
International Search Report for International Patent Application No. PCT/US2011/054017, mailed Apr. 24, 2012, 5 pages.
Written Opinion for International Patent Application No. PCT/US2011/054017, mailed Apr. 24, 2012, 4 pages.
International Preliminary Report on Patentability for International Patent Application No. PCT/US2011/054017, mailed Apr. 11, 2013, 6 pages.
International Preliminary Report on Patentability for International (PCT) Patent Application No. PCT/US2011/054105, mailed Apr. 11, 2013 5 pages.
International Preliminary Report on Patentability for International (PCT) Patent Application No. PCT/US2011/053585, mailed Apr. 11, 2013 6 pages.
International Search Report for International Patent Application No. PCT/US2011/053665, mailed Apr. 30, 2012, 5 pages.
Written Opinion for International Patent Application No. PCT/US2011/053665, mailed Apr. 30, 2012, 4 pages.
International Preliminary Report on Patentability for International Patent Application No. PCT/US2011/053665, mailed Apr. 11, 2013, 6 pages.
International Search Report for International Patent Application No. PCT/US2011/053691, mailed May 4, 2012, 5 pages.
Written Opinion for International Patent Application No. PCT/US2011/053691, mailed May 4, 2012, 4 pages.
International Preliminary Report on Patentability for International Patent Application No. PCT/US2011/053691, mailed Apr. 11, 2013, 6 pages.
International Search Report for International Patent Application No. PCT/US2011/054019, mailed Apr. 10, 2012, 5 pages.
Written Opinion for International Patent Application No. PCT/US2011/054019, mailed Apr. 10, 2012, 4 pages.
International Preliminary Report on Patentability for International Patent Application No. PCT/US2011/054019, mailed Apr. 11, 2013, 6 pages.
International Search Report for International Patent Application No. PCT/US2011/053127, mailed Apr. 24, 2012, 5 pages.
Written Opinion for International Patent Application No. PCT/US2011/053127, mailed Apr. 24, 2012, 4 pages.
International Preliminary Report on Patentability for International Patent Application No. PCT/US2011/053127, mailed Apr. 11, 2013, 6 pages.
Official Action for U.S. Appl. No. 13/247,719, mailed Mar. 29, 2013 16 pages.
Official Action for U.S. Appl. No. 13/247,719, mailed Aug. 16, 2013 20 pages.
Official Action for U.S. Appl. No. 13/484,951, mailed Mar. 11, 2013 11 pages.
Official Action for U.S. Patent Application No. 13/484,951, mailed Jul. 25, 2013 12 pages.
Official Action for U.S. Appl. No. 13/399,901, mailed Aug. 2, 2013 17 pages.
Official Action for U.S. Appl. No. 12/905,920 mailed Dec. 7, 2012, 13 pages.
Official Action for U.S. Appl. No. 12/905,920 mailed Mar. 15, 2012, 12 pages.
Official Action for U.S. Appl. No. 12/905,920 mailed Jul. 3, 2012, 14 pages.
Official Action for U.S. Appl. No. 12/905,920 mailed Apr. 25, 2013, 16 pages.
Official Action for U.S. Appl. No. 12/948,686, mailed Jul. 26, 2013 11 pages.
Official Action for U.S. Appl. No. 12/948,701, mailed Jun. 7, 2013 16 pages.
Official Action for U.S. Appl. No. 13/246,665, mailed Apr. 24, 2013 30 pages.
Official Action for U.S. Appl. No. 246,665, mailed Aug. 28, 2013 33 pages.
Official Action for U.S. Appl. No. 13/217,099 mailed Apr. 10, 2013, 53 pages.
Official Action for U.S. Appl. No. 13/247,885 mailed Mar. 19, 2013, 19 pages.
Notice of Allowance for U.S. Appl. No. 13/247,885, mailed Aug. 29, 2013 12 pages.
Official Action for U.S. Appl. No. 13/251,427 mailed Feb. 15, 2013, 18 pages.
Official Action for U.S. Appl. No. 13/247,166 mailed Mar. 21, 2013, 4 pages Restriction Requirement.
Official Action for U.S. Appl. No. 13/247,166, mailed Jul. 2, 2013 12 pages.
Official Action for U.S. Appl. No. 13/217,130 mailed Mar. 15, 2013, 12 pages.
Official Action for U.S. Appl. No. 13/247,170 mailed Apr. 11, 2013, 36 pages.
Official Action for U.S. Appl. No. 13/247,170, mailed Aug. 5, 2013 34 pages.
Official Action for U.S. Appl. No. 13/246,669 mailed Jan. 8, 2013, 14 pages.
Official Action for U.S. Appl. No. 13/246,699, mailed Jul. 12, 2013 18 pages.
Notice of Allowance for U.S. Appl. No. 13/246,669, mailed Sep. 11, 2013 16 pages.
Official Action for U.S. Appl. No. 13/246,671, mailed Mar. 27, 2013 34 pages.
Official Action for U.S. Appl. No. 13/246,671, mailed Jul. 15, 2013.
Official Action for U.S. Appl. No. 13/246,128 mailed May 10, 2013, 40 pages.
Official Action for U.S. Appl. No. 13/246,128, mailed Aug. 23, 2013 46 pages.
Official Action for U.S. Appl. No. 13/246,133 mailed Apr. 16, 2013, 25 pages.
Official Action for U.S. Appl. No. 13/246,133, mailed Aug. 23, 2013 32 pages.
Official Action for U.S. Appl. No. 13/246,675 mailed May 1, 2013, 27 pages.
Official Action for U.S. Appl. No. 13/217,121 mailed Mar. 6, 2013, 11 pages.

(56) References Cited

OTHER PUBLICATIONS

Official Action for U.S. Appl. No. 13/217,121, mailed Aug. 1, 2013 11 pages.
Official Action for U.S. Appl. No. 13/399,936, mailed Sep. 10, 2013 23 pages.
"Apple iPod and iPhone dock Connector Pinout," AllPinouts, Sep. 27, 2010, 3 pages [www.allpinouts.org/index/php/Apple_iPod,_iPad_and_iPhone_dock].
U.S. Appl. No. 14/068,662, filed Oct. 31, 2013, Benedek.
"How to Install Ubuntu on Your Nexus One/Android!" NexusOneHacks.net, Jul. 6, 2010, 9 pages [nexusonehacks.net/nexus-one-hacks/how-to-install-ubuntu-on-your-android].
Kilpatrick et al., "Securing the X Window System with SELinux," NAI Labs Report No. 03-006, 2003, 33 pages.
Stallman "GNU Operating System: Android and Users' Freedom," Sep. 2, 2013, 4 pages [gnu.org/philosophy/android-and-users-freedom.html].
Official Action for U.S. Appl. No. 13/399,929, mailed Dec. 3, 2013 21 pages.
Official Action for U.S. Appl. No. 12/905,920, mailed Sep. 30, 2013 20 pages.
Final Action for U.S. Appl. No. 13/217,099, mailed Oct. 9, 2013 74 pages.
Official Action for U.S. Appl. No. 13/217,108, mailed Oct. 11, 2013 13 pages.
Final Action for U.S. Appl. No. 13/251,427, mailed Oct. 21, 2013 17 pages.
Notice of Allowance for U.S. Appl. No. 13/247,166, mailed Nov. 4, 2013 14 pages.
Official Action for U.S. Appl. No. 13/217,130, mailed Sep. 16, 2013 12 pages.
Official Action for U.S. Appl. No. 13/246,671, mailed Nov. 20, 2013 50 pages.
Official Action for U.S. Appl. No. 13/246,675, mailed Sep. 27, 2013 32 pages.
U.S. Appl. No. 13/187,026, filed Jul. 20, 2011, Chen
U.S. Appl. No. 13/399,901, filed Feb. 17, 2012, Reeves et al.
U.S. Appl. No. 13/484,951, filed May 31, 2012, Sirpal et al.
U.S. Appl. No. 13/485,734, filed May 31, 2012, Reeves et al.
U.S. Appl. No. 13/628,380, filed Sep. 27, 2012, Reeves.
U.S. Appl. No. 13/628,157, filed Sep. 27, 2012, Kretz.
U.S. Appl. No. 13/628,170, filed Sep. 27, 2012, Kretz.
U.S. Appl. No. 13/628,234, filed Sep. 27, 2012, Kretz.
U.S. Appl. No. 13/629,415, filed Sep. 27, 2012, Reeves.
U.S. Appl. No. 13/628,949, filed Sep. 27, 2012, Reeves et al.
Burns, C., "Motorola ATRIX 4G Laptop Dock Review," at www.androidcommunity.com/motorola-atrix-4g-laptop-dock-review-20110220/, Feb. 20, 2011, 5 pages.
Catacchio, Chad, "This smartphone has two huge screens . . . that rotate," The Next Web at www.thenextweb.com/asia/2010/10/07/this-smartphone-has-two-huge-screens-that-rotate/, Jul. 21, 2011, 2 pages.
Google images, accessed Apr. 18, 2011, 6 pages.
Google Transliteration IME website, 2010, available at www.google.com/ime/transliteration/help.html#features, 8 pages.
Harman03, "Kyocera Echo Dual-screen Android Phone," posted 4 weeks from Apr. 18, 2011, 3 pages.
InputKing Online Input System, 2011, available at www.inputking.com, 2 pages.
"Lapdock™ for Motorola ATRIX," at www.motorola.com/Consumers/US-EN/Consumer-Product-and-Services/Mobile . . . , accessed Apr. 18, 2011, 1 page.
"Motorola ATRIX 4G Laptop Dock Review," at www.phonearena.com/reviews/Motorola-ATRIX-4G-Laptop-Dock-Review_id2667, Mar. 2, 2011, 6 pages.
SAKHR Software—Arabic Optical Character Recognition, Jul. 15, 2011, available at www.sakhr.com/ocr.aspx, 1 page.
Stein, S., "How does the Motorola Atrix 4G Lapdock compare with a laptop?" Crave—CNET, at www.news.cnet.com/8301-17938_105-20031251-1.html, Feb. 9, 2011, 7 pages.
Website entitled, "Kyocera Echo," at www.echobykyocera.com/, 2011, 6 pages.
Website entitled, "Sony Tablet," at www.store.sony.com/webapp/wcs/stores/servlet/CategoryDisplay?catalogId=10551&storeId=10151&langId=-1&categoryId=8198552921644795521, 2011, 3 pages.
Wikipedia, "Balloon help," Jul. 18, 2011, available at www.en.wikipedia.org/wiki/Balloon_help, 3 pages.
Wikipedia, "Google Pinyin," Aug. 27, 2011 available at www.en.wikipedia.org/wiki/Google_Pinyin, 3 pages.
Wikipedia, "Mouseover," Sep. 29, 2011, available at www.en.wikipedia.org/wiki/Mouseover, 2 pages.
Wikipedia, "Predictive text," Aug. 7, 2011, available at www.en.wikipedia.org/wiki/Predictive_test, 6 pages.
Wikipedia, "Sogou Pinyin," Jul. 23, 2011 available at www.en.wikipedia.org/wiki/Sogou_Pinyin, 3 pages.
Wikipedia, "Status bar," Sep. 8, 2011, available at www.en.wikipedia.org/wiki/Status_bar, 3 pages.
Wikipedia, "Tooltip," Sep. 17, 2011, available at www.en.wikipedia.org/wiki/Tooltip, 2 pages.
International Search Report for International Patent Application No. PCT/US11/52822, mailed Apr. 27, 2012, 5 pages.
International Search Report for International Patent Application No. PCT/US11/52598, mailed Mar. 27, 2012, 3 pages.
International Search Report for International Patent Application No. PCT/US11/53835, mailed Apr. 30, 2012, 5 pages.
Written Opinion for International Patent Application No. PCT/US11/53835, mailed Apr. 30, 2012, 4 pages.
International Search Report for International Patent Application No. PCT/US11/54105, mailed Apr. 30, 2012, 3 pages.
International Search Report for International Patent Application No. PCT/US11/53585, mailed May 4, 2012, 3 pages.
Official Action for U.S. Appl. No. 13/484,951, mailed Aug. 17, 2012, 13 pages.
Mikeclay, "Launch Multiple Programs at Once Using Simple Batch File," Feb. 5, 2009 available at www.web.archive.org/web/20090205134920/http://www.windowsreference.com/windows-2000/launch-multiple-programs-at-once-using-simple-batch-file/, 5 pages.
Official Action for U.S. Appl. No. 12/948,701, mailed Nov. 16, 2012, 16 pages.
Haselton, "Celio Announces Redfly Smart Phone Dock, Software for Windows PCs," Laptop Magazine, Jan. 8, 2009, [retrieved on Feb. 11, 2014], 4 pages. Retrieved from: blog.laptopmag.com/redfly-launches-smartphone-dock-software-for-windows-pcs.
McDermott "Porting Android to a new device," Embedded Software, Jan. 28, 2010, 12 pages [retrieved from: http://yidonghan.wordpress.com/2010/01/28/porting-android-to-a-new-device/].
Rebecka & Zingo, "Share memory using ashmem and binder in the android framework," Andoid Blog, Mar. 22, 2010, 14 pages [retrived from: http://www.androidenea.com/2010/03/share-memory-using-ashmem-and-binder-in.html].
International Search Report for International (PCT) Patent Application No. PCT/US2012/046798, mailed Feb. 20, 2013 3 pages.
International Preliminary Report on Patentability for International (PCT) Patent Application No. PCT/US2012/046798, mailed Jan. 23, 2014 6 pages.
International Preliminary Report on Patentability for International (PCT) Patent Application No. PCT/US2012/046800, mailed Jan. 23, 2014 6 pages.
International Preliminary Report on Patentability for International Patent Application No. PCT/US2012/046802, mailed Jan. 23, 2014, 6 pages.
Extended Search Report for European Patent Application No. 11829766.2, dated Jan. 8, 2014 11 pages.
Official Action for U.S. Appl. No. 13/484,951, mailed Jan. 30, 2014 12 pages.
Notice of Allowance for U.S. Appl. No. 13/484,951, mailed May 12, 2014 7 pages.
Official Action for U.S. Appl. No. 13/628,380, mailed Jun. 5, 2014 16 pages.
Official Action for U.S. Appl. No. 13/629,415, mailed Apr. 25, 2014 16 pages.

(56) References Cited

OTHER PUBLICATIONS

Final Action for U.S. Appl. No. 13/399,901, mailed Dec. 26, 2013 20 pages.
Official Action for U.S. Appl. No. 13/399,901, mailed May 1, 2014 17 pages.
Official Action for U.S. Appl. No. 13/399,936, mailed Feb. 20, 2014 27 pages.
Notice of Allowance for U.S. Appl. No. 12/905,920, mailed Feb. 27, 2014 13 pages.
Official Action for U.S. Appl. No. 12/948,686, mailed Jan. 29, 2014 13 pages.
Notice of Allowance for U.S. Appl. No. 12/948,686, mailed May 9, 2014 7 pages.
Official Action for U.S. Appl. No. 12/948,701, mailed Jun. 3, 2014 19 pages.
Official Action for U.S. Appl. No. 13/246,665, mailed Feb. 27, 2014 38 pages.
Official Action for U.S. Appl. No. 13/217,099, mailed May 29, 2014 73 pages.
Notice of Allowance for U.S. Appl. No. 13/247,885, mailed Jan. 9, 2014 8 pages.
Official Action for U.S. Appl. No. 13/217,108 mailed Feb. 25, 2014, 22 pages.
Official Action for U.S. Appl. No. 13/251,427, mailed May 23, 2014 15 pages.
Official Action for U.S. Appl. No. 13/250,764, mailed Dec. 11, 2013 23 pages.
Official Action for U.S. Appl. No. 13/217,130, mailed Mar. 20, 2014 18 pages.
Official Action for U.S. Appl. No. 13/247,170, mailed Dec. 11, 2013 47 pages.
Official Action for U.S. Appl. No. 13/247,170, mailed Jun. 5, 2014 58 pages.
Notice of Allowance for U.S. Appl. No. 13/246,669, mailed Apr. 11, 2014 11 pages.
Official Action for U.S. Appl. No. 13/246,671, mailed Jun. 5, 2014 60 pages.
Official Action for U.S. Appl. No. 13/246,128, mailed Dec. 26, 2013 43 pages.
Official Action for U.S. Appl. No. 13/246,133, mailed Jan. 15, 2014 37 pages.
Official Action for U.S. Appl. No. 13/246,675, mailed Mar. 7, 2014 34 pages.
Official Action for U.S. Appl. No. 13/217,121, mailed Feb. 10, 2014 12 pages.
U.S. Appl. No. 14/539,016, filed Nov. 12, 2014, Reeves et al.
Official Action for Mexican Patent Application No. MX/a/2013/003515, mailed Jun. 12, 2014, 3 pages (includes English summary).
Notice of Allowance for Mexican Patent Application No. MX/a/2013/003515, mailed Nov. 5, 2014, 1 page.
Official Action for European Patent Application No. 11829880.1, mailed Aug. 13, 2014, 5 pages.
European Extended Search Report for European Patent Application No. 11829880.1, mailed Dec. 5, 2014, 10 pages.
Notice of Allowance for Mexican Patent Application No. MX/a/2013/003427, mailed Nov. 26, 2014, 1 page.
Official Action for U.S. Appl. No. 13/247,719, mailed Aug. 29, 2014 21 pages.
Notice of Allowance for U.S. Appl. No. 14/498,330, mailed Oct. 27, 2014 8 pages.
Official Action for U.S. Appl. No. 13/628,380, mailed Sep. 12, 2014 16 pages.
Official Action for U.S. Appl. No. 13/628,380, mailed Jan. 2, 2015 18 pages.
Official Action for U.S. Appl. No. 13/628,157, mailed Aug. 14, 2014 7 pages.
Official Action for U.S. Patent Application No. 13,628,170, mailed Nov. 3, 2014 9 pages.
Official Action for U.S. Appl. No. 13/628,234, mailed Sep. 12, 2014 9 pages.
Official Action for U.S. Appl. No. 13/629,415, mailed Dec. 3, 2014 22 pages.
Official Action for U.S. Appl. No. 13/628,949, mailed Oct. 9, 2014 11 pages.
Official Action for U.S. Appl. No. 13/399,901, mailed Oct. 29, 2014 23 pages.
Official Action for U.S. Appl. No. 13/399,929, mailed Jun. 18, 2014 35 pages.
Notice of Allowance for U.S. Appl. No. 13/399,936, mailed Sep. 15, 2014 11 pages.
Official Action for U.S. Appl. No. 12/948,701, mailed Dec. 15, 2014 19 pages.
Official Action for U.S. Appl. No. 13/246,665, mailed Jun. 12, 2014 39 pages.
Notice of Allowance for U.S. Appl. No. 13/246,665, mailed Jan. 13, 2015 9 pages.
Official Action for U.S. Appl. No. 13/217,099, mailed Dec. 1, 2014 82 pages.
Official Action for U.S. Appl. No. 14/068,662, mailed Jul. 28, 2014 26 pages.
Notice of Allowance for U.S. Appl. No. 14/068,662, mailed Jan. 12, 2015 15 pages.
Official Action for U.S. Appl. No. 13/217,108, mailed Jun. 20, 2014 18 pages.
Notice of Allowance for U.S. Appl. No. 13/217,108, mailed Jul. 11, 2014 7 pages.
Official Action for U.S. Appl. No. 13/251,427, mailed Dec. 8, 2014 17 pages.
Official Action for U.S. Appl. No. 13/250,764, mailed Jul. 1, 2014 26 pages.
Notice of Allowance for U.S. Appl. No. 13/250,764, mailed Dec. 4, 2014 8 pages.
Official Action for U.S. Appl. No. 13/217,130, mailed Aug. 5, 2014 19 pages.
Notice of Allowance for U.S. Appl. No. 13/217,130, mailed Dec. 3, 2014 5 pages.
Notice of Allowance for U.S. Appl. No. 13/247,170, mailed Sep. 23, 2014 11 pages.
Notice of Allowance for U.S. Appl. No. 13/246,671, mailed Sep. 25, 2014 9 pages.
Official Action for U.S. Appl. No. 13/246,118, mailed Oct. 8, 2014 10 pages.
Official Action for U.S. Appl. No. 13/246,128, mailed Jun. 13, 2014 50 pages.
Official Action for U.S. Appl. No. 13/246,133, mailed Jun. 13, 2014 44 pages.
Notice of Allowance for U.S. Appl. No. 13/246,133, mailed Jan. 21, 2015 10 pages.
Notice of Allowance for U.S. Appl. No. 13/246,675, mailed Jul. 29, 2014 9 pages.
Official Action for U. S. Appl. No. 13/217,121, mailed Jun. 12, 2014 13 pages.
Official Action for U.S. Appl. No. 13/217,121, mailed Dec. 18, 2014 15 pages.

* cited by examiner

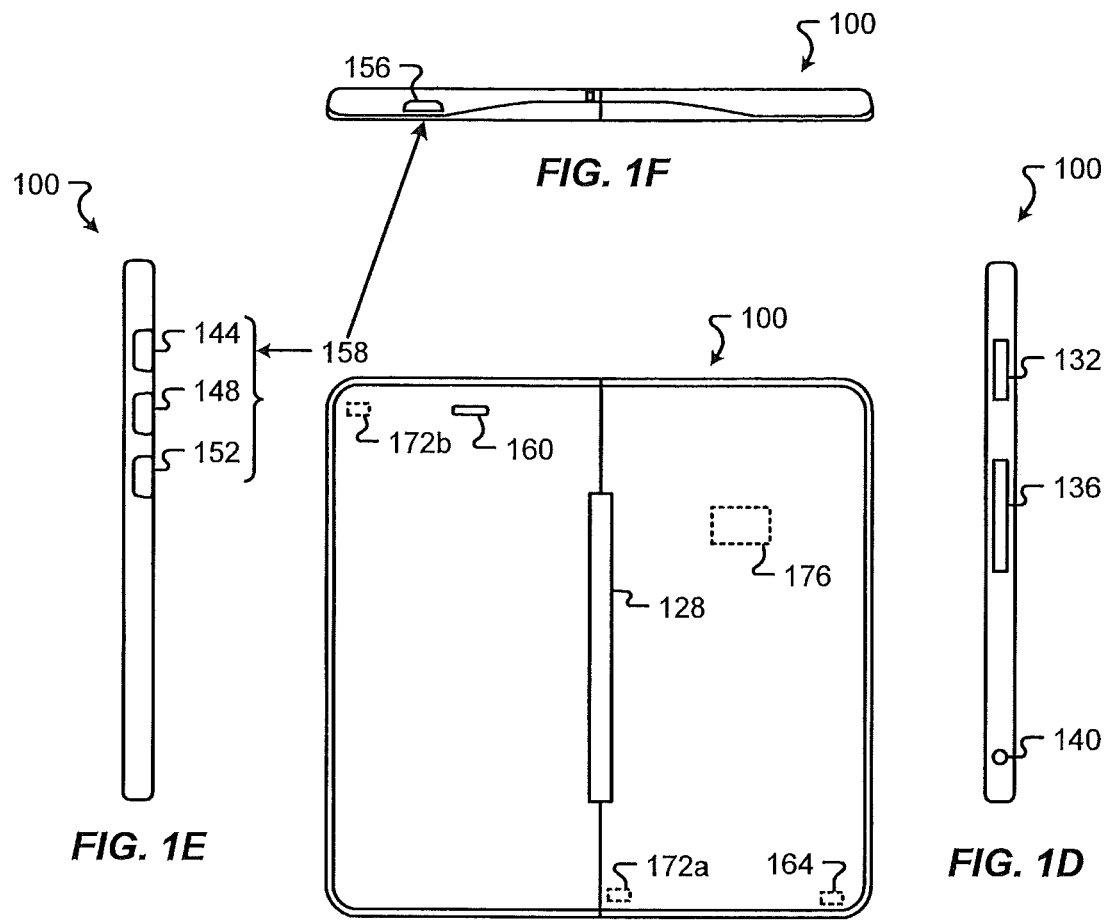
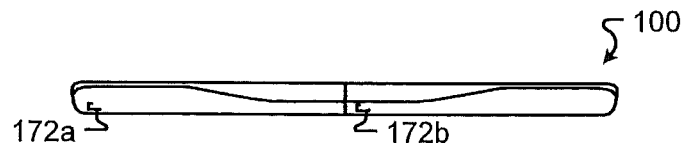

|  | PORTRAIT | | | | | | LANDSCAPE | | | | | |
|---|---|---|---|---|---|---|---|---|---|---|---|---|
|  | OPEN | CLOSED | EASEL | MODIFIED EASEL | PHONE | IMAGE/VIDEO | OPEN | CLOSED | EASEL | MODIFIED EASEL | PHONE | IMAGE/VIDEO |
| P O R T R A I T | OPEN | X | HT | HT | HT | P | I | AT | HAT | HAT | HAT | P | I |
|  | CLOSED | HT | X | HAT | HAT | P | I | HAT | AT | HAT | HAT | P | I |
|  | EASEL | HT | HT | X | X | P | I | HAT | HAT | HAT | HAT | P | I |
|  | PHONE | HT | X | HT | HT | X | I | HAT | HAT | HAT | HAT | X | I |
|  | IMAGE/VIDEO | HT | HT | HT | X | P | X | HAT | HAT | HAT | HAT | X | HAT |
| L A N D S C A P E | OPEN | AT | HAT | HAT | HAT | P | I | X | HT | HAT | HAT | P | I |
|  | CLOSED | HAT | AT | HAT | HAT | P | I | HT | X | HAT | HAT | P | I |
|  | EASEL | HAT | HAT | HAT | HAT | P | I | HT | HT | X | HAT | P | I |
|  | MODIFIED EASEL | HAT | HAT | HAT | HAT | P | I | HT | HT | HAT | X | P | I |
|  | IMAGE/VIDEO | HAT | HAT | HAT | HAT | HAT | AT | HT | HT | HT | HAT | P | X |
|  | DOCKED | | | | | | | | | | | | |
|  | | | | | DOCKING SIGNAL | | | | | | | | |

Key:
H - Hall Effect Sensor(s)
a - accelerometer(s)
T- Timer
P – communications Trigger
I – Image / Video capture Request

FIG. 3B

Tap

Long Press

Drag

Flick

Pinch

Spread

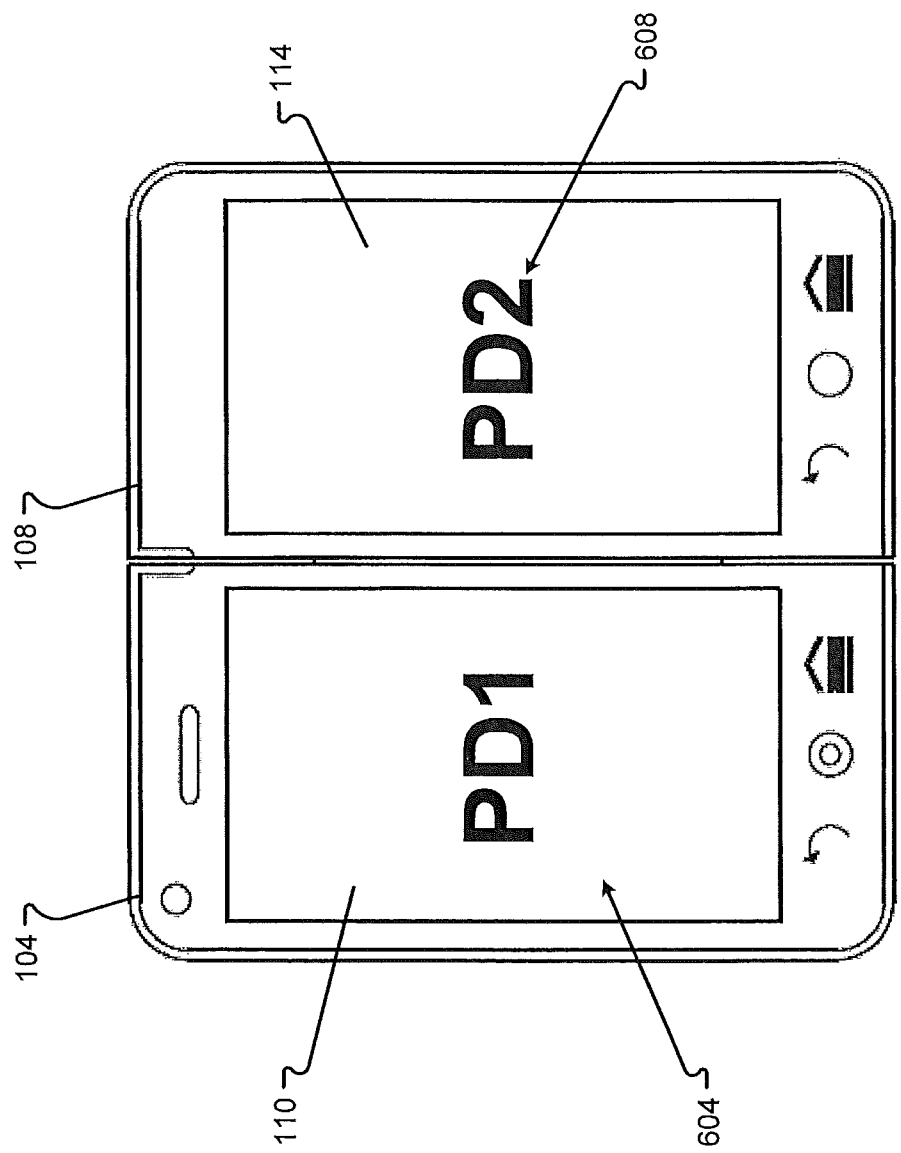

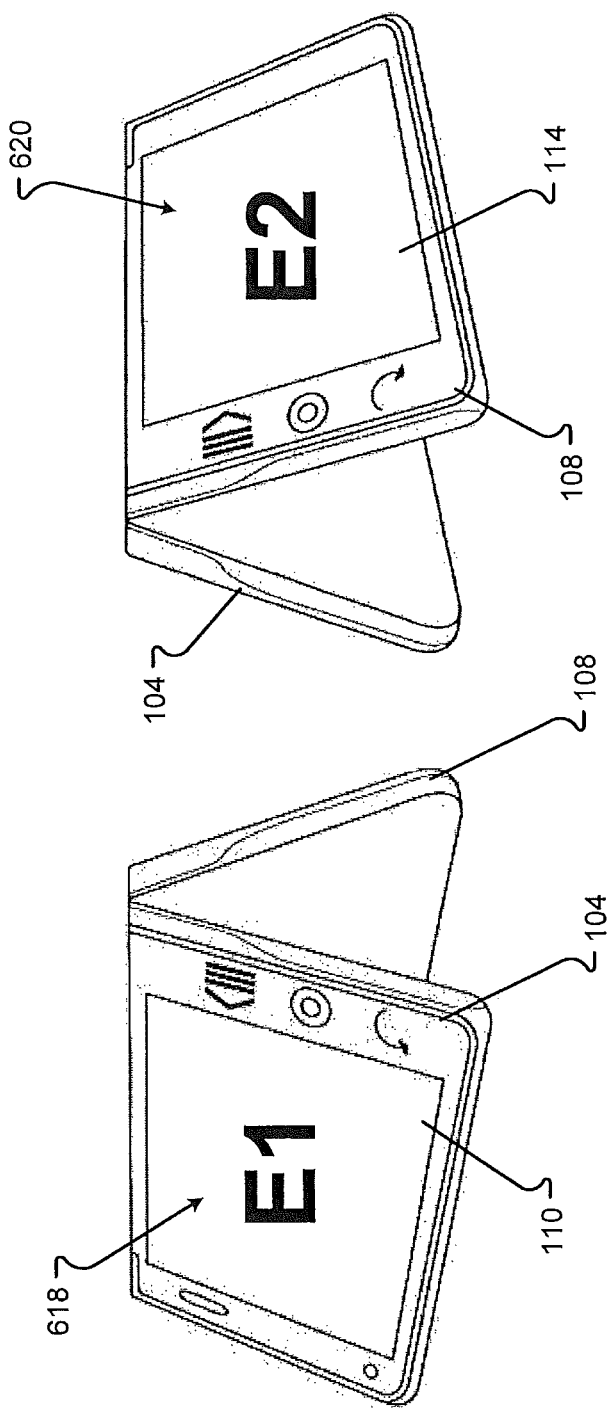

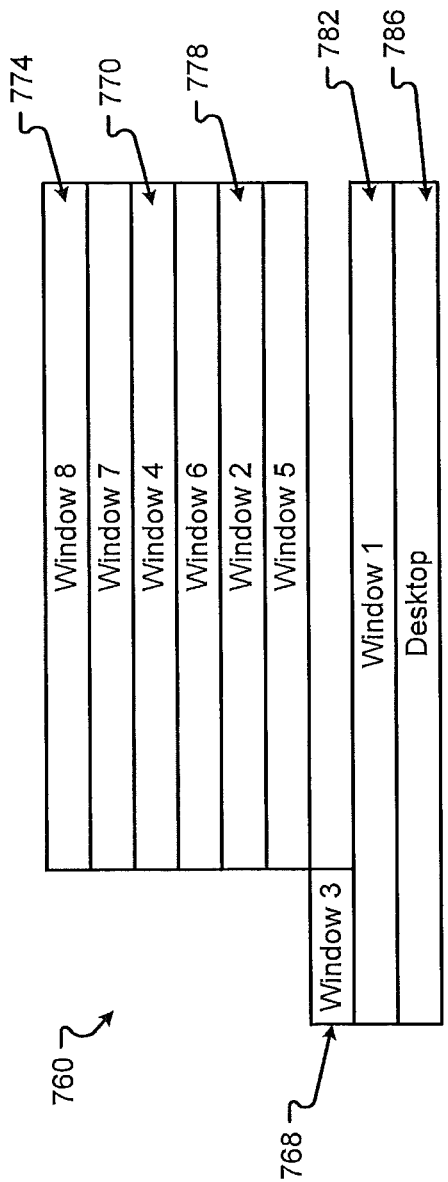
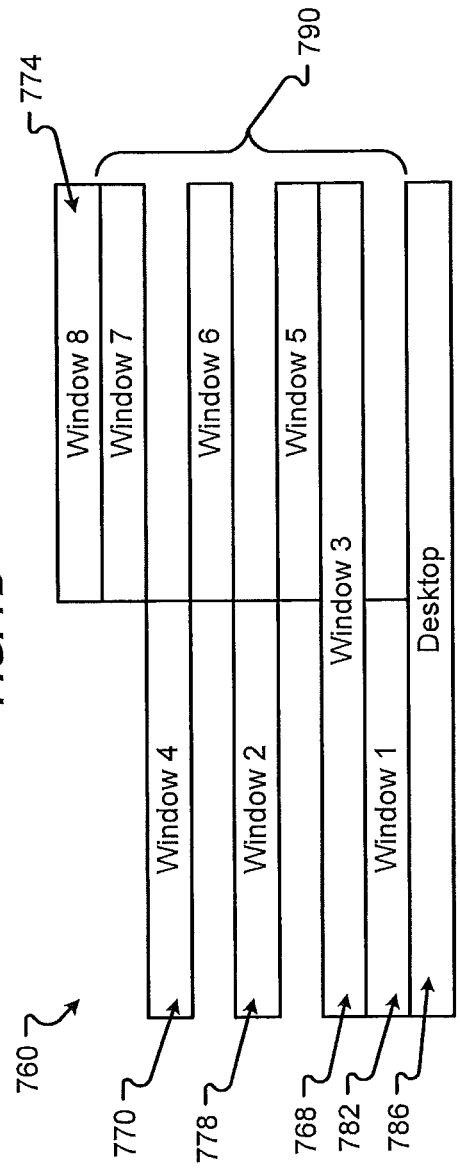

PORTRAIT DUAL DISPLAY AND LANDSCAPE DUAL DISPLAY

CROSS REFERENCE TO RELATED APPLICATION

The present application claims the benefits of and priority, under 35 U.S.C. §119(e), to U.S. Provisional Application Ser. No. 61/539,884, filed Sep. 27, 2011, entitled "MOBILE DEVICE;" which is incorporated herein by reference in its entirety for all that it teaches and for all purposes.

BACKGROUND

A substantial number of handheld computing devices, such as cellular phones, tablets, and E-Readers, make use of a touch screen display not only to deliver display information to the user but also to receive inputs from user interface commands. While touch screen displays may increase the configurability of the handheld device and provide a wide variety of user interface options, this flexibility typically comes at a price. The dual use of the touch screen to provide content and receive user commands, while flexible for the user, may obfuscate the display and cause visual clutter, thereby leading to user frustration and loss of productivity.

The small form factor of handheld computing devices requires a careful balancing between the displayed graphics and the area provided for receiving inputs. On the one hand, the small display constrains the display space, which may increase the difficulty of interpreting actions or results. On the other, a virtual keypad or other user interface scheme is superimposed on or positioned adjacent to an executing application, requiring the application to be squeezed into an even smaller portion of the display.

This balancing act is particularly difficult for single display touch screen devices. Single display touch screen devices are crippled by their limited screen space. When users are entering information into the device, through the single display, the ability to interpret information in the display can be severely hampered, particularly when a complex interaction between display and interface is required.

SUMMARY

There is a need for a dual multi-display handheld computing device that provides for enhanced power and/or versatility compared to conventional single display handheld computing devices. These and other needs are addressed by the various aspects, embodiments, and/or configurations of the present disclosure. Also, while the disclosure is presented in terms of exemplary embodiments, it should be appreciated that individual aspects of the disclosure can be separately claimed.

Additionally, it is desirable to have a multi-display device that can selectively display pages of information in various orientations. More particularly, an application operated in connection with a multi-display device can present information on multiple pages. For instance, where the multi-display device has at least two screens, a page or view of the application can be presented on both the first screen of the device and the second screen of the device. In this maximized configuration, the first and second screens can operate as an integrated single screen, or as separately operable screens. For example, where the first and second screens are in a landscape orientation and the device is in a dual landscape mode, both screens can operate as an integrated single screen. As a further example, where the first and second screens are in a portrait orientation and the device is in a dual portrait mode, one screen can operate to display content information, and the other screen can operate to display control information. Accordingly, the display of output by the multiple screens of a single device can be adapted according to the operational configuration of the multiple screen device.

In some embodiments, a method for controlling a display of a device is provided, the method comprising:
placing the device in a first orientation, wherein the first orientation is a portrait dual orientation;
while the device is in the first orientation, presenting a view of a first application across first and second screens of the device, wherein the first screen presents control information associated with the first application, and wherein the second screen presents content information associated with the first application;
placing the device in a second orientation, wherein the second orientation is a landscape dual orientation;
while the device is in the second orientation, presenting a view of the first application across the first and second screens of the device, wherein the first screen presents a first portion of content information associated with the first application, and wherein the second screen presents a second portion of content information associated with the first application.

In some embodiments, a device is provided, the device comprising:
a first screen, including:
a first touch screen display, wherein the first touch screen display is located within a first area of the first screen;
a first gesture capture region, wherein the first gesture capture region is located within a second area of the screen;
a second screen, including:
a second touch screen display, wherein the second touch screen display is located within a first area of the second screen;
a second gesture capture region, wherein the second gesture capture region is located within a second area of the second screen;
memory;
a processor;
application programming stored in the memory and executed by the processor, wherein the application programming is operable to:
determine an orientation of the device;
while the device is in a dual portrait orientation and in association with the execution of a first application:
present a first portion of a view of the first application within the first touch screen display, wherein the first portion includes control information associated with the first application;
present a second portion of a view of the first application within the second touch screen display, wherein the second portion includes content information associated with the first application;
while the device is in a dual landscape orientation:
present a third portion of a view of the first application within the first touch screen display, wherein the third portion includes content information associated with the first application;
present a fourth portion of a view of the first application within the second touch screen display, wherein the fourth portion includes content information associated with the first application.

In some embodiments, a computer readable medium having stored thereon computer executable instructions is provided, the computer-executable instructions causing a processor to execute a method for selectively presenting an application across a display of a device, the computer-executable instructions comprising:

instructions to determine an orientation of the device;

while the device is in a portrait dual orientation, instructions to present control information associated with a first application in a first screen of the device, and to present content information in a second screen of the device;

while the device is in a landscape dual orientation, instructions to present content information associated with the first application in the first and second screens of the device.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

The term "desktop" refers to a metaphor used to portray systems. A desktop is generally considered a "surface" that typically includes pictures, called icons, widgets, folders, etc. that can activate show applications, windows, cabinets, files, folders, documents, and other graphical items. The icons are generally selectable to initiate a task through user interface interaction to allow a user to execute applications or conduct other operations.

The term "screen," "touch screen," or "touchscreen" refers to a physical structure that includes one or more hardware components that provide the device with the ability to render a user interface and/or receive user input. A screen can encompass any combination of gesture capture region, a touch sensitive display, and/or a configurable area. The device can have one or more physical screens embedded in the hardware. However a screen may also include an external peripheral device that may be attached and detached from the device. In embodiments, multiple external devices may be attached to the device. Thus, in embodiments, the screen can enable the user to interact with the device by touching areas on the screen and provides information to a user through a display. The touch screen may sense user contact in a number of different ways, such as by a change in an electrical parameter (e.g., resistance or capacitance), acoustic wave variations, infrared radiation proximity detection, light variation detection, and the like. In a resistive touch screen, for example, normally separated conductive and resistive metallic layers in the screen pass an electrical current. When a user touches the screen, the two layers make contact in the contacted location, whereby a change in electrical field is noted and the coordinates of the contacted location calculated. In a capacitive touch screen, a capacitive layer stores electrical charge, which is discharged to the user upon contact with the touch screen, causing a decrease in the charge of the capacitive layer. The decrease is measured, and the contacted location coordinates determined. In a surface acoustic wave touch screen, an acoustic wave is transmitted through the screen, and the acoustic wave is disturbed by user contact. A receiving transducer detects the user contact instance and determines the contacted location coordinates.

The term "display" refers to a portion of one or more screens used to display the output of a computer to a user. A display may be a single-screen display or a multi-screen display, referred to as a composite display. A composite display can encompass the touch sensitive display of one or more screens. A single physical screen can include multiple displays that are managed as separate logical displays. Thus, different content can be displayed on the separate displays although part of the same physical screen.

The term "displayed image" refers to an image produced on the display. A typical displayed image is a window or desktop. The displayed image may occupy all or a portion of the display.

The term "display orientation" refers to the way in which a rectangular display is oriented by a user for viewing. The two most common types of display orientation are portrait and landscape. In landscape mode, the display is oriented such that the width of the display is greater than the height of the display (such as a 4:3 ratio, which is 4 units wide and 3 units tall, or a 16:9 ratio, which is 16 units wide and 9 units tall). Stated differently, the longer dimension of the display is oriented substantially horizontal in landscape mode while the shorter dimension of the display is oriented substantially vertical. In the portrait mode, by contrast, the display is oriented such that the width of the display is less than the height of the display. Stated differently, the shorter dimension of the display is oriented substantially horizontal in the portrait mode while the longer dimension of the display is oriented substantially vertical.

The term "composite display" refers to a logical structure that defines a display that can encompass one or more screens. A multi-screen display can be associated with a composite display that encompasses all the screens. The composite display can have different display characteristics based on the various orientations of the device.

The term "gesture" refers to a user action that expresses an intended idea, action, meaning, result, and/or outcome. The user action can include manipulating a device (e.g., opening or closing a device, changing a device orientation, moving a trackball or wheel, etc.), movement of a body part in relation to the device, movement of an implement or tool in relation to the device, audio inputs, etc. A gesture may be made on a device (such as on the screen) or with the device to interact with the device.

The term "module" as used herein refers to any known or later developed hardware, software, firmware, artificial intelligence, fuzzy logic, or combination of hardware and software that is capable of performing the functionality associated with that element.

The term "gesture capture" refers to a sense or otherwise a detection of an instance and/or type of user gesture. The gesture capture can occur in one or more areas of the screen, A gesture region can be on the display, where it may be referred to as a touch sensitive display or off the display where it may be referred to as a gesture capture area.

A "multi-screen application" or "multiple-display application" refers to an application that is capable of multiple modes. The multi-screen application mode can include, but is not limited to, a single screen mode (where the application is displayed on a single screen) or a composite display mode (where the application is displayed on two or more screens). A multi-screen application can have different layouts optimized for the mode. Thus, the multi-screen application can have different layouts for a single screen or for a composite display that can encompass two or more screens. The different layouts may have different screen/display dimensions and/or configurations on which the user interfaces of the multi-screen applications can be rendered. The different layouts allow the application to optimize the application's user interface for the type of display, e.g., single screen or multiple screens. In single screen mode, the multi-screen application may present one window pane of information. In a composite display mode, the multi-screen application may present multiple window panes of information or may provide a larger and a richer presentation because there is more space for the display contents. The multi-screen applications may be designed to adapt dynamically to changes in the device and the mode depending on which display (single or composite) the system assigns to the multi-screen application. In alternative embodiments, the user can use a gesture to request the application transition to a different mode, and, if a display is available for the requested mode, the device can allow the application to move to that display and transition modes.

A "single-screen application" refers to an application that is capable of single screen mode. Thus, the single-screen application can produce only one window and may not be capable of different modes or different display dimensions. A single-screen application may not be capable of the several modes discussed with the multi-screen application.

The term "window" refers to a, typically rectangular, displayed image on at least part of a display that contains or provides content different from the rest of the screen. The window may obscure the desktop.

The terms "determine", "calculate" and "compute," and variations thereof, as used herein, are used interchangeably and include any type of methodology, process, mathematical operation or technique.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the invention, brief description of the drawings, detailed description, abstract, and claims themselves.

The preceding is a simplified summary of the disclosure to provide an understanding of some aspects of the disclosure. This summary is neither an extensive nor exhaustive overview of the disclosure and its various aspects, embodiments, and/or configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and/or configurations of the disclosure are possible utilizing, alone or in combination, one or more of the features set forth above or described in detail below.

BRIEF DESCRIPTION OF THE DRAWINGS

FIG. 1C includes a third view of an embodiment of a multi-screen user device;

FIG. 1D includes a fourth view of an embodiment of a multi-screen user device;

FIG. 1E includes a fifth view of an embodiment of a multi-screen user device;

FIG. 1F includes a sixth view of an embodiment of a multi-screen user device;

FIG. 1G includes a seventh view of an embodiment of a multi-screen user device;

FIG. 3B is a table of an embodiment of the state model for the device based on the device's orientation and/or configuration;

FIG. 6C is a third representation of an embodiment of a device configuration generated in response to the device state;

FIG. 6G is a seventh representation of an embodiment of a device configuration generated in response to the device state;

FIG. 6H is a eighth representation of an embodiment of a device configuration generated in response to the device state;

FIG. 7D is another representation of an embodiment of a logical window stack;

FIG. 7E is another representation of an embodiment of a logical window stack;

Figure 1A:
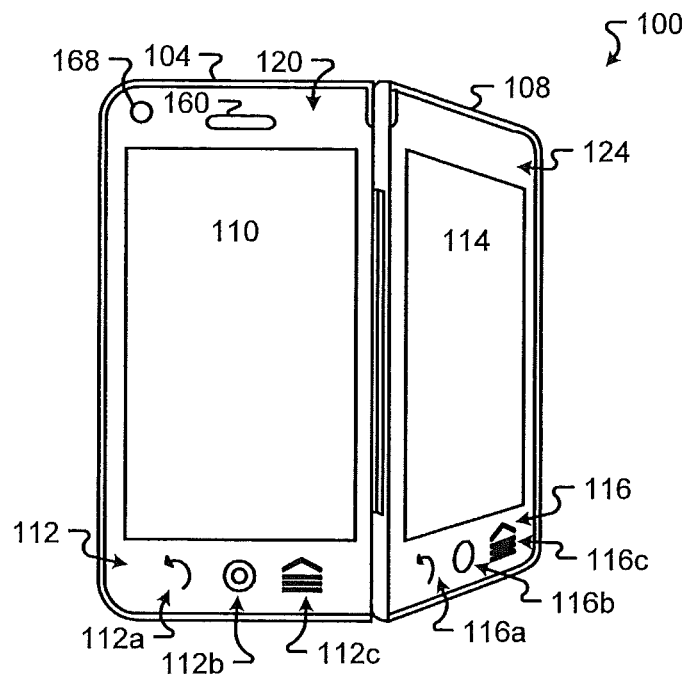
FIG. 1A includes a first view of an embodiment of a multi-screen user device.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

Presented herein are embodiments of a device. The device can be a communications device, such as a cellular telephone, or other smart device. The device can include two screens that are oriented to provide several unique display configurations. Further, the device can receive user input in unique ways. The overall design and functionality of the device provides for an enhanced user experience making the device more useful and more efficient.

Mechanical Features:

FIGS. 1A-1J illustrate a device 100 in accordance with embodiments of the present disclosure. As described in greater detail below, device 100 can be positioned in a number of different ways each of which provides different functionality to a user. The device 100 is a multi-screen device that includes a primary screen 104 and a secondary screen 108, both of which are touch sensitive. In embodiments, the entire front surface of screens 104 and 108 may be touch sensitive and capable of receiving input by a user touching the front surface of the screens 104 and 108. Primary screen 104 includes touch sensitive display 110, which, in addition to being touch sensitive, also displays information to a user. Secondary screen 108 includes touch sensitive display 114, which also displays information to a user. In other embodiments, screens 104 and 108 may include more than one display area.

Primary screen 104 also includes a configurable area 112 that has been configured for specific inputs when the user touches portions of the configurable area 112. Secondary screen 108 also includes a configurable area 116 that has been configured for specific inputs. Areas 112a and 116a have been configured to receive a "back" input indicating that a user would like to view information previously displayed. Areas 112b and 116b have been configured to receive a "menu" input indicating that the user would like to view options from a menu. Areas 112c and 116c have been configured to receive a "home" input indicating that the user would like to view information associated with a "home" view. In other embodiments, areas 112a-c and 116a-c may be configured, in addition to the configurations described above, for other types of specific inputs including controlling features of device 100, some non-limiting examples including adjusting overall system power, adjusting the volume, adjusting the brightness, adjusting the vibration, selecting of displayed items (on either of screen 104 or 108), operating a camera, operating a microphone, and initiating/terminating of telephone calls. Also, in some embodiments, areas 112a-C and 116a-C may be configured for specific inputs depending upon the application running on device 100 and/or information displayed on touch sensitive displays 110 and/or 114.

In addition to touch sensing, primary screen 104 and secondary screen 108 may also include areas that receive input from a user without requiring the user to touch the display area of the screen. For example, primary screen 104 includes gesture capture area 120, and secondary screen 108 includes gesture capture area 124. These areas are able to receive input by recognizing gestures made by a user without the need for the user to actually touch the surface of the display area. In comparison to touch sensitive displays 110 and 114, the gesture capture areas 120 and 124 are commonly not capable of rendering a displayed image.

Figure 1B:
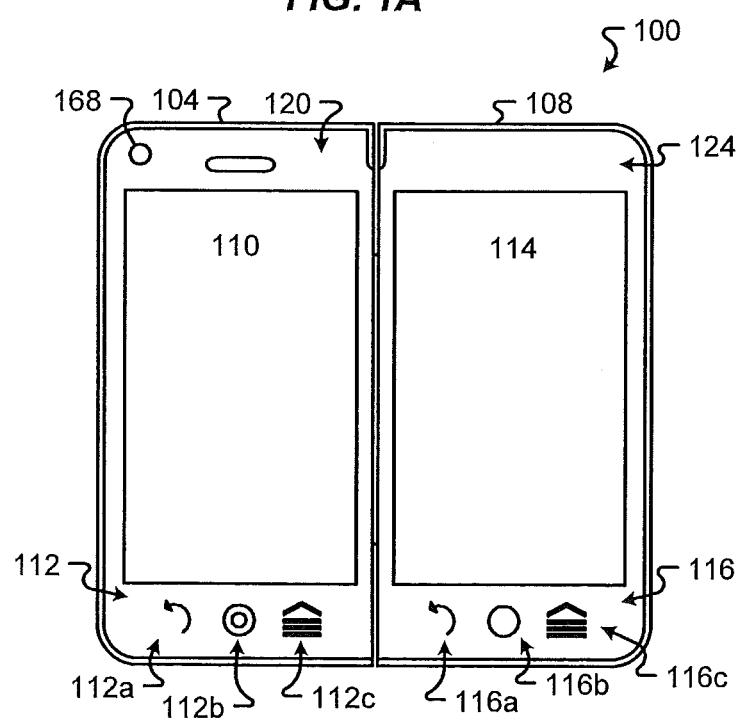
FIG. 1B includes a second view of an embodiment of a multi-screen user device.

The two screens 104 and 108 are connected together with a hinge 128, shown clearly in FIG. 1C (illustrating a back view of device 100). Hinge 128, in the embodiment shown in FIGS. 1A-1J, is a center hinge that connects screens 104 and 108 so that when the hinge is closed, screens 104 and 108 are juxtaposed (i.e., side-by-side) as shown in FIG. 1B (illustrating a front view of device 100). Hinge 128 can be opened to position the two screens 104 and 108 in different relative positions to each other. As described in greater detail below, the device 100 may have different functionalities depending on the relative positions of screens 104 and 108.

FIG. 1D illustrates the right side of device 100. As shown in FIG. 1D, secondary screen 108 also includes a card slot 132 and a port 136 on its side. Card slot 132 in embodiments, accommodates different types of cards including a subscriber identity module (SIM). Port 136 in embodiments is an input/output port (I/O port) that allows device 100 to be connected to other peripheral devices, such as a display, keyboard, or printing device. As can be appreciated, these are merely some examples and in other embodiments device 100 may include other slots and ports such as slots and ports for accommodating additional memory devices and/or for connecting other peripheral devices. Also shown in FIG. 1D is an audio jack 140 that accommodates a tip, ring, sleeve (TRS) connector for example to allow a user to utilize headphones or a headset.

Device 100 also includes a number of buttons 158. For example, FIG. 1E illustrates the left side of device 100. As shown in FIG. 1E, the side of primary screen 104 includes three buttons 144, 148, and 152, which can be configured for specific inputs. For example, buttons 144, 148, and 152 may be configured to, in combination or alone, control a number of aspects of device 100. Some non-limiting examples include overall system power, volume, brightness, vibration, selection of displayed items (on either of screen 104 or 108), a camera, a microphone, and initiation/termination of telephone calls. In some embodiments, instead of separate buttons two buttons may be combined into a rocker button. This arrangement is useful in situations where the buttons are configured to control features such as volume or brightness. In addition to buttons 144, 148, and 152, device 100 also includes a button 156, shown in FIG. 1F, which illustrates the top of device 100. In one embodiment, button 156 is configured as an on/off button used to control overall system power to device 100. In other embodiments, button 156 is configured to, in addition to or in lieu of controlling system power, control other aspects of device 100. In some embodiments, one or more of the buttons 144, 148, 152, and 156 are capable of supporting different user commands. By way of example, a normal press has a duration commonly of less than about 1 second and resembles a quick tap. A medium press has a duration commonly of 1 second or more but less than about 12 seconds. A long press has a duration commonly of about 12 seconds or more. The function of the buttons is normally specific to the application that is currently in focus on the respective display 110 and 114. In a telephone application for instance and depending on the particular button, a normal, medium, or long press can mean end call, increase in call volume, decrease in call volume, and toggle microphone mute. In a camera or video application for instance and depending on the particular button, a normal, medium, or long press can mean increase zoom, decrease zoom, and take photograph or record video.

There are also a number of hardware components within device 100. As illustrated in FIG. 1C, device 100 includes a speaker 160 and a microphone 164. Device 100 also includes a camera 168 (FIG. 1B). Additionally, device 100 includes two position sensors 172A and 172B, which are used to determine the relative positions of screens 104 and 108. In one embodiment, position sensors 172A and 172B are Hall effect sensors. However, in other embodiments other sensors can be used in addition to or in lieu of the Hall effect sensors. An accelerometer 176 may also be included as part of device 100 to determine the orientation of the device 100 and/or the orientation of screens 104 and 108. Additional internal hardware components that may be included in device 100 are described below with respect to FIG. 2.

The overall design of device 100 allows it to provide additional functionality not available in other communication devices. Some of the functionality is based on the various positions and orientations that device 100 can have. As shown in FIGS. 1B-1G, device 100 can be operated in an "open" position where screens 104 and 108 are juxtaposed. This position allows a large display area for displaying information to a user. When position sensors 172A and 172B determine that device 100 is in the open position, they can generate a signal that can be used to trigger different events such as displaying information on both screens 104 and 108. Additional events may be triggered if accelerometer 176 determines that device 100 is in a portrait position (FIG. 1B) as opposed to a landscape position (not shown).

Figure 1H:
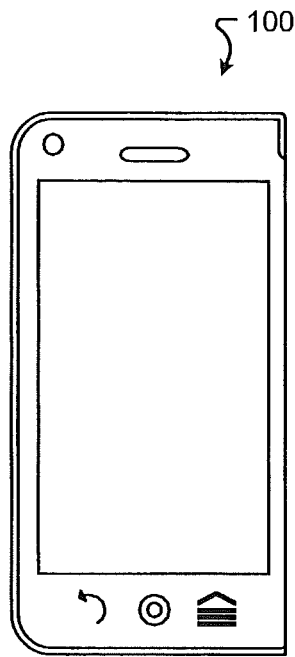
FIG. 1H includes a eighth view of an embodiment of a multi-screen user device.

In addition to the open position, device 100 may also have a "closed" position illustrated in FIG. 1H. Again, position sensors 172A and 172B can generate a signal indicating that device 100 is in the "closed" position. This can trigger an event that results in a change of displayed information on screen 104 and/or 108. For example, device 100 may be programmed to stop displaying information on one of the screens, e.g., screen 108, since a user can only view one screen at a time when device 100 is in the "closed" position. In other embodiments, the signal generated by position sensors 172A and 172B, indicating that the device 100 is in the "closed" position, can trigger device 100 to answer an incoming telephone call. The "closed" position can also be a preferred position for utilizing the device 100 as a mobile phone.

Figure 1I:
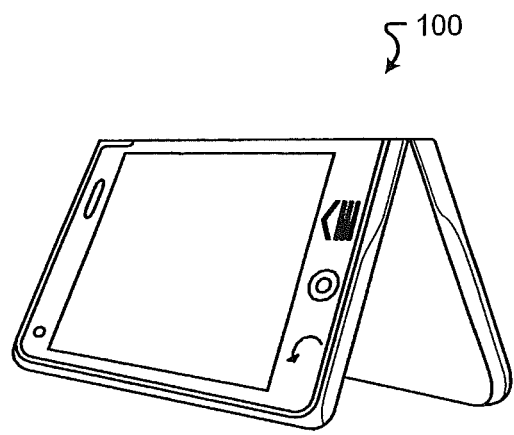
FIG. 1I includes a ninth view of an embodiment of a multi-screen user device.

Device 100 can also be used in an "easel" position which is illustrated in FIG. 1I. In the "easel" position, screens 104 and 108 are angled with respect to each other and facing outward with the edges of screens 104 and 108 substantially horizontal. In this position, device 100 can be configured to display information on both screens 104 and 108 to allow two users to simultaneously interact with device 100. When device 100 is in the "easel" position, sensors 172A and 172B generate a signal indicating that the screens 104 and 108 are positioned at an angle to each other, and the accelerometer 176 can generate a signal indicating that device 100 has been placed so that the edge of screens 104 and 108 are substantially horizontal. The signals can then be used in combination to generate events that trigger changes in the display of information on screens 104 and 108.

Figure 1J:
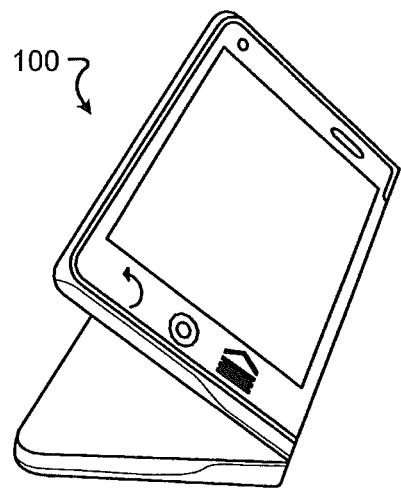
FIG. 1J includes a tenth view of an embodiment of a multi-screen user device.

FIG. 1J illustrates device 100 in a "modified easel" position. In the "modified easel" position, one of screens 104 or 108 is used as a stand and is faced down on the surface of an object such as a table. This position provides a convenient way for information to be displayed to a user in landscape orientation. Similar to the easel position, when device 100 is in the "modified easel" position, position sensors 172A and 172B generate a signal indicating that the screens 104 and 108 are positioned at an angle to each other. The accelerometer 176 would generate a signal indicating that device 100 has been positioned so that one of screens 104 and 108 is faced downwardly and is substantially horizontal. The signals can then be used to generate events that trigger changes in the display of information of screens 104 and 108. For example, information may not be displayed on the screen that is face down since a user cannot see the screen.

Transitional states are also possible. When the position sensors 172A and B and/or accelerometer indicate that the screens are being closed or folded (from open), a closing transitional state is recognized. Conversely when the position sensors 172A and B indicate that the screens are being opened or folded (from closed), an opening transitional state is recognized. The closing and opening transitional states are typically time-based, or have a maximum time duration from a sensed starting point. Normally, no user input is possible when one of the closing and opening states is in effect. In this manner, incidental user contact with a screen during the closing or opening function is not misinterpreted as user input. In embodiments, another transitional state is possible when the device 100 is closed. This additional transitional state allows the display to switch from one screen 104 to the second screen 108 when the device 100 is closed based on some user input, e.g., a double tap on the screen 110,114.

As can be appreciated, the description of device 100 is made for illustrative purposes only, and the embodiments are not limited to the specific mechanical features shown in FIGS. 1A-1J and described above. In other embodiments, device 100 may include additional features, including one or more additional buttons, slots, display areas, hinges, and/or locking mechanisms. Additionally, in embodiments, the features described above may be located in different parts of device 100 and still provide similar functionality. Therefore, FIGS. 1A-1J and the description provided above are nonlimiting.

Figure 2:
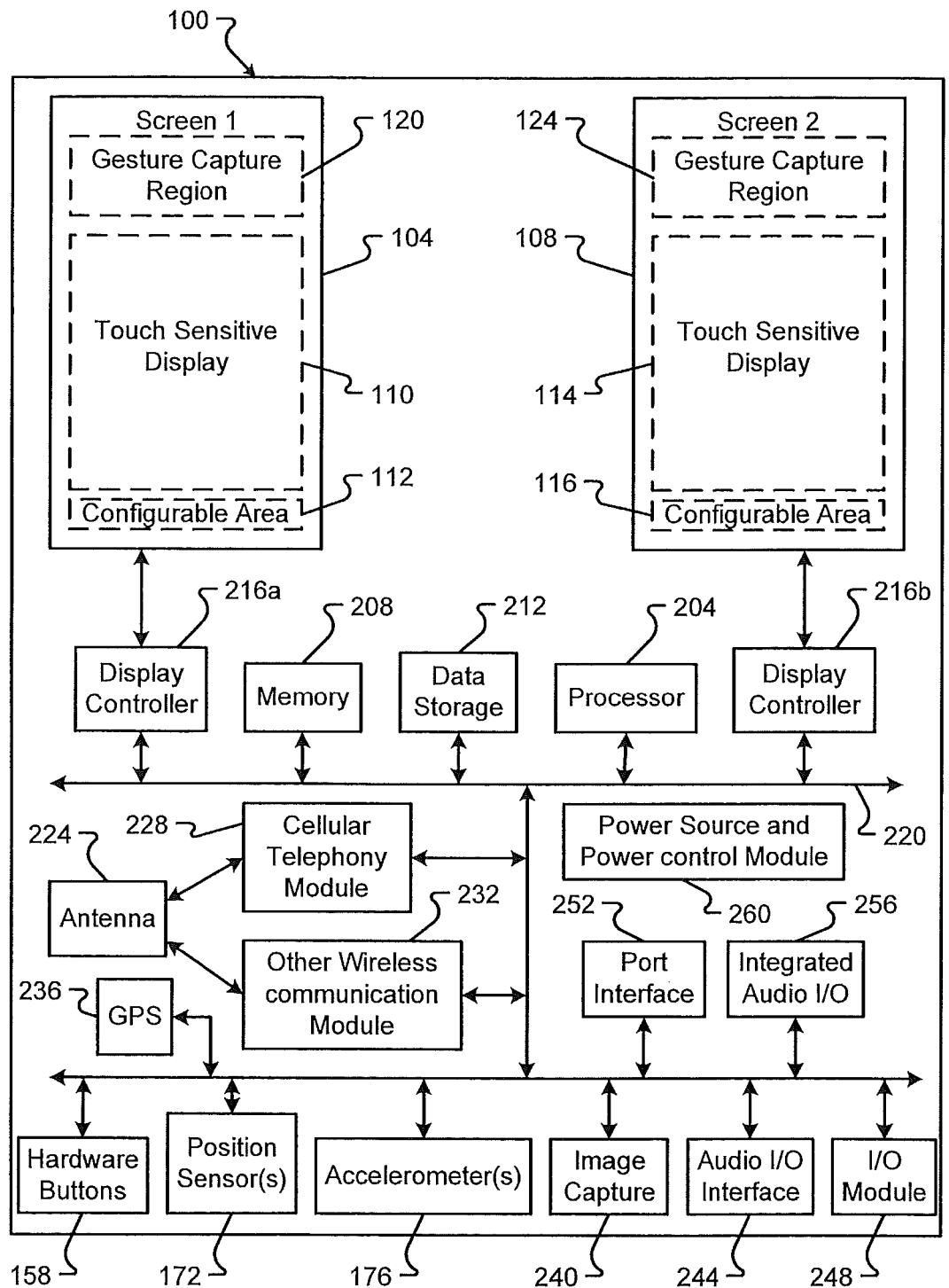
FIG. 2 is a block diagram of an embodiment of the hardware of the device.

Hardware Features:

FIG. 2 illustrates components of a device 100 in accordance with embodiments of the present disclosure. In general, the device 100 includes a primary screen 104 and a secondary screen 108. While the primary screen 104 and its components are normally enabled in both the opened and closed positions or states, the secondary screen 108 and its components are normally enabled in the opened state but disabled in the closed state. However, even when in the closed state a user or application triggered interrupt (such as in response to a phone application or camera application operation) can flip the active screen, or disable the primary screen 104 and enable the secondary screen 108, by a suitable command. Each screen 104, 108 can be touch sensitive and can include different operative areas. For example, a first operative area, within each touch sensitive screen 104 and 108, may comprise a touch sensitive display 110, 114. In general, the touch sensitive display 110, 114 may comprise a full color, touch sensitive display. A second area within each touch sensitive screen 104 and 108 may comprise a gesture capture region 120, 124. The gesture capture region 120, 124 may comprise an area or region that is outside of the touch sensitive display 110, 114 area, and that is capable of receiving input, for example in the form of gestures provided by a user. However, the gesture capture region 120, 124 does not include pixels that can perform a display function or capability.

A third region of the touch sensitive screens 104 and 108 may comprise a configurable area 112, 116. The configurable area 112, 116 is capable of receiving input and has display or limited display capabilities. In embodiments, the configurable area 112, 116 may present different input options to the user. For example, the configurable area 112, 116 may display buttons or other relatable items. Moreover, the identity of displayed buttons, or whether any buttons are displayed at all within the configurable area 112, 116 of a touch sensitive screen 104 or 108, may be determined from the context in which the device 100 is used and/or operated. In an exemplary embodiment, the touch sensitive screens 104 and 108 comprise liquid crystal display devices extending across at least those regions of the touch sensitive screens 104 and 108 that are capable of providing visual output to a user, and a capacitive input matrix over those regions of the touch sensitive screens 104 and 108 that are capable of receiving input from the user.

One or more display controllers 216a, 216b may be provided for controlling the operation of the touch sensitive screens 104 and 108, including input (touch sensing) and output (display) functions. In the exemplary embodiment illustrated in FIG. 2, a separate touch screen controller 216a or 216b is provided for each touch screen 104 and 108. In accordance with alternate embodiments, a common or shared touch screen controller 216 may be used to control each of the included touch sensitive screens 104 and 108. In accordance with still other embodiments, the functions of a touch screen controller 216 may be incorporated into other components, such as a processor 204.

The processor 204 may comprise a general purpose programmable processor or controller for executing application programming or instructions. In accordance with at least some embodiments, the processor 204 may include multiple processor cores, and/or implement multiple virtual processors. In accordance with still other embodiments, the processor 204 may include multiple physical processors. As a particular example, the processor 204 may comprise a specially configured application specific integrated circuit (ASIC) or other integrated circuit, a digital signal processor, a controller, a hardwired electronic or logic circuit, a programmable logic device or gate array, a special purpose computer, or the like. The processor 204 generally functions to run programming code or instructions implementing various functions of the device 100.

A communication device 100 may also include memory 208 for use in connection with the execution of application programming or instructions by the processor 204, and for the temporary or long term storage of program instructions and/or data. As examples, the memory 208 may comprise RAM, DRAM, SDRAM, or other solid state memory. Alternatively or in addition, data storage 212 may be provided. Like the memory 208, the data storage 212 may comprise a solid state memory device or devices. Alternatively or in addition, the data storage 212 may comprise a hard disk drive or other random access memory.

In support of communications functions or capabilities, the device 100 can include a cellular telephony module 228. As examples, the cellular telephony module 228 can comprise a GSM, CDMA, FDMA and/or analog cellular telephony transceiver capable of supporting voice, multimedia and/or data transfers over a cellular network. Alternatively or in addition, the device 100 can include an additional or other wireless communications module 232. As examples, the other wireless communications module 232 can comprise a Wi-Fi, BLUETOOTH™, WiMax, infrared, or other wireless communications link. The cellular telephony module 228 and the other wireless communications module 232 can each be associated with a shared or a dedicated antenna 224.

A port interface 252 may be included. The port interface 252 may include proprietary or universal ports to support the interconnection of the device 100 to other devices or components, such as a dock, which may or may not include additional or different capabilities from those integral to the device 100. In addition to supporting an exchange of communication signals between the device 100 and another device or component, the docking port 136 and/or port interface 252 can support the supply of power to or from the device 100. The port interface 252 also comprises an intelligent element that comprises a docking module for controlling communications or other interactions between the device 100 and a connected device or component.

An input/output module 248 and associated ports may be included to support communications over wired networks or links, for example with other communication devices, server devices, and/or peripheral devices. Examples of an input/output module 248 include an Ethernet port, a Universal Serial Bus (USB) port, Institute of Electrical and Electronics Engineers (IEEE) 1394, or other interface.

An audio input/output interface/device(s) 244 can be included to provide analog audio to an interconnected speaker or other device, and to receive analog audio input from a connected microphone or other device. As an example, the audio input/output interface/device(s) 244 may comprise an associated amplifier and analog to digital converter. Alternatively or in addition, the device 100 can include an integrated audio input/output device 256 and/or an audio jack for interconnecting an external speaker or microphone. For example, an integrated speaker and an integrated microphone can be provided, to support near talk or speaker phone operations.

Hardware buttons 158 can be included for example for use in connection with certain control operations. Examples include a master power switch, volume control, etc., as described in conjunction with FIGS. 1A through 1J. One or more image capture interfaces/devices 240, such as a camera, can be included for capturing still and/or video images. Alternatively or in addition, an image capture interface/device 240 can include a scanner or code reader. An image capture interface/device 240 can include or be associated with additional elements, such as a flash or other light source.

The device 100 can also include a global positioning system (GPS) receiver 236. In accordance with embodiments of the present invention, the GPS receiver 236 may further comprise a GPS module that is capable of providing absolute location information to other components of the device 100. An accelerometer(s) 176 may also be included. For example, in connection with the display of information to a user and/or other functions, a signal from the accelerometer 176 can be used to determine an orientation and/or format in which to display that information to the user.

Embodiments of the present invention can also include one or more position sensor(s) 172. The position sensor 172 can provide a signal indicating the position of the touch sensitive screens 104 and 108 relative to one another. This information can be provided as an input, for example to a user interface application, to determine an operating mode, characteristics of the touch sensitive displays 110, 114, and/or other device 100 operations. As examples, a screen position sensor 172 can comprise a series of Hall effect sensors, a multiple position switch, an optical switch, a Wheatstone bridge, a potentiometer, or other arrangement capable of providing a signal indicating of multiple relative positions the touch screens are in.

Communications between various components of the device 100 can be carried by one or more buses 222. In addition, power can be supplied to the components of the device 100 from a power source and/or power control module 260. The power control module 260 can, for example, include a battery, an AC to DC converter, power control logic, and/or ports for interconnecting the device 100 to an external source of power.

Figure 3A:
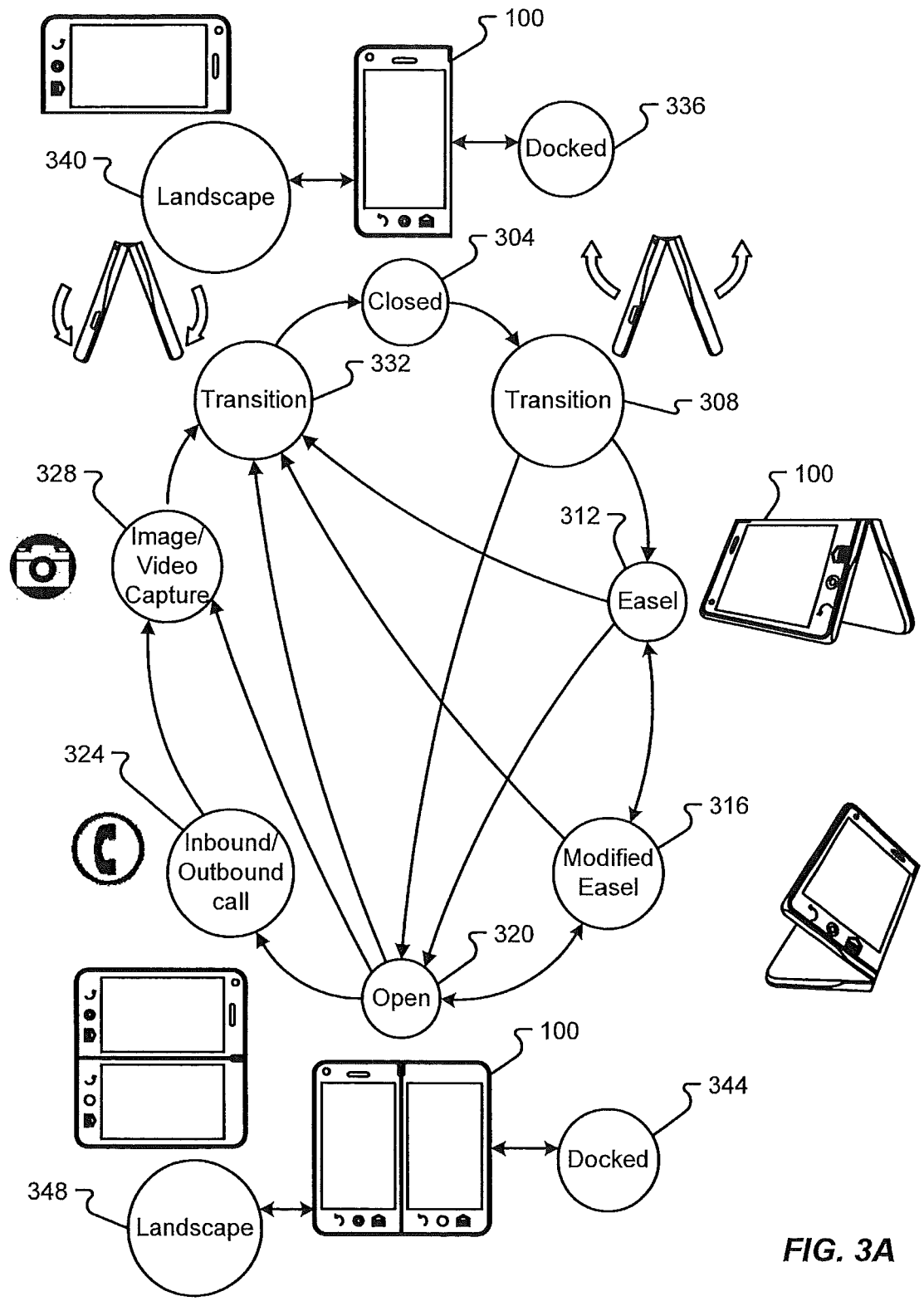
FIG. 3A is a block diagram of an embodiment of the state model for the device based on the device's orientation and/or configuration.

Device State:

FIGS. 3A and 3B represent illustrative states of device 100. While a number of illustrative states are shown, and transitions from a first state to a second state, it is to be appreciated that the illustrative state diagram may not encompass all possible states and/or all possible transitions from a first state to a second state. As illustrated in FIG. 3, the various arrows between the states (illustrated by the state represented in the circle) represent a physical change that occurs to the device 100, that is detected by one or more of hardware and software, the detection triggering one or more of a hardware and/or software interrupt that is used to control and/or manage one or more functions of device 100.

As illustrated in FIG. 3A, there are twelve exemplary "physical" states: closed 304, transition 308 (or opening transitional state), easel 312, modified easel 316, open 320, inbound/outbound call or communication 324, image/video capture 328, transition 332 (or closing transitional state), landscape 340, docked 336, docked 344 and landscape 348. Next to each illustrative state is a representation of the physical state of the device 100 with the exception of states 324 and 328, where the state is generally symbolized by the international icon for a telephone and the icon for a camera, respectfully.

In state 304, the device is in a closed state with the device 100 generally oriented in the portrait direction with the primary screen 104 and the secondary screen 108 back-to-back in different planes (see FIG. 1H). From the closed state, the device 100 can enter, for example, docked state 336, where the device 100 is coupled with a docking station, docking cable, or in general docked or associated with one or more other devices or peripherals, or the landscape state 340, where the device 100 is generally oriented with the primary screen 104 facing the user, and the primary screen 104 and the secondary screen 108 being back-to-back.

In the closed state, the device can also move to a transitional state where the device remains closed by the display is moved from one screen 104 to another screen 108 based on a user input, e.g., a double tap on the screen 110, 114. Still another embodiment includes a bilateral state. In the bilateral state, the device remains closed, but a single application displays at least one window on both the first display 110 and the second display 114. The windows shown on the first and second display 110, 114 may be the same or different based on the application and the state of that application. For example, while acquiring an image with a camera, the device may display the view finder on the first display 110 and displays a preview for the photo subjects (full screen and mirrored left-to-right) on the second display 114.

In state 308, a transition state from the closed state 304 to the semi-open state or easel state 312, the device 100 is shown opening with the primary screen 104 and the secondary screen 108 being rotated around a point of axis coincidence with the hinge. Upon entering the easel state 312, the primary screen 104 and the secondary screen 108 are separated from one another such that, for example, the device 100 can sit in an easel-like configuration on a surface.

In state 316, known as the modified easel position, the device 100 has the primary screen 104 and the secondary screen 108 in a similar relative relationship to one another as in the easel state 312, with the difference being one of the primary screen 104 or the secondary screen 108 are placed on a surface as shown.

State 320 is the open state where the primary screen 104 and the secondary screen 108 are generally on the same plane. From the open state, the device 100 can transition to the docked state 344 or the open landscape state 348. In the open state 320, the primary screen 104 and the secondary screen 108 are generally in the portrait-like orientation while in landscaped state 348 the primary screen 104 and the secondary screen 108 are generally in a landscape-like orientation.

State 324 is illustrative of a communication state, such as when an inbound or outbound call is being received or placed, respectively, by the device 100. While not illustrated for clarity, it should be appreciated the device 100 can transition to the inbound/outbound call state 324 from any state illustrated in FIG. 3. In a similar manner, the image/video capture state 328 can be entered into from any other state in FIG. 3, with the image/video capture state 328 allowing the device 100 to take one or more images via a camera and/or videos with a video capture device 240.

Transition state 322 illustratively shows primary screen 104 and the secondary screen 108 being closed upon one another for entry into, for example, the closed state 304.

FIG. 3B illustrates, with reference to the key, the inputs that are received to detect a transition from a first state to a second state. In FIG. 3B, various combinations of states are shown with in general, a portion of the columns being directed toward a portrait state 352, a landscape state 356, and a portion of the rows being directed to portrait state 360 and landscape state 364.

In FIG. 3B, the Key indicates that "H" represents an input from one or more Hall Effect sensors, "A" represents an input from one or more accelerometers, "T" represents an input from a timer, "P" represents a communications trigger input and "I" represents an image and/or video capture request input. Thus, in the center portion 376 of the chart, an input, or combination of inputs, are shown that represent how the device 100 detects a transition from a first physical state to a second physical state.

As discussed, in the center portion of the chart 376, the inputs that are received enable the detection of a transition from, for example, a portrait open state to a landscape easel state-shown in bold—"HAT." For this exemplary transition from the portrait open to the landscape easel state, a Hall Effect sensor ("H"), an accelerometer ("A") and a timer ("T") input may be needed. The timer input can be derived from, for example, a clock associated with the processor.

In addition to the portrait and landscape states, a docked state 368 is also shown that is triggered based on the receipt of a docking signal 372. As discussed above and in relation to FIG. 3, the docking signal can be triggered by the association of the device 100 with one or more other device 100s, accessories, peripherals, smart docks, or the like.

User Interaction:

FIGS. 4A through 4H depict various graphical representations of gesture inputs that may be recognized by the screens 104, 108. The gestures may be performed not only by a user's body part, such as a digit, but also by other devices, such as a stylus, that may be sensed by the contact sensing portion(s) of a screen 104, 108. In general, gestures are interpreted differently, based on where the gestures are performed (either directly on the display 110, 114 or in the gesture capture region 120, 124). For example, gestures in the display 110, 114 may be directed to a desktop or application, and gestures in the gesture capture region 120, 124 may be interpreted as for the system.

With reference to FIGS. 4A-4H, a first type of gesture, a touch gesture 420, is substantially stationary on the screen 104,108 for a selected length of time. A circle 428 represents a touch or other contact type received at particular location of a contact sensing portion of the screen. The circle 428 may include a border 432, the thickness of which indicates a length of time that the contact is held substantially stationary at the contact location. For instance, a tap 420 (or short press) has a thinner border 432a than the border 432b for a long press 424 (or for a normal press). The long press 424 may involve a contact that remains substantially stationary on the screen for longer time period than that of a tap 420. As will be appreciated, differently defined gestures may be registered depending upon the length of time that the touch remains stationary prior to contact cessation or movement on the screen.

Figure 4A:
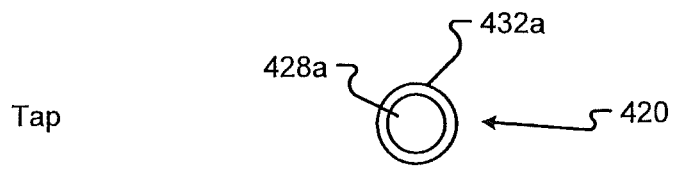
FIG. 4A is a first representation of an embodiment of user gesture received at a device.
Figure 4B:
FIG. 4B is a second representation of an embodiment of user gesture received at a device.
Figure 4C:
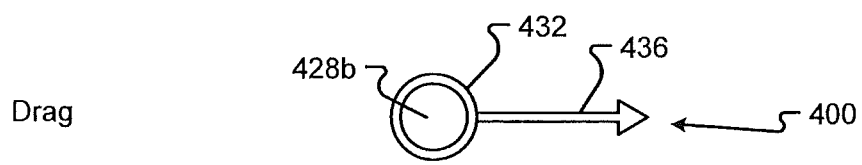
FIG. 4C is a third representation of an embodiment of user gesture received at a device.

With reference to FIG. 4C, a drag gesture 400 on the screen 104,108 is an initial contact (represented by circle 428) with contact movement 436 in a selected direction. The initial contact 428 may remain stationary on the screen 104,108 for a certain amount of time represented by the border 432. The drag gesture typically requires the user to contact an icon, window, or other displayed image at a first location followed by movement of the contact in a drag direction to a new second location desired for the selected displayed image. The contact movement need not be in a straight line but have any path of movement so long as the contact is substantially continuous from the first to the second locations.

Figure 4D:
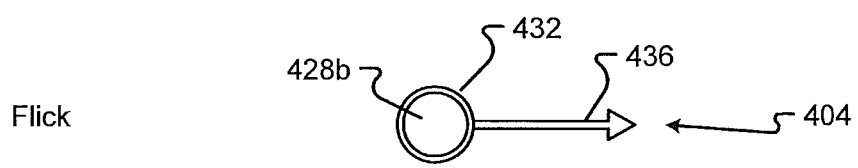
FIG. 4D is a fourth representation of an embodiment of user gesture received at a device.

With reference to FIG. 4D, a flick gesture 404 on the screen 104,108 is an initial contact (represented by circle 428) with truncated contact movement 436 (relative to a drag gesture) in a selected direction. In embodiments, a flick has a higher exit velocity for the last movement in the gesture compared to the drag gesture. The flick gesture can, for instance, be a finger snap following initial contact. Compared to a drag gesture, a flick gesture generally does not require continual contact with the screen 104,108 from the first location of a displayed image to a predetermined second location. The contacted displayed image is moved by the flick gesture in the direction of the flick gesture to the predetermined second location. Although both gestures commonly can move a displayed image from a first location to a second location, the temporal duration and distance of travel of the contact on the screen is generally less for a flick than for a drag gesture.

Figure 4E:
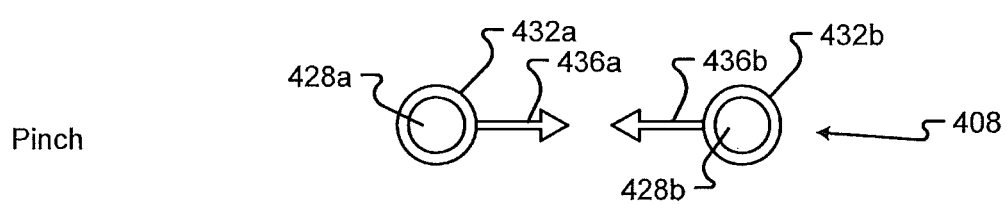
FIG. 4E is a fifth representation of an embodiment of user gesture received at a device.

With reference to FIG. 4E, a pinch gesture 408 on the screen 104,108 is depicted. The pinch gesture 408 may be initiated by a first contact 428a to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104 or 108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436 a, b, respectively. The first and second contact movements 436 a, b are generally in opposing directions. Stated another way, the first contact movement 436a is towards the second contact 436b, and the second contact movement 436b is towards the first contact 436a. More simply stated, the pinch gesture 408 may be accomplished by a user's digits touching the screen 104,108 in a pinching motion.

Figure 4F:
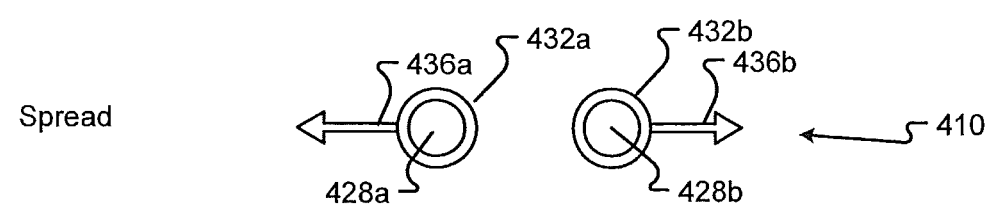
FIG. 4F is a sixth representation of an embodiment of user gesture received at a device.

With reference to FIG. 4F, a spread gesture 410 on the screen 104,108 is depicted. The spread gesture 410 may be initiated by a first contact 428a to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104,108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436a, b, respectively. The first and second contact movements 436 a, b are generally in a common direction. Stated another way, the first and second contact movements 436 a, b are away from the first and second contacts 428a, b. More simply stated, the spread gesture 410 may be accomplished by a user's digits touching the screen 104,108 in a spreading motion.

Figure 4G:
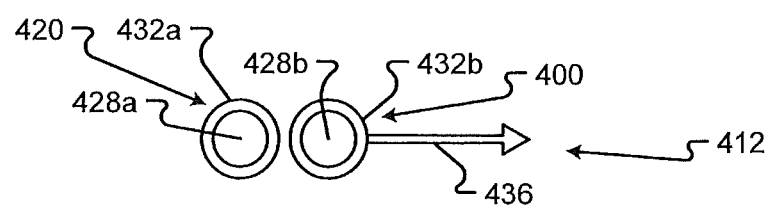
FIG. 4G is a seventh representation of an embodiment of user gesture received at a device.
Figure 4H:
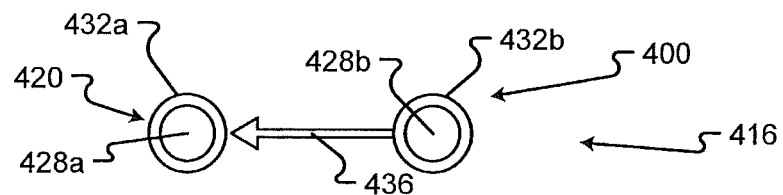
FIG. 4H is a eighth representation of an embodiment of user gesture received at a device.

The above gestures may be combined in any manner, such as those shown by FIGS. 4G and 4H, to produce a determined functional result. For example, in FIG. 4G a tap gesture 420 is combined with a drag or flick gesture 412 in a direction away from the tap gesture 420. In FIG. 4H, a tap gesture 420 is combined with a drag or flick gesture 412 in a direction towards the tap gesture 420.

The functional result of receiving a gesture can vary depending on a number of factors, including a state of the device 100, display 110, 114, or screen 104, 108, a context associated with the gesture, or sensed location of the gesture. The state of the device commonly refers to one or more of a configuration of the device 100, a display orientation, and user and other inputs received by the device 100. Context commonly refers to one or more of the particular application(s) selected by the gesture and the portion(s) of the application currently executing, whether the application is a single- or multi-screen application, and whether the application is a multi-screen application displaying one or more windows in one or more screens or in one or more stacks. Sensed location of the gesture commonly refers to whether the sensed set(s) of gesture location coordinates are on a touch sensitive display 110, 114 or a gesture capture region 120, 124, whether the sensed set(s) of gesture location coordinates are associated with a common or different display or screen 104,108, and/or what portion of the gesture capture region contains the sensed set(s) of gesture location coordinates.

A tap, when received by an a touch sensitive display 110, 114, can be used, for instance, to select an icon to initiate or terminate execution of a corresponding application, to maximize or minimize a window, to reorder windows in a stack, and to provide user input such as by keyboard display or other displayed image. A drag, when received by a touch sensitive display 110, 114, can be used, for instance, to relocate an icon or window to a desired location within a display, to reorder a stack on a display, or to span both displays (such that the selected window occupies a portion of each display simultaneously). A flick, when received by a touch sensitive display 110, 114 or a gesture capture region 120, 124, can be used to relocate a window from a first display to a second display or to span both displays (such that the selected window occupies a portion of each display simultaneously). Unlike the drag gesture, however, the flick gesture is generally not used to move the displayed image to a specific user-selected location but to a default location that is not configurable by the user.

The pinch gesture, when received by a touch sensitive display 110, 114 or a gesture capture region 120, 124, can be used to minimize or otherwise increase the displayed area or size of a window (typically when received entirely by a common display), to switch windows displayed at the top of the stack on each display to the top of the stack of the other display (typically when received by different displays or screens), or to display an application manager (a "pop-up window" that displays the windows in the stack). The spread gesture, when received by a touch sensitive display 110, 114 or a gesture capture region 120, 124, can be used to maximize or otherwise decrease the displayed area or size of a window, to switch windows displayed at the top of the stack on each display to the top of the stack of the other display (typically when received by different displays or screens), or to display an application manager (typically when received by an off-screen gesture capture region on the same or different screens).

The combined gestures of FIG. 4G, when received by a common display capture region in a common display or screen 104,108, can be used to hold a first window stack location in a first stack constant for a display receiving the gesture while reordering a second window stack location in a second window stack to include a window in the display receiving the gesture. The combined gestures of FIG. 4H, when received by different display capture regions in a common display or screen 104,108 or in different displays or screens, can be used to hold a first window stack location in a first window stack constant for a display receiving the tap part of the gesture while reordering a second window stack location in a second window stack to include a window in the display receiving the flick or drag gesture. Although specific gestures and gesture capture regions in the preceding examples have been associated with corresponding sets of functional results, it is to be appreciated that these associations can be redefined in any manner to produce differing associations between gestures and/or gesture capture regions and/or functional results.

Figure 5A:
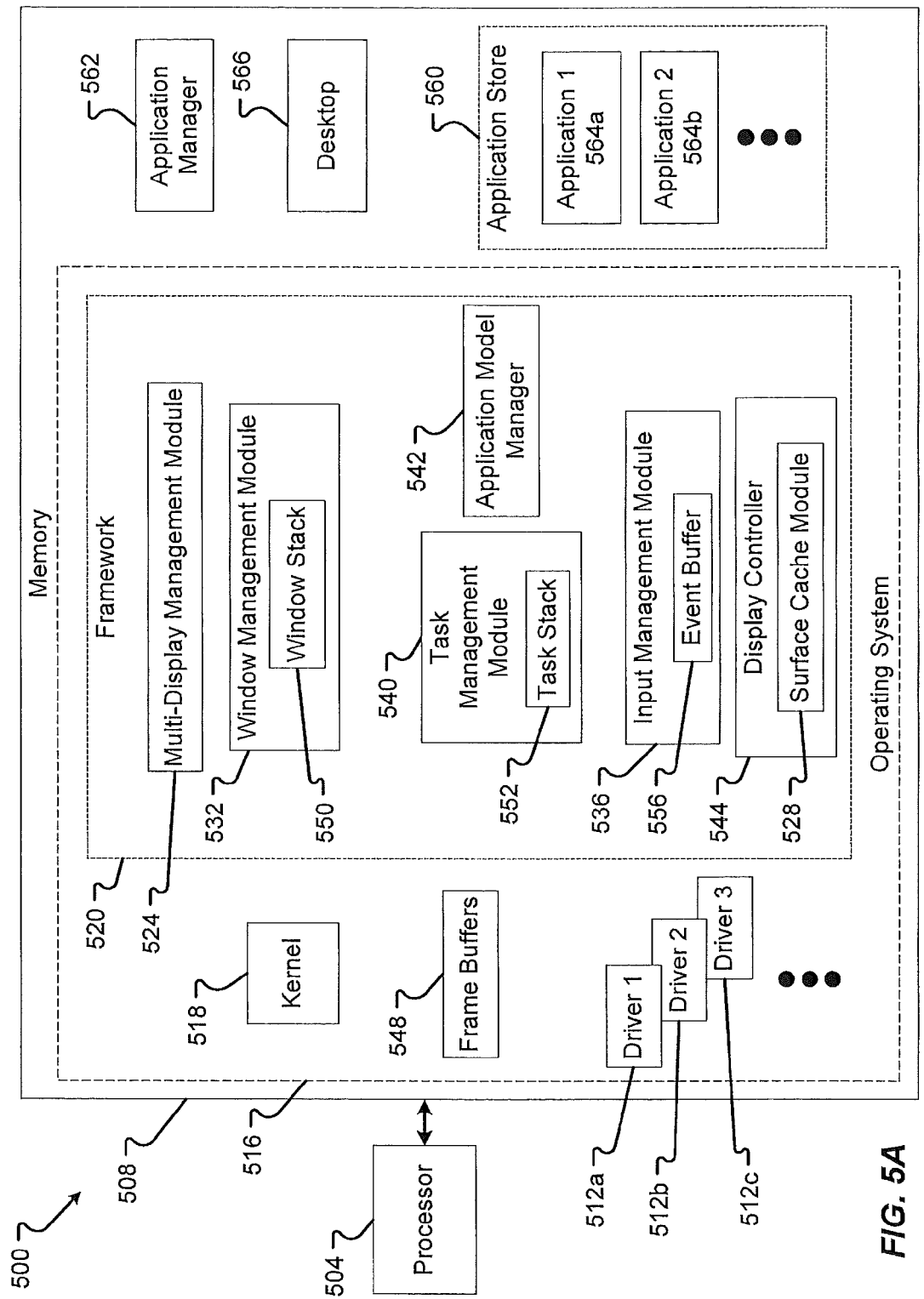
FIG. 5A is a block diagram of an embodiment of the device software and/or firmware.

Firmware and Software:

With reference to FIG. 5, the memory 508 may store and the processor 504 may execute one or more software components. These components can include at least one operating system (OS) 516, an application manager 562, a desktop 566, and/or one or more applications 564a and/or 564b from an application store 560. The OS 516 can include a framework 520, one or more frame buffers 548, one or more drivers 512, previously described in conjunction with FIG. 2, and/or a kernel 518. The OS 516 can be any software, consisting of programs and data, which manages computer hardware resources and provides common services for the execution of various applications 564. The OS 516 can be any operating system and, at least in some embodiments, dedicated to mobile devices, including, but not limited to, Linux, ANDROID™, iPhone OS (IOS™), WINDOWS PHONE 7™, etc. The OS 516 is operable to provide functionality to the phone by executing one or more operations, as described herein.

The applications 564 can be any higher level software that executes particular functionality for the user. Applications 564 can include programs such as email clients, web browsers, texting applications, games, media players, office suites, etc. The applications 564 can be stored in an application store 560, which may represent any memory or data storage, and the management software associated therewith, for storing the applications 564. Once executed, the applications 564 may be run in a different area of memory 508.

The framework 520 may be any software or data that allows the multiple tasks running on the device to interact. In embodiments, at least portions of the framework 520 and the discrete components described hereinafter may be considered part of the OS 516 or an application 564. However, these portions will be described as part of the framework 520, but those components are not so limited. The framework 520 can include, but is not limited to, a Multi-Display Management (MDM) module 524, a Surface Cache module 528, a Window Management module 532, an Input Management module 536, a Task Management module 540, an Application Model Manager 542, a Display Controller, one or more frame buffers 548, a task stack 552, one or more window stacks 550 (which is a logical arrangement of windows and/or desktops in a display area), and/or an event buffer 556.

The MDM module 524 includes one or more modules that are operable to manage the display of applications or other data on the screens of the device. An embodiment of the MDM module 524 is described in conjunction with FIG. 5B. In embodiments, the MDM module 524 receives inputs from the other OS 516 components, such as, the drivers 512, and from the applications 564 to determine continually the state of the device 100. The inputs assist the MDM module 524 in determining how to configure and allocate the displays according to the application's preferences and requirements, and the user's actions. Once a determination for display configurations is made, the MDM module 524 can bind the applications 564 to a display. The configuration may then be provided to one or more other components to generate a window with a display.

The Surface Cache module 528 includes any memory or storage and the software associated therewith to store or cache one or more images of windows. A series of active and/or non-active windows (or other display objects, such as, a desktop display) can be associated with each display. An active window (or other display object) is currently displayed. A non-active windows (or other display objects) were opened and, at some time, displayed but are now not displayed. To enhance the user experience, before a window transitions from an active state to an inactive state, a "screen shot" of a last generated image of the window (or other display object) can be stored. The Surface Cache module 528 may be operable to store a bitmap of the last active image of a window (or other display object) not currently displayed. Thus, the Surface Cache module 528 stores the images of non-active windows (or other display objects) in a data store.

In embodiments, the Window Management module 532 is operable to manage the windows (or other display objects) that are active or not active on each of the displays. The Window Management module 532, based on information from the MDM module 524, the OS 516, or other components, determines when a window (or other display object) is visible or not active. The Window Management module 532 may then put a non-visible window (or other display object) in a "not active state" and, in conjunction with the Task Management module Task Management 540 suspends the application's operation. Further, the Window Management module 532 may assign, through collaborative interaction with the MDM module 524, a display identifier to the window (or other display object) or manage one or more other items of data associated with the window (or other display object). The Window Management module 532 may also provide the stored information to the application 564, the Task Management module 540, or other components interacting with or associated with the window (or other display object). The Window Management module 532 can also associate an input task with a window based on window focus and display coordinates within the motion space.

The Input Management module 536 is operable to manage events that occur with the device. An event is any input into the window environment, for example, a user interface interactions with a user. The Input Management module 536 receives the events and logically stores the events in an event buffer 556. Events can include such user interface interactions as a "down event," which occurs when a screen 104, 108 receives a touch signal from a user, a "move event," which occurs when the screen 104, 108 determines that a user's finger is moving across a screen(s), an "up event, which occurs when the screen 104, 108 determines that the user has stopped touching the screen 104, 108, etc. These events are received, stored, and forwarded to other modules by the Input Management module 536. The Input Management module 536 may also map screen inputs to a motion space which is the culmination of all physical and virtual display available on the device.

The motion space is a virtualized space that includes all touch sensitive displays 110,114 "tiled" together to mimic the physical dimensions of the device 100. For example, when the device 100 is unfolded, the motion space size may be 960×800, which may be the number of pixels in the combined display area for both touch sensitive displays 110, 114. If a user touches on a first touch sensitive display 110 on location (40, 40), a full screen window can receive touch event with location (40, 40). If a user touches on a second touch sensitive display 114, with location (40, 40), the full screen window can receive touch event with location (520, 40), because the second touch sensitive display 114 is on the right side of the first touch sensitive display 110, so the device 100 can offset the touch by the first touch sensitive display's 110 width, which is 480 pixels. When a hardware event occurs with location info from a driver 512, the framework 520 can upscale the physical location to the motion space because the location of the event may be different based on the device orientation and state. The motion space may be as described in U.S. patent application Ser. No. 13/187,026, filed Jul. 20, 2011, entitled "Systems and Methods for Receiving Gesture Inputs Spanning Multiple Input Devices," which is hereby incorporated by reference in its entirety for all that it teaches and for all purposes.

A task can be an application and a sub-task can be an application component that provides a window with which users can interact to do something, such as dial the phone, take a photo, send an email, or view a map. Each task may be given a window in which to draw a user interface. The window typically fills a display (for example, touch sensitive display 110,114), but may be smaller than the display 110, 114 and float on top of other windows. An application usually consists of multiple sub-tasks that are loosely bound to each other. Typically, one task in an application is specified as the "main" task, which is presented to the user when launching the application for the first time. Each task can then start another task or sub-task to perform different actions.

The Task Management module 540 is operable to manage the operation of one or more applications 564 that may be executed by the device. Thus, the Task Management module 540 can receive signals to launch, suspend, terminate, etc. an application or application sub-tasks stored in the application store 560. The Task Management module 540 may then instantiate one or more tasks or sub-tasks of the application 564 to begin operation of the application 564. Further, the Task Management Module 540 may launch, suspend, or terminate a task or sub-task as a result of user input or as a result of a signal from a collaborating framework 520 component. The Task Management Module 540 is responsible for managing the lifecycle of applications (tasks and sub-task) from when the application is launched to when the application is terminated.

The processing of the Task Management Module 540 is facilitated by a task stack 552, which is a logical structure associated with the Task Management Module 540. The task stack 552 maintains the state of all tasks and sub-tasks on the device 100. When some component of the operating system 516 requires a task or sub-task to transition in its lifecycle, the OS 516 component can notify the Task Management Module 540. The Task Management Module 540 may then locate the task or sub-task, using identification information, in the task stack 552, and send a signal to the task or sub-task indicating what kind of lifecycle transition the task needs to execute. Informing the task or sub-task of the transition allows the task or sub-task to prepare for the lifecycle state transition. The Task Management Module 540 can then execute the state transition for the task or sub-task. In embodiments, the state transition may entail triggering the OS kernel 518 to terminate the task when termination is required.

Further, the Task Management module 540 may suspend the application 564 based on information from the Window Management Module 532. Suspending the application 564 may maintain application data in memory but may limit or stop the application 564 from rendering a window or user interface. Once the application becomes active again, the Task Management module 540 can again trigger the application to render its user interface. In embodiments, if a task is suspended, the task may save the task's state in case the task is terminated. In the suspended state, the application task may not receive input because the application window is not visible to the user.

The frame buffer 548 is a logical structure(s) used to render the user interface. The frame buffer 548 can be created and destroyed by the OS kernel 518. However, the Display Controller 544 can write the image data, for the visible windows, into the frame buffer 548. A frame buffer 548 can be associated with one screen or multiple screens. The association of a frame buffer 548 with a screen can be controlled dynamically by interaction with the OS kernel 518. A composite display may be created by associating multiple screens with a single frame buffer 548. Graphical data used to render an application's window user interface may then be written to the single frame buffer 548, for the composite display, which is output to the multiple screens 104,108. The Display Controller 544 can direct an application's user interface to a portion of the frame buffer 548 that is mapped to a particular display 110,114, thus, displaying the user interface on only one screen 104 or 108. The Display Controller 544 can extend the control over user interfaces to multiple applications, controlling the user interfaces for as many displays as are associated with a frame buffer 548 or a portion thereof. This approach compensates for the multiple physical screens 104,108 that are in use by the software component above the Display Controller 544.

The Application Manager 562 is an application that provides a presentation layer for the window environment. Thus, the Application Manager 562 provides the graphical model for rendering by the Task Management Module 540. Likewise, the Desktop 566 provides the presentation layer for the Application Store 560. Thus, the desktop provides a graphical model of a surface having selectable application icons for the Applications 564 in the Application Store 560 that can be provided to the Window Management Module 556 for rendering.

Further, the framework can include an Application Model Manager (AMM) 542. The Application Manager 562 may interface with the AMM 542. In embodiments, the AMM 542 receives state change information from the device 100 regarding the state of applications (which are running or suspended). The AMM 542 can associate bit map images from the Surface Cache Module 528 to the tasks that are alive (running or suspended). Further, the AMM 542 can convert the logical window stack maintained in the Task Manager Module 540 to a linear ("film strip" or "deck of cards") organization that the user perceives when the using the off gesture capture area 120 to sort through the windows. Further, the AMM 542 may provide a list of executing applications to the Application Manager 562.

Figure 5B:
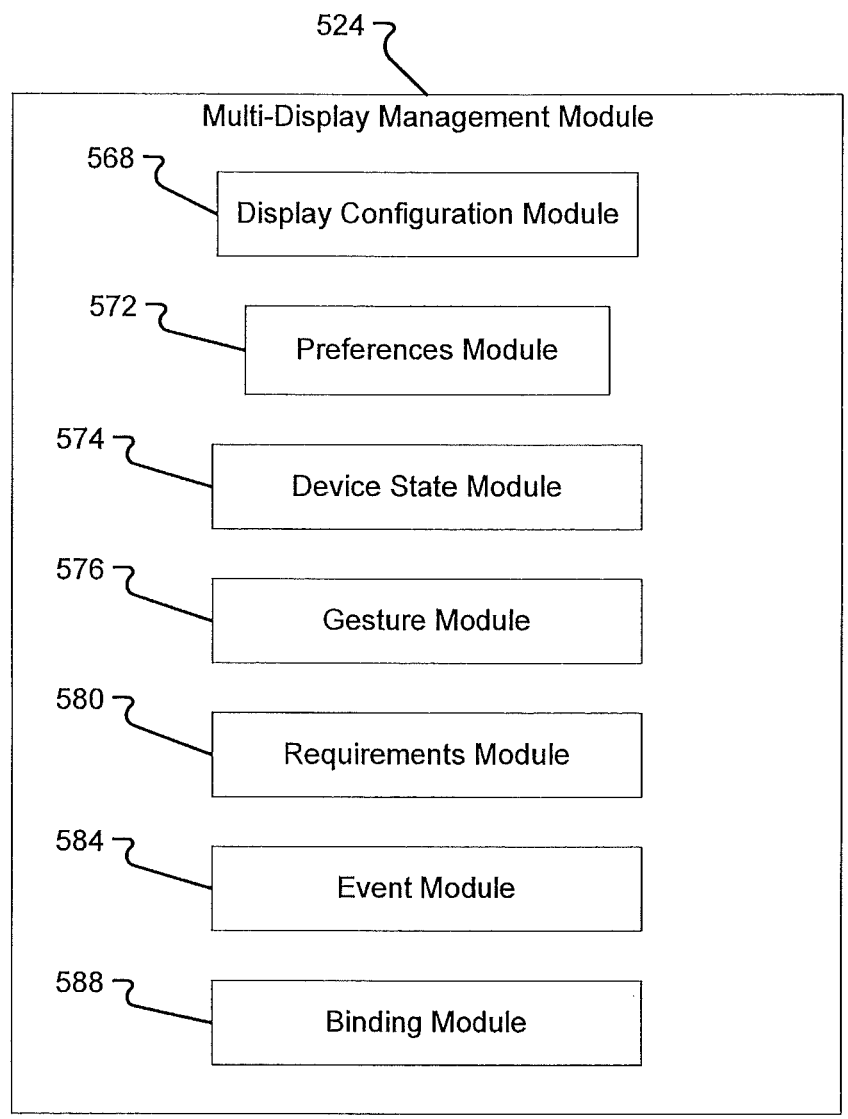
FIG. 5B is a second block diagram of an embodiment of the device software and/or firmware.

An embodiment of the MDM module 524 is shown in FIG. 5B. The MDM module 524 is operable to determine the state of the environment for the device, including, but not limited to, the orientation of the device, whether the device 100 is opened or closed, what applications 564 are executing, how the applications 564 are to be displayed, what actions the user is conducting, the tasks being displayed, etc. To configure the display, the MDM module 524 interprets these environmental factors and determines a display configuration, as described in conjunction with FIGS. 6A-6J. Then, the MDM module 524 can bind the applications 564 or other device components to the displays. The configuration may then be sent to the Display Controller 544 and/or the other components within the OS 516 to generate the display. The MDM module 524 can include one or more of, but is not limited to, a Display Configuration Module 568, a Preferences Module 572, a Device State Module 574, a Gesture Module 576, a Requirements Module 580, an Event Module 584, and/or a Binding Module 588.

The Display Configuration Module 568 determines the layout for the display. In embodiments, the Display Configuration Module 568 can determine the environmental factors. The environmental factors may be received from one or more other MDM modules 524 or from other sources. The Display Configuration Module 568 can then determine from the list of factors the best configuration for the display. Some embodiments of the possible configurations and the factors associated therewith are described in conjunction with FIGS. 6A-6F.

The Preferences Module 572 is operable to determine display preferences for an application 564 or other component. For example, an application can have a preference for Single or Dual displays. The Preferences Module 572 can determine an application's display preference (e.g., by inspecting the application's preference settings) and may allow the application 564 to change to a mode (e.g., single screen, dual screen, max, etc.) if the device 100 is in a state that can accommodate the preferred mode. However, some user interface policies may disallow a mode even if the mode is available. As the configuration of the device changes, the preferences may be reviewed to determine if a better display configuration can be achieved for an application 564.

The Device State Module 574 is operable to determine or receive the state of the device. The state of the device can be as described in conjunction with FIGS. 3A and 3B. The state of the device can be used by the Display Configuration Module 568 to determine the configuration for the display. As such, the Device State Module 574 may receive inputs and interpret the state of the device. The state information is then provided to the Display Configuration Module 568.

The Gesture Module 576 is shown as part of the MDM module 524, but, in embodiments, the Gesture module 576 may be a separate Framework 520 component that is separate from the MDM module 524. In embodiments, the Gesture Module 576 is operable to determine if the user is conducting any actions on any part of the user interface. In alternative embodiments, the Gesture Module 576 receives user interface actions from the configurable area 112,116 only. The Gesture Module 576 can receive touch events that occur on the configurable area 112,116 (or possibly other user interface areas) by way of the Input Management Module 536 and may interpret the touch events (using direction, speed, distance, duration, and various other parameters) to determine what kind of gesture the user is performing. When a gesture is interpreted, the Gesture Module 576 can initiate the processing of the gesture and, by collaborating with other Framework 520 components, can manage the required window animation. The Gesture Module 576 collaborates with the Application Model Manager 542 to collect state information with respect to which applications are running (active or paused) and the order in which applications must appear when a user gesture is performed. The Gesture Module 576 may also receive references to bitmaps (from the Surface Cache Module 528) and live windows so that when a gesture occurs it can instruct the Display Controller 544 how to move the window (s) across the display 110,114. Thus, suspended applications may appear to be running when those windows are moved across the display 110,114.

Further, the Gesture Module 576 can receive task information either from the Task Manage Module 540 or the Input Management module 536. The gestures may be as defined in conjunction with FIGS. 4A through 4H. For example, moving a window causes the display to render a series of display frames that illustrate the window moving. The gesture associated with such user interface interaction can be received and interpreted by the Gesture Module 576. The information about the user gesture is then sent to the Task Management Module 540 to modify the display binding of the task.

The Requirements Module 580, similar to the Preferences Module 572, is operable to determine display requirements for an application 564 or other component. An application can have a set display requirement that must be observed. Some applications require a particular display orientation. For example, the application "Angry Birds" can only be displayed in landscape orientation. This type of display requirement can be determined or received, by the Requirements Module 580. As the orientation of the device changes, the Requirements Module 580 can reassert the display requirements for the application 564. The Display Configuration Module 568 can generate a display configuration that is in accordance with the application display requirements, as provided by the Requirements Module 580.

The Event Module 584, similar to the Gesture Module 576, is operable to determine one or more events occurring with an application or other component that can affect the user interface. Thus, the Event Module 584 can receive event information either from the event buffer 556 or the Task Management module 540. These events can change how the tasks are bound to the displays. The Event Module 584 can collect state change information from other Framework 520 components and act upon that state change information. In an example, when the phone is opened or closed or when an orientation change has occurred, a new message may be rendered in a secondary screen. The state change based on the event can be received and interpreted by the Event Module 584. The information about the events then may be sent to the Display Configuration Module 568 to modify the configuration of the display.

The Binding Module 588 is operable to bind the applications 564 or the other components to the configuration determined by the Display Configuration Module 568. A binding associates, in memory, the display configuration for each application with the display and mode of the application. Thus, the Binding Module 588 can associate an application with a display configuration for the application (e.g. landscape, portrait, multi-screen, etc.). Then, the Binding Module 588 may assign a display identifier to the display. The display identifier associated the application with a particular display of the device 100. This binding is then stored and provided to the Display Controller 544, the other components of the OS 516, or other components to properly render the display. The binding is dynamic and can change or be updated based on configuration changes associated with events, gestures, state changes, application preferences or requirements, etc.

User Interface Configurations:

With reference now to FIGS. 6A-J, various types of output configurations made possible by the device 100 will be described hereinafter.

Figure 6A:
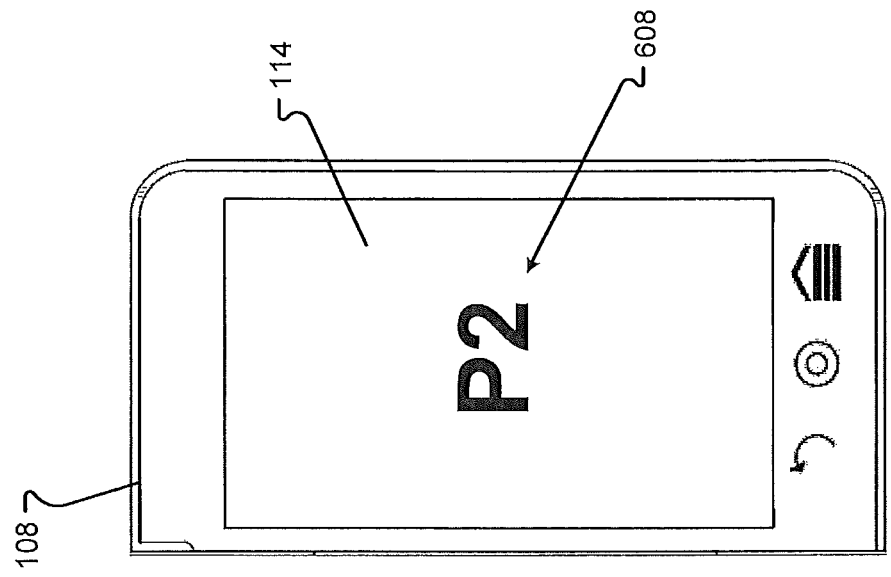
FIG. 6A is a first representation of an embodiment of a device configuration generated in response to the device state.
Figure 6B:
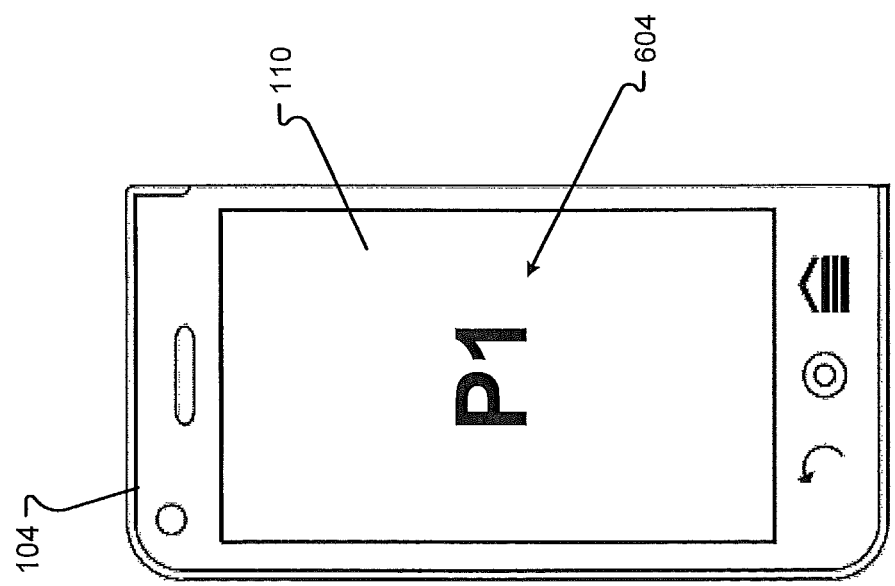
FIG. 6B is a second representation of an embodiment of a device configuration generated in response to the device state.

FIGS. 6A and 6B depict two different output configurations of the device 100 being in a first state. Specifically, FIG. 6A depicts the device 100 being in a closed portrait state 304 where the data is displayed on the primary screen 104. In this example, the device 100 displays data via the touch sensitive display 110 in a first portrait configuration 604. As can be appreciated, the first portrait configuration 604 may only display a desktop or operating system home screen. Alternatively, one or more windows may be presented in a portrait orientation while the device 100 is displaying data in the first portrait configuration 604.

FIG. 6B depicts the device 100 still being in the closed portrait state 304, but instead data is displayed on the secondary screen 108. In this example, the device 100 displays data via the touch sensitive display 114 in a second portrait configuration 608.

It may be possible to display similar or different data in either the first or second portrait configuration 604, 608. It may also be possible to transition between the first portrait configuration 604 and second portrait configuration 608 by providing the device 100 a user gesture (e.g., a double tap gesture), a menu selection, or other means. Other suitable gestures may also be employed to transition between configurations. Furthermore, it may also be possible to transition the device 100 from the first or second portrait configuration 604, 608 to any other configuration described herein depending upon which state the device 100 is moved.

An alternative output configuration may be accommodated by the device 100 being in a second state. Specifically, FIG. 6C depicts a third portrait configuration where data is displayed simultaneously on both the primary screen 104 and the secondary screen 108. The third portrait configuration may be referred to as a Dual-Portrait (PD) output configuration. In the PD output configuration, the touch sensitive display 110 of the primary screen 104 depicts data in the first portrait configuration 604 while the touch sensitive display 114 of the secondary screen 108 depicts data in the second portrait configuration 608. The simultaneous presentation of the first portrait configuration 604 and the second portrait configuration 608 may occur when the device 100 is in an open portrait state 320. In this configuration, the device 100 may display one application window in one display 110 or 114, two application windows (one in each display 110 and 114), one application window and one desktop, or one desktop. Other configurations may be possible. It should be appreciated that it may also be possible to transition the device 100 from the simultaneous display of configurations 604, 608 to any other configuration described herein depending upon which state the device 100 is moved. Furthermore, while in this state, an application's display preference may place the device into bilateral mode, in which both displays are active to display different windows in the same application. For example, a Camera application may display a viewfinder and controls on one side, while the other side displays a mirrored preview that can be seen by the photo subjects. Games involving simultaneous play by two players may also take advantage of bilateral mode.

Figure 6E:
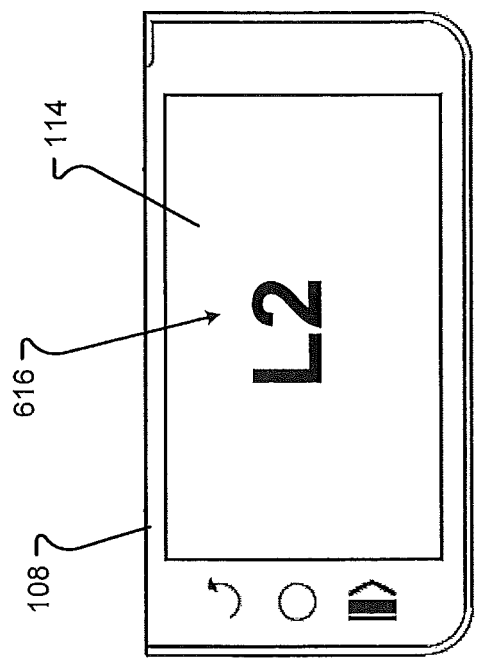
FIG. 6E is a fifth representation of an embodiment of a device configuration generated in response to the device state.
Figure 6D:
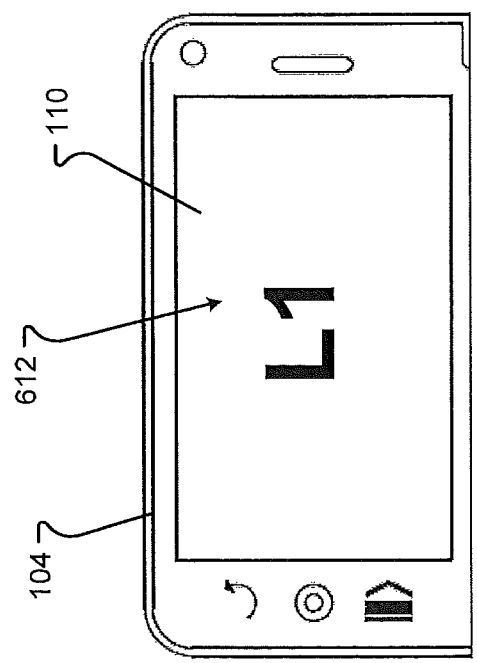
FIG. 6D is a fourth representation of an embodiment of a device configuration generated in response to the device state.

FIGS. 6D and 6E depicts two further output configurations of the device 100 being in a third state. Specifically, FIG. 6D depicts the device 100 being in a closed landscape state 340 where the data is displayed on the primary screen 104. In this example, the device 100 displays data via the touch sensitive display 110 in a first landscape configuration 612. Much like the other configurations described herein, the first landscape configuration 612 may display a desktop, a home screen, one or more windows displaying application data, or the like.

FIG. 6E depicts the device 100 still being in the closed landscape state 340, but instead data is displayed on the secondary screen 108. In this example, the device 100 displays data via the touch sensitive display 114 in a second landscape configuration 616. It may be possible to display similar or different data in either the first or second portrait configuration 612, 616. It may also be possible to transition between the first landscape configuration 612 and second landscape configuration 616 by providing the device 100 with one or both of a twist and tap gesture or a flip and slide gesture. Other suitable gestures may also be employed to transition between configurations. Furthermore, it may also be possible to transition the device 100 from the first or second landscape configuration 612, 616 to any other configuration described herein depending upon which state the device 100 is moved.

Figure 6F:
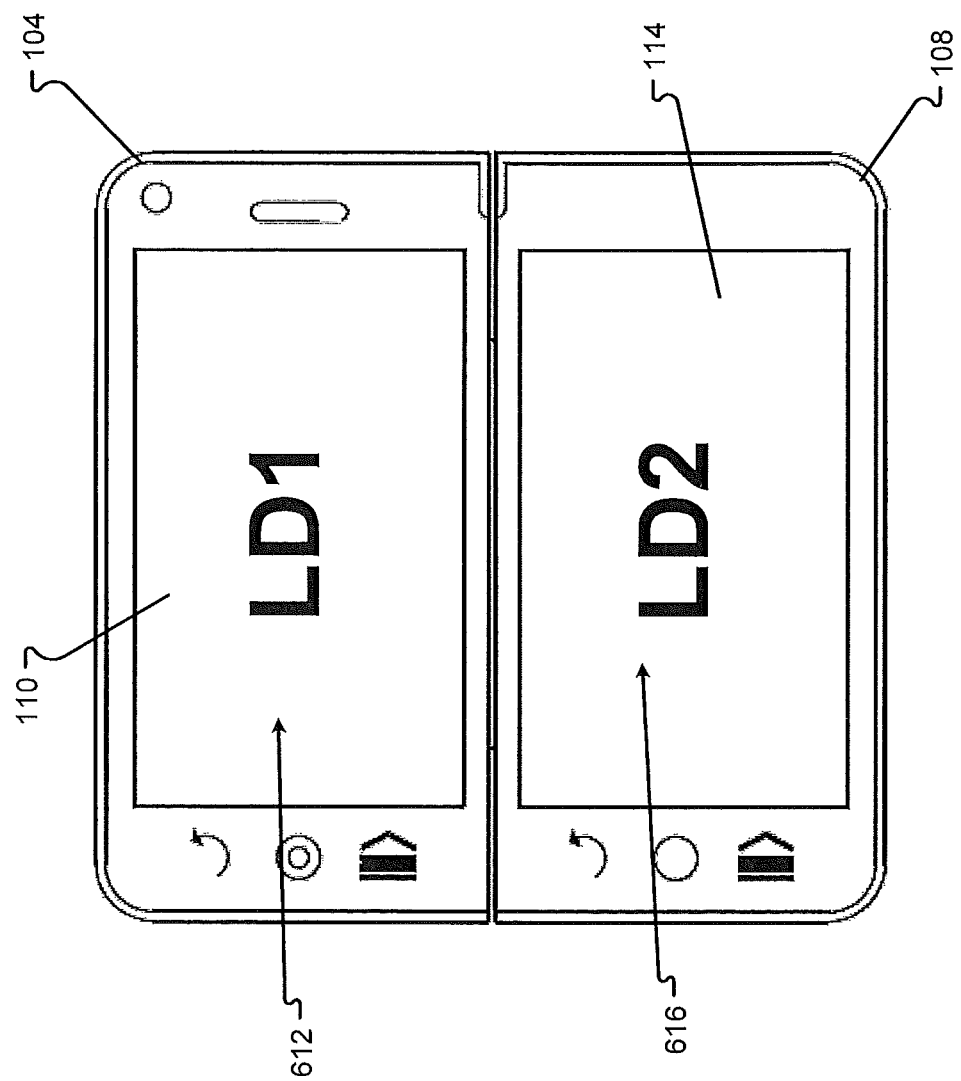
FIG. 6F is a sixth representation of an embodiment of a device configuration generated in response to the device state.

FIG. 6F depicts a third landscape configuration where data is displayed simultaneously on both the primary screen 104 and the secondary screen 108. The third landscape configuration may be referred to as a Dual-Landscape (LD) output configuration. In the LD output configuration, the touch sensitive display 110 of the primary screen 104 depicts data in the first landscape configuration 612 while the touch sensitive display 114 of the secondary screen 108 depicts data in the second landscape configuration 616. The simultaneous presentation of the first landscape configuration 612 and the second landscape configuration 616 may occur when the device 100 is in an open landscape state 340. It should be appreciated that it may also be possible to transition the device 100 from the simultaneous display of configurations 612, 616 to any other configuration described herein depending upon which state the device 100 is moved.

FIGS. 6G and 6H depict two views of a device 100 being in yet another state. Specifically, the device 100 is depicted as being in an easel state 312. FIG. 6G shows that a first easel output configuration 618 may be displayed on the touch sensitive display 110. FIG. 6H shows that a second easel output configuration 620 may be displayed on the touch sensitive display 114. The device 100 may be configured to depict either the first easel output configuration 618 or the second easel output configuration 620 individually. Alternatively, both the easel output configurations 618, 620 may be presented simultaneously. In some embodiments, the easel output configurations 618, 620 may be similar or identical to the landscape output configurations 612, 616. The device 100 may also be configured to display one or both of the easel output configurations 618, 620 while in a modified easel state 316. It should be appreciated that simultaneous utilization of the easel output configurations 618, 620 may facilitate two-person games (e.g., Battleship®, chess, checkers, etc.), multi-user conferences where two or more users share the same device 100, and other applications. As can be appreciated, it may also be possible to transition the device 100 from the display of one or both configurations 618, 620 to any other configuration described herein depending upon which state the device 100 is moved.

Figure 6I:
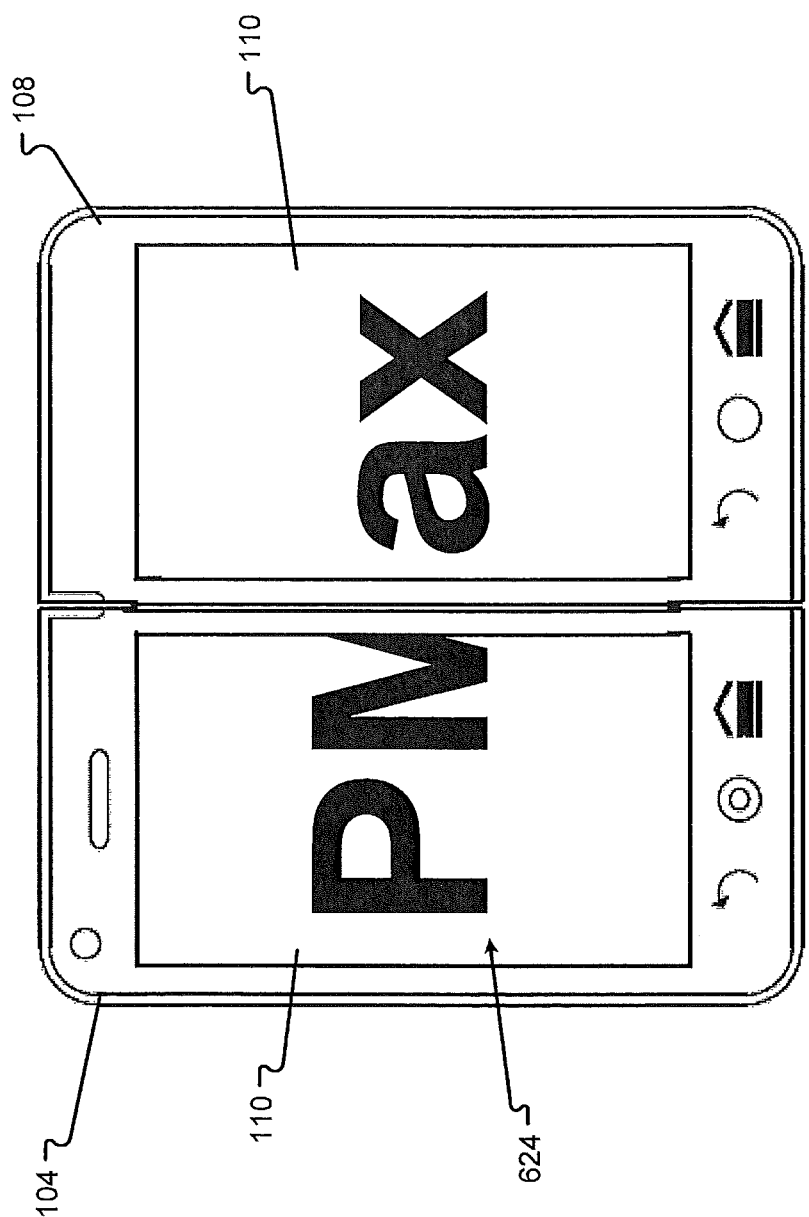
FIG. 6I is a ninth representation of an embodiment of a device configuration generated in response to the device state.

FIG. 6I depicts yet another output configuration that may be accommodated while the device 100 is in an open portrait state 320. Specifically, the device 100 may be configured to present a single continuous image across both touch sensitive displays 110, 114 in a portrait configuration referred to herein as a Portrait-Max (PMax) configuration 624. In this configuration, data (e.g., a single image, application, window, icon, video, etc.) may be split and displayed partially on one of the touch sensitive displays while the other portion of the data is displayed on the other touch sensitive display. The Pmax configuration 624 may facilitate a larger display and/or better resolution for displaying a particular image on the device 100. Similar to other output configurations, it may be possible to transition the device 100 from the Pmax configuration 624 to any other output configuration described herein depending upon which state the device 100 is moved.

Figure 6J:
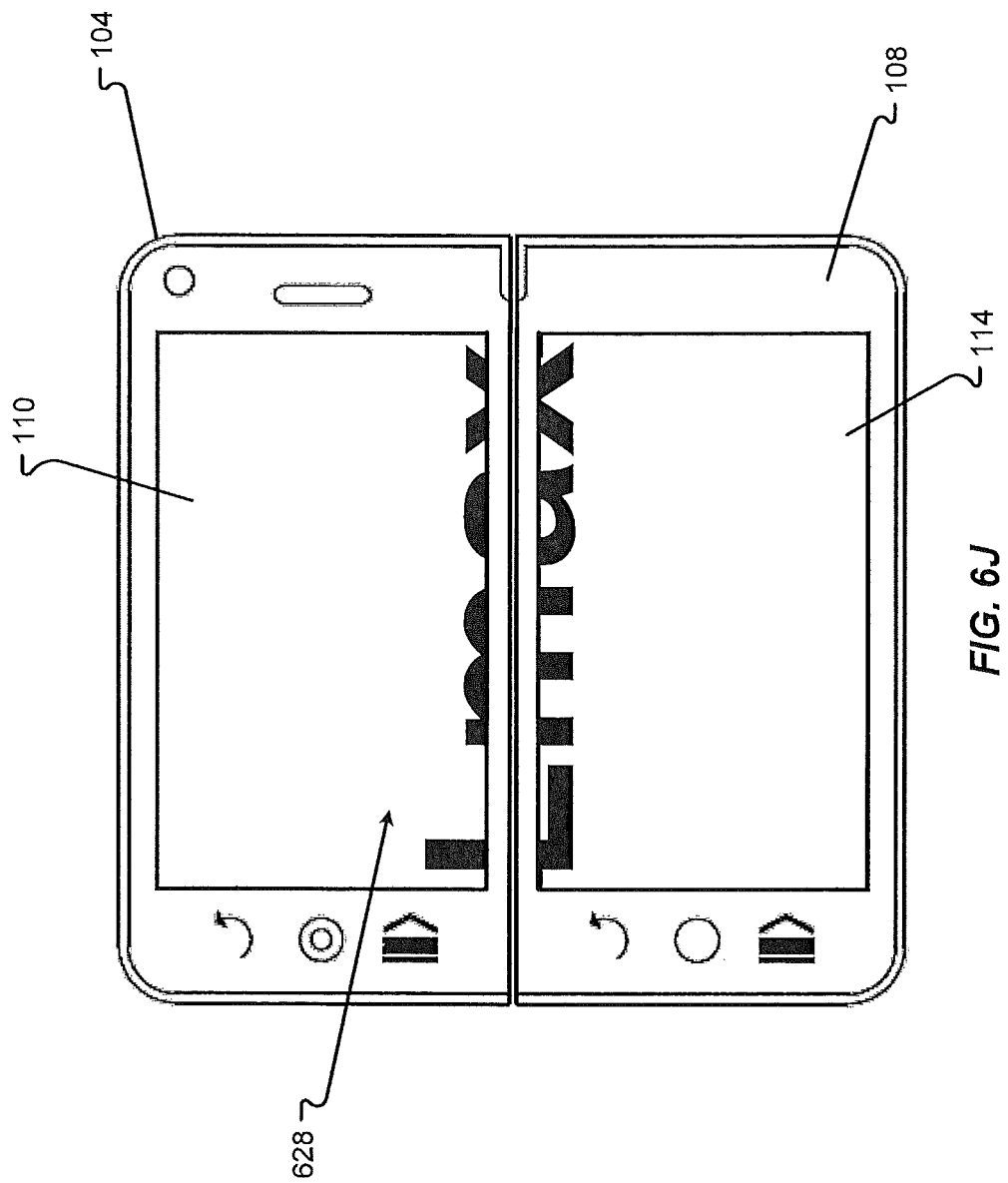
FIG. 6J is a tenth representation of an embodiment of a device configuration generated in response to the device state.

FIG. 6J depicts still another output configuration that may be accommodated while the device 100 is in an open landscape state 348. Specifically, the device 100 may be configured to present a single continuous image across both touch sensitive displays 110, 114 in a landscape configuration referred to herein as a Landscape-Max (LMax) configuration 628. In this configuration, data (e.g., a single image, application, window, icon, video, etc.) may be split and displayed partially on one of the touch sensitive displays while the other portion of the data is displayed on the other touch sensitive display. The Lmax configuration 628 may facilitate a larger display and/or better resolution for displaying a particular image on the device 100. Similar to other output configurations, it may be possible to transition the device 100 from the Lmax configuration 628 to any other output configuration described herein depending upon which state the device 100 is moved.

Figure 7A:
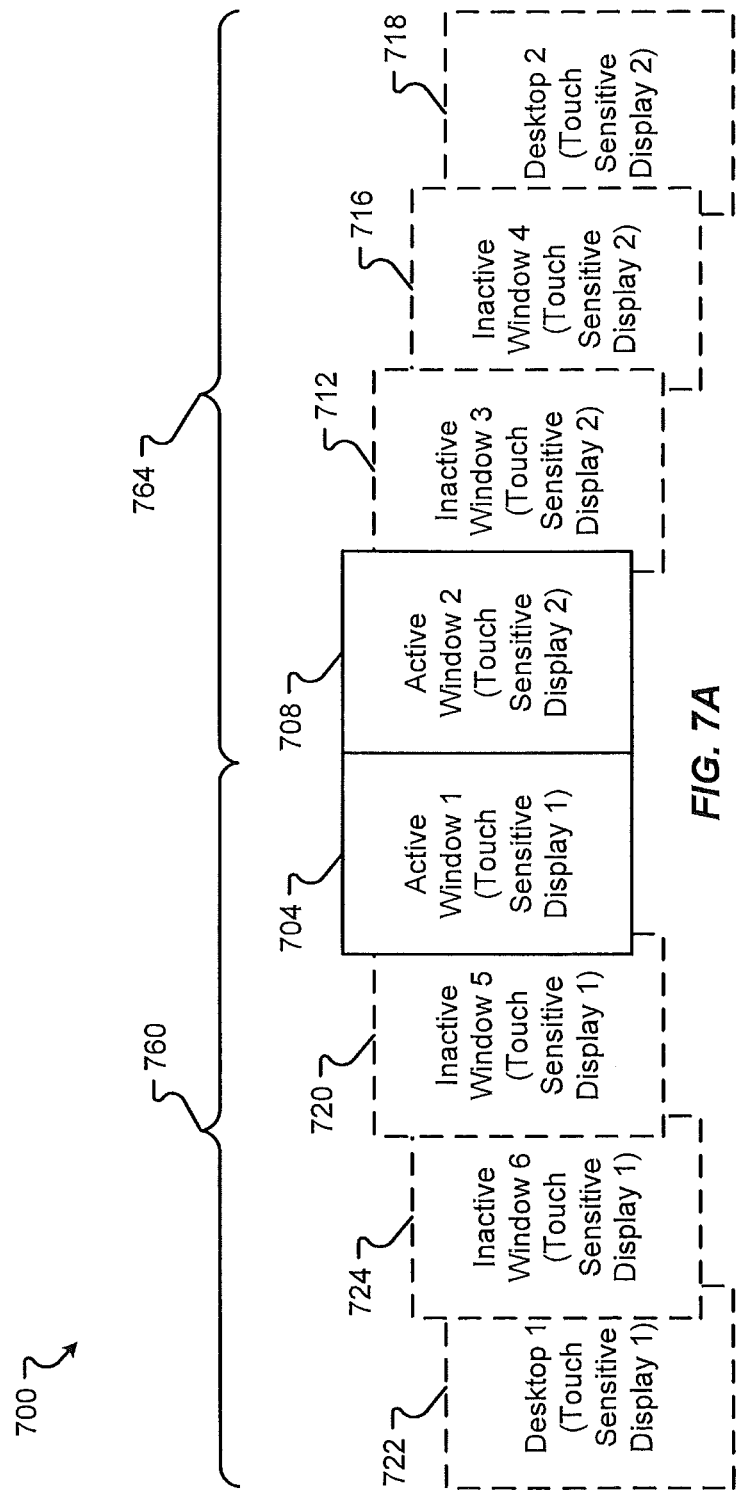
FIG. 7A is representation of a logical window stack.
Figure 7B:
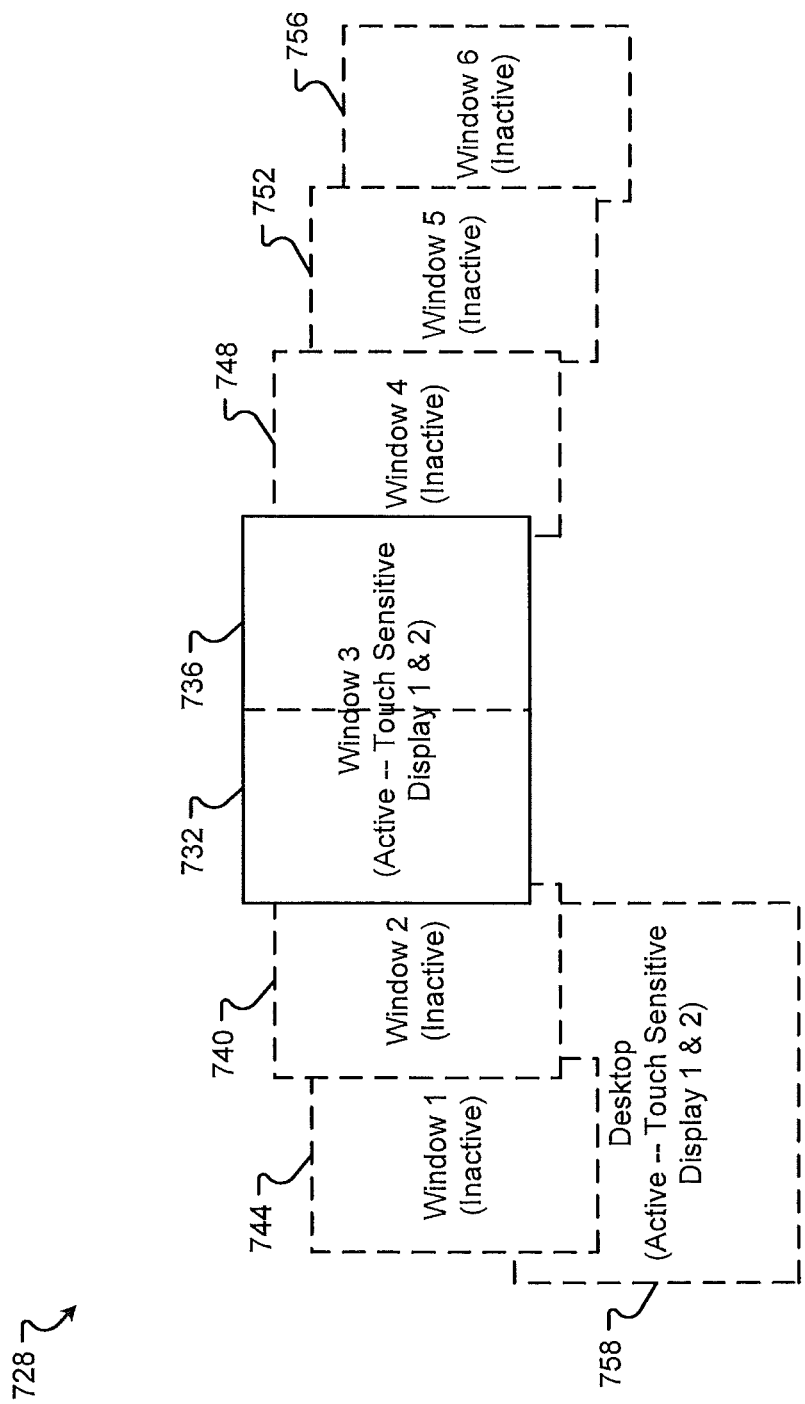
FIG. 7B is another representation of an embodiment of a logical window stack.

The device 100 manages desktops and/or windows with at least one window stack 700, 728, as shown in FIGS. 7A and 7B. A window stack 700, 728 is a logical arrangement of active and/or inactive windows for a multi-screen device. For example, the window stack 700, 728 may be logically similar to a deck of cards, where one or more windows or desktops are arranged in order, as shown in FIGS. 7A and 7B. An active window is a window that is currently being displayed on at least one of the touch sensitive displays 110, 114. For example, windows 104 and 108 are active windows and are displayed on touch sensitive displays 110 and 114. An inactive window is a window that was opened and displayed but is now "behind" an active window and not being displayed. In embodiments, an inactive window may be for an application that is suspended, and thus, the window is not displaying active content. For example, windows 712, 716, 720, and 724 are inactive windows.

A window stack 700, 728 may have various arrangements or organizational structures. In the embodiment shown in FIG. 7A, the device 100 includes a first stack 760 associated with a first touch sensitive display 110 and a second stack associated with a second touch sensitive display 114. Thus, each touch sensitive display 110, 114 can have an associated window stack 760, 764. These two window stacks 760, 764 may have different numbers of windows arranged in the respective stacks 760, 764. Further, the two window stacks 760, 764 can also be identified differently and managed separately. Thus, the first window stack 760 can be arranged in order from a first window 704 to a next window 720 to a last window 724 and finally to a desktop 722, which, in embodiments, is at the "bottom" of the window stack 760. In embodiments, the desktop 722 is not always at the "bottom" as application windows can be arranged in the window stack below the desktop 722, and the desktop 722 can be brought to the "top" of a stack over other windows during a desktop reveal. Likewise, the second stack 764 can be arranged from a first window 708 to a next window 712 to a last window 716, and finally to a desktop 718, which, in embodiments, is a single desktop area, with desktop 722, under all the windows in both window stack 760 and window stack 764. A logical data structure for managing the two window stacks 760, 764 may be as described in conjunction with FIG. 8.

Another arrangement for a window stack 728 is shown in FIG. 7B. In this embodiment, there is a single window stack 728 for both touch sensitive displays 110, 114. Thus, the window stack 728 is arranged from a desktop 758 to a first window 744 to a last window 756. A window can be arranged in a position among all windows without an association to a specific touch sensitive display 110, 114. In this embodiment, a window is in the order of windows. Further, at least one window is identified as being active. For example, a single window may be rendered in two portions 732 and 736 that are displayed on the first touch sensitive screen 110 and the second touch sensitive screen 114. The single window may only occupy a single position in the window stack 728 although it is displayed on both displays 110, 114.

Figure 7C:
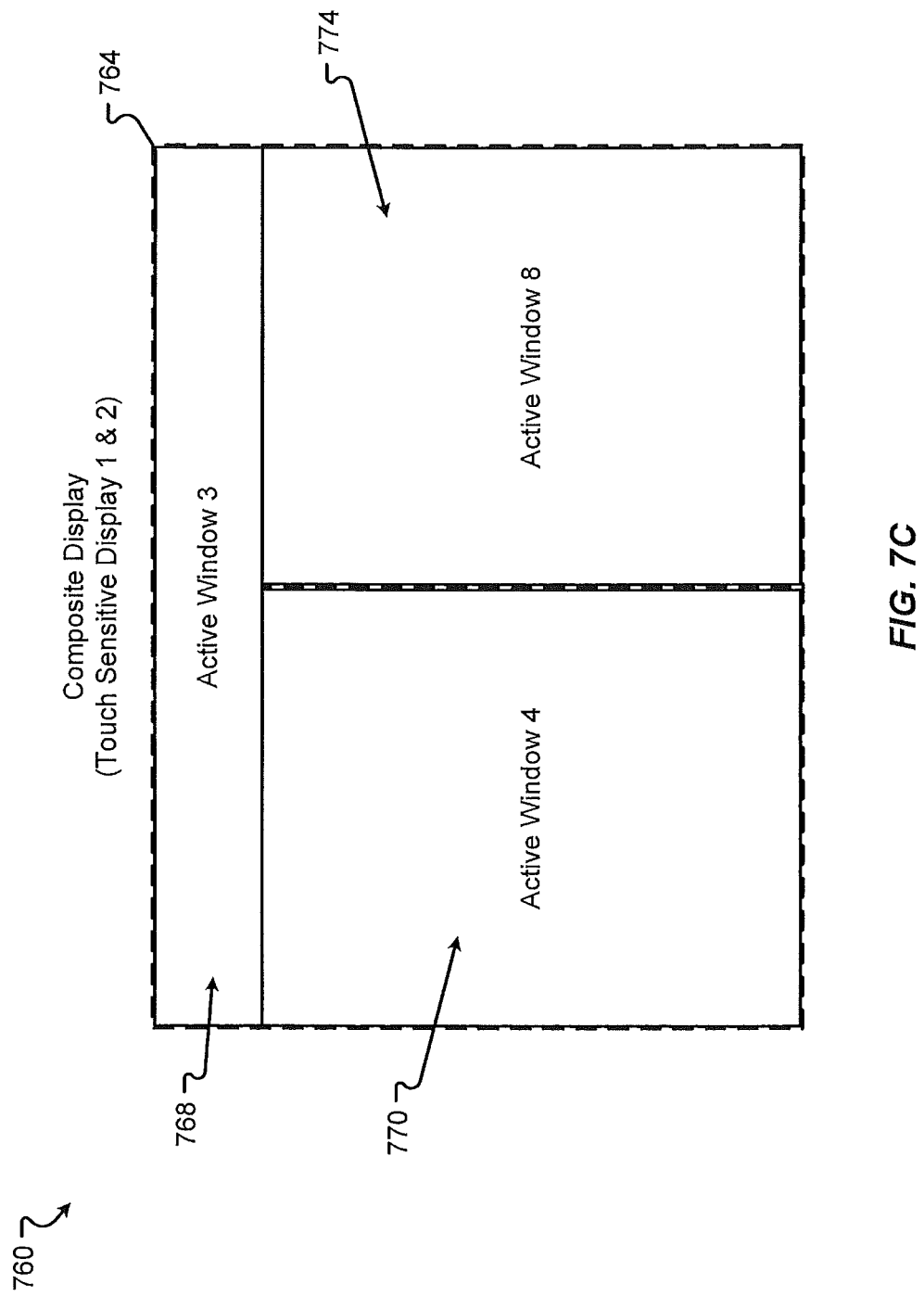
FIG. 7C is another representation of an embodiment of a logical window stack.

Yet another arrangement of a window stack 760 is shown in FIGS. 7C through 7E. The window stack 760 is shown in three "elevation" views. In FIG. 7C, the top of the window stack 760 is shown. Two sides of the window stack 760 are shown in FIGS. 7D and 7E. In this embodiment, the window stack 760 resembles a stack of bricks. The windows are stacked on each other. Looking from the top of the window stack 760 in FIG. 7C, only the top most windows in the window stack 760 are seen in different portions of the composite display 764. The composite display 764 represents a logical model for the entire display area of the device 100, which can include touch sensitive display 110 and touch sensitive display 114. A desktop 786 or a window can occupy part or all of the composite display 764.

In the embodiment shown, the desktop 786 is the lowest display or "brick" in the window stack 760. Thereupon, window 1 782, window 2 782, window 3 768, and window 4 770 are layered. Window 1 782, window 3 768, window 2 782, and window 4 770 only occupy a portion of the composite display 764. Thus, another part of the stack 760 includes window 8 774 and windows 5 through 7 shown in section 790. Only the top window in any portion of the composite display 764 is actually rendered and displayed. Thus, as shown in the top view in FIG. 7C, window 4 770, window 8 774, and window 3 768 are displayed as being at the top of the display in different portions of the window stack 760. A window can be dimensioned to occupy only a portion of the composite display 760 to "reveal" windows lower in the window stack 760. For example, window 3 768 is lower in the stack than both window 4 770 and window 8 774 but is still displayed. A logical data structure to manage the window stack can be as described in conjunction with FIG. 8.

When a new window is opened, the newly activated window is generally positioned at the top of the stack. However, where and how the window is positioned within the stack can be a function of the orientation of the device 100, the context of what programs, functions, software, etc. are being executed on the device 100, how the stack is positioned when the new window is opened, etc. To insert the window in the stack, the position in the stack for the window is determined and the touch sensitive display 110, 114 to which the window is associated may also be determined. With this information, a logical data structure for the window can be created and stored. When user interface or other events or tasks change the arrangement of windows, the window stack(s) can be changed to reflect the change in arrangement. It should be noted that these same concepts described above can be used to manage the one or more desktops for the device 100.

Figure 8:
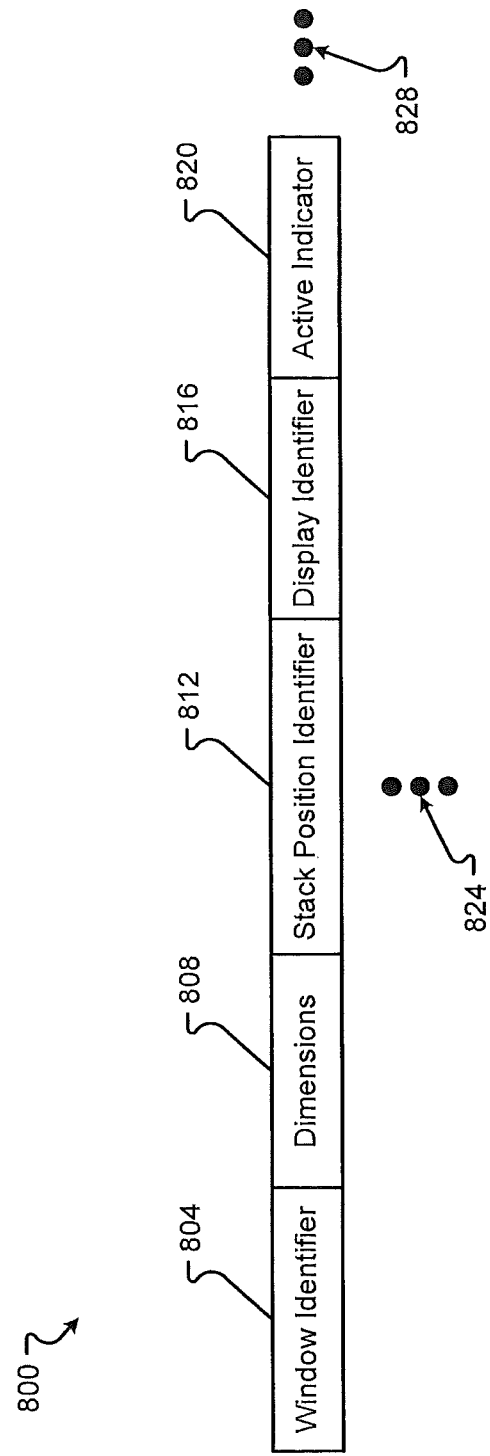
FIG. 8 is block diagram of an embodiment of a logical data structure for a window stack.

A logical data structure 800 for managing the arrangement of windows or desktops in a window stack is shown in FIG. 8. The logical data structure 800 can be any data structure used to store data whether an object, record, file, etc. The logical data structure 800 can be stored in any type of database or data storage system, regardless of protocol or standard. In embodiments, the logical data structure 800 includes one or more portions, fields, attributes, etc. that store data in a logical arrangement that allows for easy storage and retrieval of the information. Hereinafter, these one or more portions, fields, attributes, etc. shall be described simply as fields. The fields can store data for a window identifier 804, dimensions 808, a stack position identifier 812, a display identifier 816, and/or an active indicator 820. Each window in a window stack can have an associated logical data structure 800. While only a single logical data structure 800 is shown in FIG. 8, there may be more or fewer logical data structures 800 used with a window stack (based on the number of windows or desktops in the stack), as represented by ellipses 824. Further, there may be more or fewer fields than those shown in FIG. 8, as represented by ellipses 828.

A window identifier 804 can include any identifier (ID) that uniquely identifies the associated window in relation to other windows in the window stack. The window identifier 804 can be a globally unique identifier (GUID), a numeric ID, an alphanumeric ID, or other type of identifier. In embodiments, the window identifier 804 can be one, two, or any number of digits based on the number of windows that can be opened. In alternative embodiments, the size of the window identifier 804 may change based on the number of windows opened. While the window is open, the window identifier 804 may be static and remain unchanged.

Dimensions 808 can include dimensions for a window in the composite display 760. For example, the dimensions 808 can include coordinates for two or more corners of the window or may include one coordinate and dimensions for the width and height of the window. These dimensions 808 can delineate what portion of the composite display 760 the window may occupy, which may be the entire composite display 760 or only part of composite display 760. For example, window 4 770 may have dimensions 880 that indicate that the window 770 will occupy only part of the display area for composite display 760, as shown in FIGS. 7c through 7E. As windows are moved or inserted in the window stack, the dimensions 808 may change.

A stack position identifier 812 can be any identifier that can identify the position in the stack for the window or may be inferred from the window's control record within a data structure, such as a list or a stack. The stack position identifier 812 can be a GUID, a numeric ID, an alphanumeric ID, or other type of identifier. Each window or desktop can include a stack position identifier 812. For example, as shown in FIG. 7A, window 1 704 in stack 1 760 can have a stack position identifier 812 of 1 identifying that window 704 is the first window in the stack 760 and the active window. Similarly, window 6 724 can have a stack position identifier 812 of 3 representing that window 724 is the third window in the stack 760. Window 2 708 can also have a stack position identifier 812 of 1 representing that window 708 is the first window in the second stack 764. As shown in FIG. 7B, window 1 744 can have a stack position identifier 812 of 1, window 3, rendered in portions 732 and 736, can have a stack position identifier 812 of 3, and window 6 756 can have a stack position identifier 812 of 6. Thus, depending on the type of stack, the stack position identifier 812 can represent a window's location in the stack.

A display identifier 816 can identify that the window or desktop is associated with a particular display, such as the first display 110 or the second display 114, or the composite display 760 composed of both displays. While this display identifier 816 may not be needed for a multi-stack system, as shown in FIG. 7A, the display identifier 816 can indicate whether a window in the serial stack of FIG. 7B is displayed on a particular display. Thus, window 3 may have two portions 732 and 736 in FIG. 7B. The first portion 732 may have a display identifier 816 for the first display while the second portion 736 may have a display identifier 816 for the second display 114. However, in alternative embodiments, the window may have two display identifier 816 that represent that the window is displayed on both of the displays 110, 114, or a display identifier 816 identifying the composite display. In another alternate embodiment, the window may have a single display identifier 816 to represent that the window is displayed on both of the displays 110, 114.

Similar to the display identifier 816, an active indicator 820 may not be needed with the dual stack system of FIG. 7A, as the window in stack position 1 is active and displayed. In the system of FIG. 7B, the active indicator 820 can indicate which window(s) in the stack is being displayed. Thus, window 3 may have two portions 732 and 736 in FIG. 7. The first portion 732 may have an active indicator 820 while the second portion 736 may also have an active indicator 820. However, in alternative embodiments, window 3 may have a single active indicator 820. The active indicator 820 can be a simple flag or bit that represents that the window is active or displayed.

Figure 9:
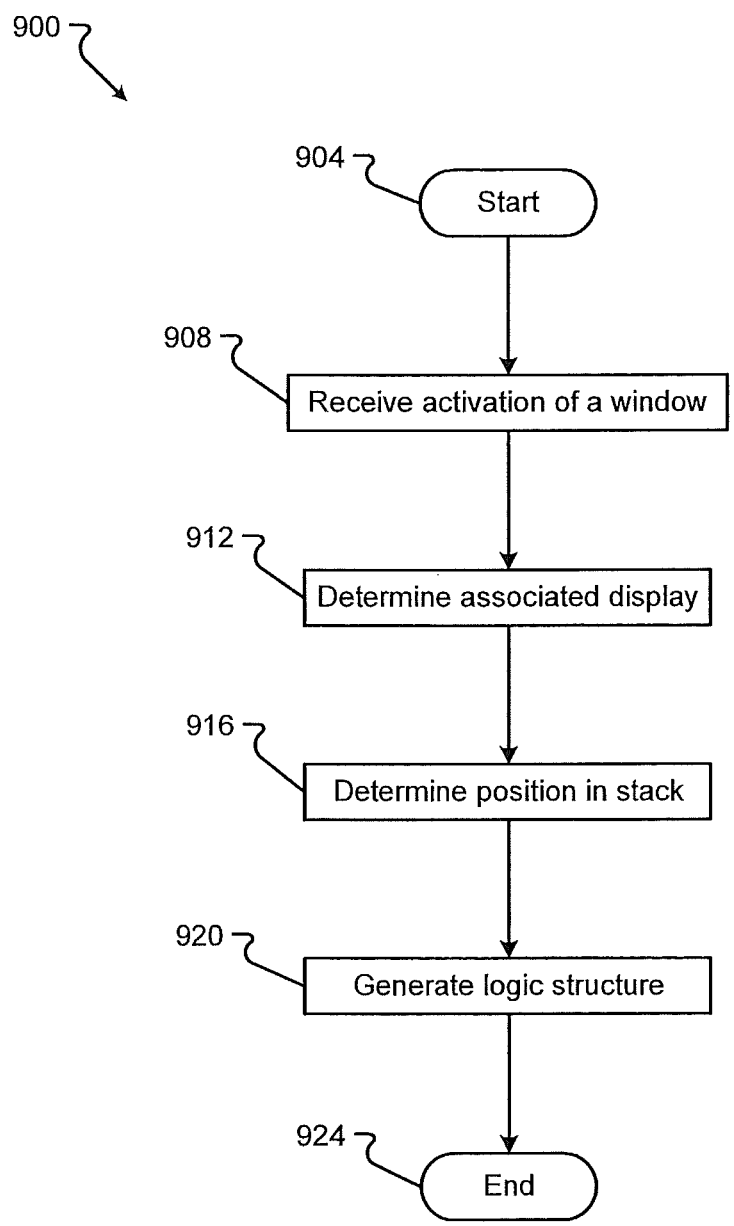
FIG. 9 is a flow chart of an embodiment of a method for creating a window stack.

An embodiment of a method 900 for creating a window stack is shown in FIG. 9. While a general order for the steps of the method 900 is shown in FIG. 9. Generally, the method 900 starts with a start operation 904 and ends with an end operation 928. The method 900 can include more or fewer steps or can arrange the order of the steps differently than those shown in FIG. 9. The method 900 can be executed as a set of computer-executable instructions executed by a computer system and encoded or stored on a computer readable medium. Hereinafter, the method 900 shall be explained with reference to the systems, components, modules, software, data structures, user interfaces, etc. described in conjunction with FIGS. 1-8.

A multi-screen device 100 can receive activation of a window, in step 908. In embodiments, the multi-screen device 100 can receive activation of a window by receiving an input from the touch sensitive display 110 or 114, the configurable area 112 or 116, a gesture capture region 120 or 124, or some other hardware sensor operable to receive user interface inputs. The processor may execute the Task Management Module 540 may receive the input. The Task Management Module 540 can interpret the input as requesting an application task to be executed that will open a window in the window stack.

In embodiments, the Task Management Module 540 places the user interface interaction in the task stack 552 to be acted upon by the Display Configuration Module 568 of the Multi-Display Management Module 524. Further, the Task Management Module 540 waits for information from the Multi-Display Management Module 524 to send instructions to the Window Management Module 532 to create the window in the window stack.

The Multi-Display Management Module 524, upon receiving instruction from the Task Management Module 540, determines to which touch portion of the composite display 760, the newly activated window should be associated, in step 912. For example, window 4 770 is associated with the a portion of the composite display 764 In embodiments, the device state module 574 of the Multi-Display Management Module 524 may determine how the device is oriented or in what state the device is in, e.g., open, closed, portrait, etc. Further, the preferences module 572 and/or requirements module 580 may determine how the window is to be displayed. The gesture module 576 may determine the user's intentions about how the window is to be opened based on the type of gesture and the location of where the gesture is made.

The Display Configuration Module 568 may use the input from these modules and evaluate the current window stack 760 to determine the best place and the best dimensions, based on a visibility algorithm, to open the window. Thus, the Display Configuration Module 568 determines the best place to put the window at the top of the window stack 760, in step 916. The visibility algorithm, in embodiments, determines for all portions of the composite display, which windows are at the top of the stack. For example, the visibility algorithm determines that window 3 768, window 4 770, and window 8 774 are at the top of the stack 760 as viewed in FIGS. 7C through 7E. Upon determining where to open the window, the Display Configuration Module 568 can assign a display identifier 816 and possibly dimensions 808 to the window. The display identifier 816 and dimensions 808 can then be sent back to the Task Management Module 540. The Task Management Module 540 may then assign the window a stack position identifier 812 indicating the windows position at the top of the window stack.

In embodiments, the Task Management Module 540 sends the window stack information and instructions to render the window to the Window Management Module 532. The Window Management Module 532 and the Task Management Module 540 can create the logical data structure 800, in step 924. Both the Task Management Module 540 and the Window Management Module 532 may create and manage copies of the window stack. These copies of the window stack can be synchronized or kept similar through communications between the Window Management Module 532 and the Task Management Module 540. Thus, the Window Management Module 532 and the Task Management Module 540, based on the information determined by the Multi-Display Management Module 524, can assign dimensions 808, a stack position identifier 812 (e.g., window 1 782, window 4 770, etc.), a display identifier 816 (e.g., touch sensitive display 1 110, touch sensitive display 2 114, composite display identifier, etc,) and an active indicator 820, which is generally always set when the window is at the "top" of the stack. The logical data structure 800 may then be stored by both the Window Management Module 532 and the Task Management Module 540. Further, the Window Management Module 532 and the Task Management Module 540 may thereinafter manage the window stack and the logical data structure(s) 800.

Demand for portable electronic devices with high levels of functionality continues to rise and personal electronic devices continue to become increasingly more portable. While computer power, battery life, screen size and overall functionality of portable phones and smart phones continues to increase, user reliance on these devices increases. Many users of such devices rely heavily on such devices for general communication, accessing the internet, cloud computing, and accessing various locally stored information such as contact information, files, music, pictures and the like. It is often desirable therefore to connect such heavily relied on devices to an additional computing device or display, such as a monitor or tablet device, such as a SmartPad (SP) 1000 (see FIG. 10).

Accordingly, it is desirable for the device 100 to be able to interface with an additional device, such as the SmartPad 1000, that enables functionality similar to, for example, both a tablet computer system and smart phone. Furthermore, a need exists for the above-described device to allow for various pre-existing features of both devices, such as sending and receiving phone calls and further allowing for the accessibility of applications running on the device 100. A need also exists for the above device 100 to provide the benefits of both a tablet computer system and cellular phone in one integrative device by allowing for common operations and functionality without compromising the form factor of the device.

One exemplary embodiment is directed toward a selectively removable device and smartpad system. The smartpad system is discussed in greater detail hereinafter, and can have various features for complementing the communications device, such as a smart phone or device 100. For example, the smartpad may supplement the device 100 by providing increased screen size, increased processor size, increased battery or power supply, or the like. Similarly, the device 100 may compliment the SP 1000 by providing connectivity through one or more wireless networks, access to various stored information, and the like. It will expressly recognized therefore that two or more devices of the present invention may be provided in a connected or docked and generally symbiotic relationship. It will further be recognized that the devices provide various features, benefits and functionality in their independent state(s).

In accordance with one exemplary embodiment, the device 100 is capable of being received by the SP 1000 through a recessed feature of the SP 1000 having corresponding dimensions to the device 100. In one exemplary embodiment, the SP 1000 is provided and preferably sized for receiving a predetermined device 100. In alternative embodiments, however, it is contemplated that the SP 1000 is provided, the smartpad capable of receiving a plurality of communications devices of different sizes. In such embodiments, the SP 1000 may receive communications devices of various sizes by, for example, the inclusion of additional elements, such as spacers and various adjustable features.

In accordance with one exemplary embodiment, the device 100 and SP 1000 have a docking relationship that is established when the device 100 is connected to the SP 1000 during various modes of operation. For example, in one embodiment, a system is provided comprising the SP 1000 and the device 100, the SP 1000 capable of physically receiving the device 100, wherein the device 100 is operable as the primary computing device. In such an embodiment, the SP 1000 may, for example, simply provide enhanced audio and visual features for the device 100 that comprises its own CPU, memory, and the like. It is further contemplated that the system can be placed in a mode of operation wherein the device 100 docked to the SP 1000 provide it in a more passive mode where, for example, the device 100 draws power from the SP 1000 such as to recharge a battery of the device 100.

In accordance with another exemplary embodiment, the device 100 and SP 1000 are provided wherein the device 100 is received or docked with the SP 1000 and wherein a substantial area of the device 100 is positioned within one or more compartments of the SP 1000. For example, where as various known devices comprise docking features which require or result in the docked item to be generally exposed, thereby substantially altering the external dimensions of the host device and/or creating a potential for damaging one or both devices upon impact, an exemplary embodiment contemplates the SP 1000 which receives the device 100 in a manner such that the external dimensions of the SP 1000 are not substantially altered when the devices are connected. In such an arrangement, the device 100 and associated connection means are generally protected and the SP 1000 is allowed to substantially maintain its original shape. In accordance with one exemplary embodiment, the SP 1000 is capable of receiving and/or docking the device 100 wherein the device 100 is received in lockable association with the SP 1000. As used herein, the term "lockable" is not intended to designate or limit it to any particular arrangement. Rather, lockable is intended to refer to various embodiments as described herein and will be recognized by one of ordinary skill in the art. In one embodiment, the device 100 is connectable to the SP 1000 wherein the SP 1000 comprises extension springs for first electively securing the device 100 in a docked manner and an ejection feature for releasing the device 100 from the SP 1000. Moreover, as will be described in greater detail below, it should be appreciated that the device 100 and SP 1000 can communicate using wired and/or wireless technology(ies) with equal success. Moreover, and in accordance with another exemplary embodiment, the hinged device 100 is selectively connectable to the SP 1000 wherein the device 100 is received by the SP 1000 in an open position and where in one or more preexisting ports of the SP 1000 correspond with internal receiving features of the SP 1000, such that the device 100 and the SP 1000 may be operated simultaneously in various modes of use.

In accordance with some exemplary embodiments, the SP 1000 is provided with an eject or release button to facilitate the removal of a stored or docked device 100.

Figure 10:
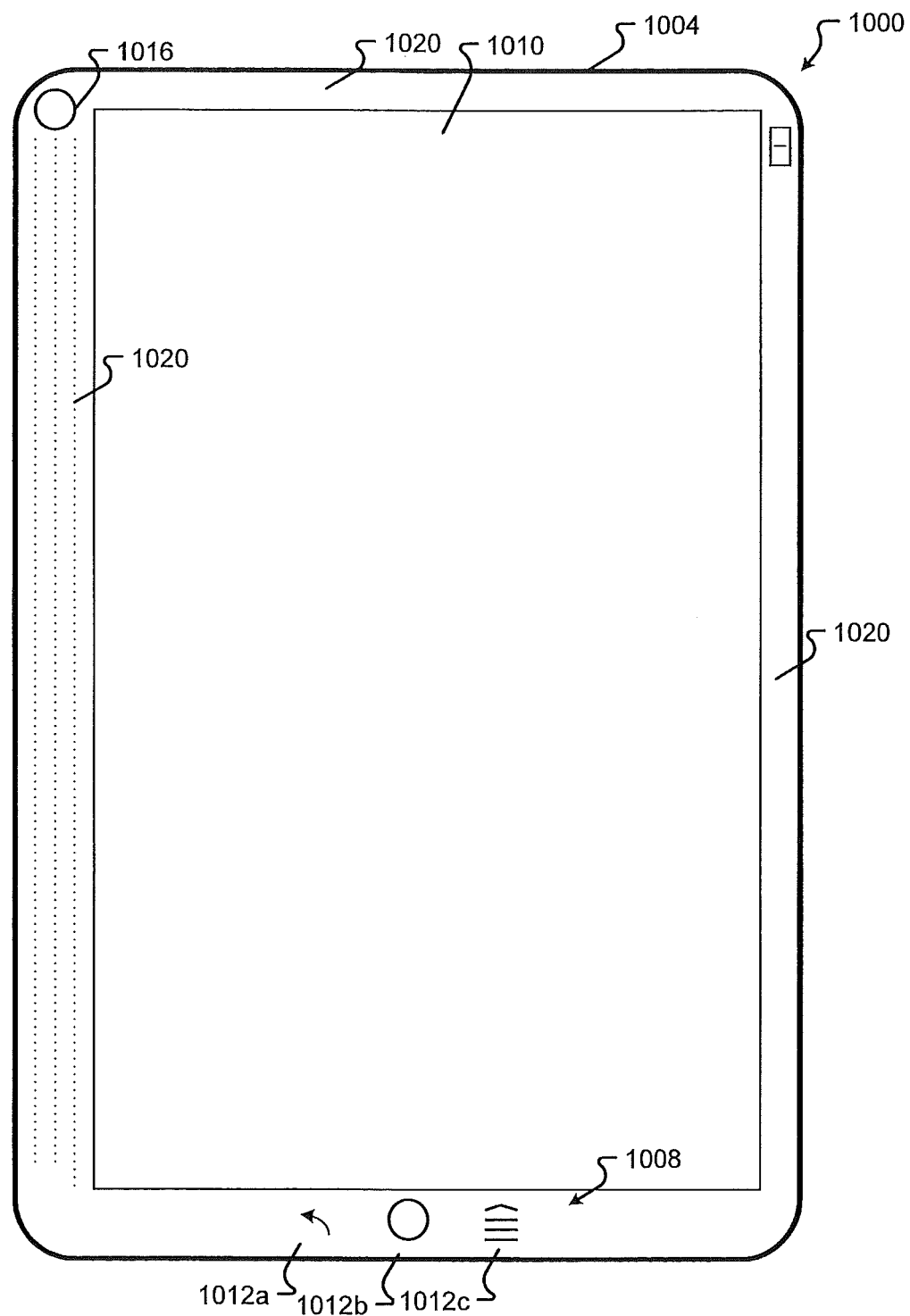
FIG. 10 illustrates an exemplary smartpad (SP)

FIG. 10 illustrates an exemplary SmartPad (SP) 1000 according to an exemplary embodiment. The exemplary SmartPad at least provides a larger touch sensitive display operatively coupleable to device 100.

While the following description uses the term "smart" in conjunction with the display device 1000, it is to be appreciated that this term does not necessarily connote that there is intelligence in the SmartPad. Rather, it is to be appreciated that there can be "intelligence," including one or more of a processor(s), memory, storage, display drivers, etc., in the SmartPad, and/or one or more of these elements shared with the device 100 via, for example, one or more of a port, bus, connection, or the like. In general, any one or more of the functions of the device 100 is extendable to the SmartPad 700 and vice versa.

The exemplary SmartPad 700 includes a screen 1004, a SP touch sensitive display 1010, a SP configurable area 1008, a SP gesture capture region(s) 1012 and a SP camera 1016. The SP 1000 also includes a port (not visible in this orientation) adapted to receive the device 100 as illustrated at least in FIG. 11.

The device 100 docks with the SmartPad 1000 via the port on the SP 1000 and the corresponding port 136 on device 100. As discussed, port 136 in some embodiments is an input/output port (I/O port) that allows the device 100 to be connected to other peripheral devices, such as a display, keyboard, printing device and/or SP 1000. In accordance with one exemplary embodiment, the docking is accomplished by the device 100 sliding into the left-hand side of the SP 1000, with the device 100 being in an open state and the device 100 engaging a port in the SP 1000 corresponding to port 136. In accordance with one exemplary embodiment, the device 100 engages a doored cassette-like slot in the SP 1000 into which the device 100 slides. (See for example FIG. 13) It should be appreciated however that there may be other configurations for physically and electrically engaging the two devices—in general, the manner of engagement is not important provided the device 100 and SP 1000 are in electrical communication with one another.

The SP 1000 includes a screen 1004. In some embodiments, the entire front surface of the SP 1000 may be touch sensitive and capable of receiving input by a user touching the front surface of the screen 1004. The screen 1004 includes touch sensitive display 1010, which, in addition to being touch sensitive, is also capable of displaying information to a user.

The screen 1004 also includes a configurable area 1008 that has been configured for specific inputs when the user touches portions of the configurable area 1008. Area 1012a is configured to receive a "back" input indicating that a user would like to view information previously displayed. Area 1012b is configured to receive a "menu" input indicating that the user would like to view options from a menu. Area 1012c is configured to receive a "home" input indicating that the user would like to view information associated with a "home" view.

In other embodiments, areas 1012a-c may be configured, in addition to the configurations described above, for other types of specific inputs including controlling features of device 100 and/or device 1000, some non-limiting examples including adjusting overall system power, adjusting the volume, adjusting the brightness, adjusting the vibration, selecting of displayed items on screen 1004, operating the SP camera 1016, operating a microphone, and initiating/terminating of telephone calls. Also, in some embodiments, areas 1012a-c may be configured for specific inputs depending upon the application running on device 100/SP 1000 and/or information displayed on the touch sensitive displays 1010.

In addition to touch sensing, screen 1004 may also include areas that receive input from a user without requiring the user to touch the display area of the screen. For example, screen 1004 can include gesture capture area 1012. These areas are able to receive input by recognizing gestures made by a user without the need for the user to actually touch the surface of the display area. In comparison to touch sensitive display 1010 and 1014, the gesture capture area 1012 may not be capable of rendering a displayed image.

While not illustrated, there may also be a number of hardware components within SP 1000. As illustrated in FIG. 10, SP 1000 can include a speaker, a microphone and one or more cameras 1016. Upon docking the device 100 in the SP 1000, the corresponding device(s) (e.g., the speaker) in the device 100 could be disabled in favor of the speaker in the SP 1000. Similarly, other components, such as the screen 1004, microphone, speaker, etc, could be disabled on the device 100 in favor of the SP 1000.

In general, the touch sensitive display 1010 may comprise a full color, touch sensitive display. A second area within each touch sensitive screen 1004 may comprise the SP gesture capture region 1012. The SP gesture capture region 1012 may comprise an area or region that is outside of the SP touch sensitive display 1010 area that is capable of receiving input, for example in the form of gestures provided by a user. However, the SP gesture capture region 1012 does not necessarily include pixels that can perform a display function or capability.

A third region of the SP touch sensitive screen 1004 may comprise the configurable area 1012. The configurable area 1012 is capable of receiving input and has display or limited display capabilities. In embodiments, the configurable area 1012 may present different input options to the user. For example, the configurable area 1012 may display buttons or other relatable items. Moreover, the identity of displayed buttons, or whether any buttons are displayed at all within the configurable area 1012 of the SP touch sensitive screen 1004 may be determined from the context in which the device 1000 is used and/or operated. In an exemplary embodiment, the touch sensitive screen 1004 comprise liquid crystal display devices extending across at least those regions of the touch sensitive screen 1004 that is capable of providing visual output to a user, and a capacitive input matrix over those regions of the touch sensitive screen 1004 that is capable of receiving input from the user.

As discussed above with reference to FIGS. 4A through 4H, the various graphical representations of gesture inputs that may be recognized by the screens 104, 108 are also recognizable by screen 1004. As discussed, the gestures may be performed not only by a user's body part, such as a digit, but also by other devices, such as a stylus, that may be sensed by the contact sensing portion(s) of a screen 1004. In general, gestures are interpreted differently, based on where the gestures are performed (either directly on the display 1004 or in the gesture capture region 1020). For example, gestures in the display 1010 may be directed to a desktop or application, and gestures in the gesture capture region 1020 may be interpreted as for the system.

In addition to the above, the SP touch sensitive screen 1004 may also have an area that assists a user with identifying which portion of the screen is in focus. This could be a bar of light or in general and indicator that identifies which one or more portions of the SP touch sensitive screen 1004 are in focus. (See for example, FIG. 29)

One or more display controllers (such as display controllers 216a, 216b and/or dedicated display controller(s) on the SP 1000) may be provided for controlling the operation of the touch sensitive screen 1004 including input (touch sensing) and output (display) functions.

In accordance with one exemplary embodiment, a separate touch screen controller is provided for the SP 1000 in addition to each of the controllers for the touch screens 104 and 108. In accordance with alternate embodiments, a common or shared touch screen controller may be used to control any one or more of the touch sensitive screens 104 and 108, and/or 1004. In accordance with still other embodiments, the functions of the touch screen controllers may be incorporated into other components, such as a processor and memory or dedicated graphics chip(s).

In a similar manner, the SP 1000 may include a processor complementary to the processor 204, either of which may comprise a general purpose programmable processor or controller for executing application programming or instructions. In accordance with at least some embodiments, the processors may include multiple processor cores, and/or implement multiple virtual processors. In accordance with still other embodiments, the processors may include multiple physical processors. As a particular example, the processors may comprise a specially configured application specific integrated circuit (ASIC) or other integrated circuit, a digital signal processor, a controller, a hardwired electronic or logic circuit, a programmable logic device or gate array, a special purpose computer, or the like. The processors generally function to run programming code or instructions implementing various functions of the device 100 and/or SP 1000.

The SP 1000 can also optionally be equipped with an audio input/output interface/device(s) (not shown) to provide analog audio to an interconnected speaker or other device, and to receive analog audio input from a connected microphone or other device. As an example, the audio input/output interface/device(s) 256 may comprise an associated amplifier and analog to digital converter usable with SP 1000. Alternatively or in addition, the device 100 can include an integrated audio input/output device 256 and/or an audio jack for interconnecting an external speaker or microphone via SP 1000. For example, an integrated speaker and an integrated microphone can be provided, to support near talk or speaker phone operations.

Hardware buttons (not shown) but similar to hardware buttons 158 can be included for example for use in connection with certain control operations. Examples include a master power switch, volume control, etc., as described in conjunction with FIGS. 1A through 1J. One or more image capture interfaces/devices 1016, such as a camera, can be included for capturing still and/or video images. Alternatively or in addition, an image capture interface/device 1016 can include a scanner or code reader. An image capture interface/device 1016 can include or be associated with additional elements, such as a flash or other light sources.

Communications between various components of the device 100 and SP 1000 can be carried by one or more buses and/or communications channels. In addition, power can be supplied to one or more of the components of the device 100 and Sp 1000 from a power source and/or power control module 260. The power control module 260 and/or device 100 and/or SP 1000 can, for example, include a battery, an AC to DC converter, power control logic, and/or ports for interconnecting the device 100/1000 to an external source of power.

The middleware 520 may also be any software or data that allows the multiple processes running on the devices to interact. In embodiments, at least portions of the middleware 520 and the discrete components described herein may be considered part of the OS 516 or an application 564. However, these portions will be described as part of the middleware 520, but those components are not so limited. The middleware 520 can include, but is not limited to, a Multi-Display Management (MDM) class 524, a Surface Cache class 528, a Window Management class 532, an Activity Management class 536, an Application Management class 540, a display control block, one or more frame buffers 548, an activity stack 552, and/or an event buffer 556—all of the functionality thereof extendable to the SP 1000. A class can be any group of two or more modules that have related functionality or are associated in a software hierarchy.

The MDM class 524 also includes one or more modules that are operable to manage the display of applications or other data on the screen of the SP 1000. An embodiment of the MDM class 524 is described in conjunction with FIG. 5B. In embodiments, the MDM class 524 receives inputs from the OS 516, the drivers 512 and the applications 564. The inputs assist the MDM class 524 in determining how to display the information required by the user. Once a determination for display configurations is determined, the MDM class 524 can bind the applications 564 to a display configuration. The configuration may then be provided to one or more other components to generate the display on the SP 1000.

Figure 11:
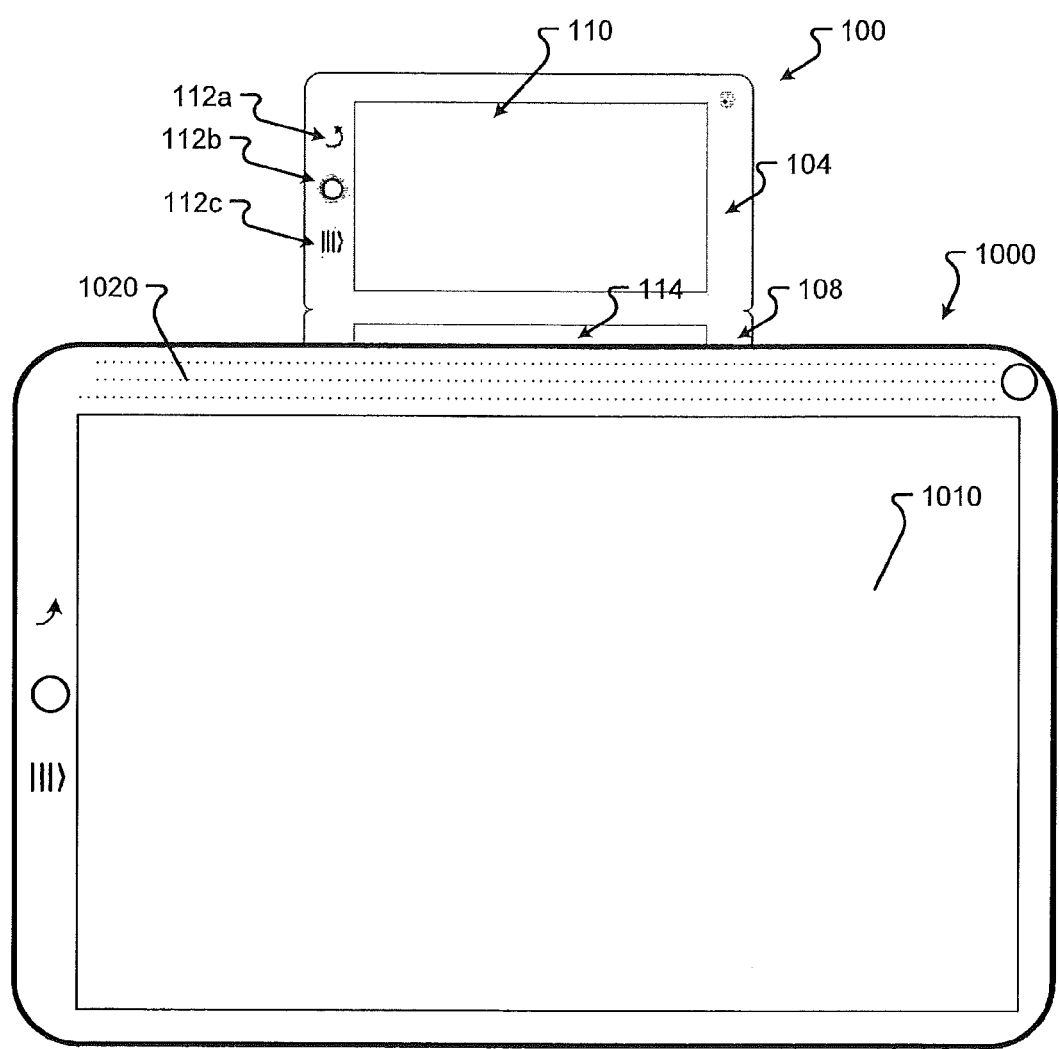
FIG. 11 illustrates an exemplary method of associating the smartpad with the device.

FIG. 11 illustrates an exemplary embodiment showing the device 100 docking with the SP 1000. More specifically, the device 100 is being inserted into a slot (not shown) on the SP

Figure 12:
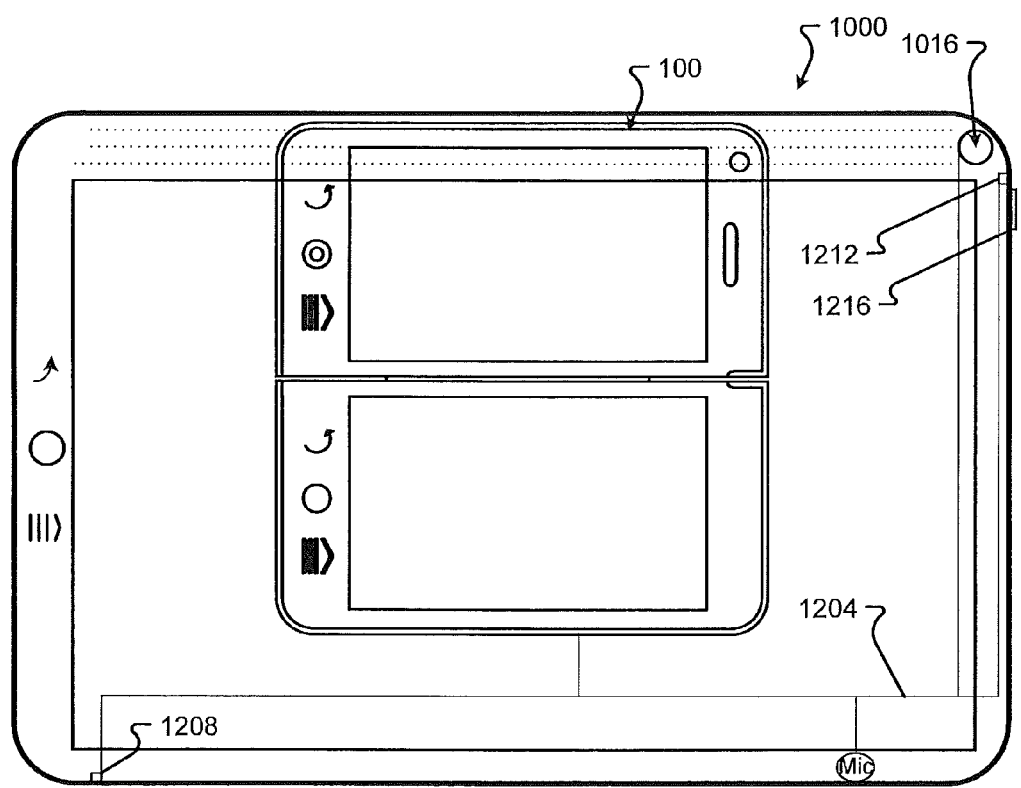
FIG. 12 illustrates a docked device with the smartpad.

1000. On completion of the inserting of device 100 into SP 1000 (See FIG. 12), device 100 communicates with the SP 1000 via a bus or other wired or wireless electrical means 1204. The device 100 is also connected with, for example, the camera/video camera 1016, microphone (Mic), and power port 1208.

In conjunction with the docking of device 100 with SP 1000, one or more of the devices can begin power management. For example, one or more of the device 100 and SP 1000 can include power supplies, such as batteries, solar, or in general any electrical supply, any one or more of which being usable to supply one or more of the device 100 and SP 1000. Furthermore, through the use of, for example, an AC power adaptor connected to port 1208, the SP 1000 can supply power to device 100, such as to charge device 100. It will be appreciated that the power management functionality described herein can be distributed between one or more of the device 100 and SP 1000, with power being sharable between the two devices.

In addition to power management functions, upon the device 100 being docked with the SP 1000, the displays on device 100 can be turned off to, for example, save power. Furthermore, electrical connections are established between the device 100 and SP 1000 such that the speaker, microphone, display, input capture region(s), inputs, and the like, received by SP 1000 are transferrable to device 100. Moreover, the display on device 1000 is enabled such that information that would have been displayed on one or more of the touch sensitive displays 110 and 114 is displayed on touch sensitive display 1010. As will be discussed in greater detail herein, the SP 1000 can emulate the dual display configuration of the device 100 on the single display 1010.

The SP 1000 can optionally be equipped with the headphone jack 1212 and power button 1216. Moreover, any hardware buttons or user input buttons on the device 100 could be extended to and replicated on the SP 1000.

This dock event between the device 100 and SP 1000 can be seen as states 336 or 344 in FIG. 3A. As will be appreciated, and in accordance with one of the illustrative embodiments herein, the device 100 is docked with SP 1000 with the device being in the open state 210. However, it is to be appreciated that the device 100 can be docked with the SP 1000 in the closed state 304, or docked via, for example, a cable without the device 100 necessarily being inserted into the SP 1000.

Figure 13A:
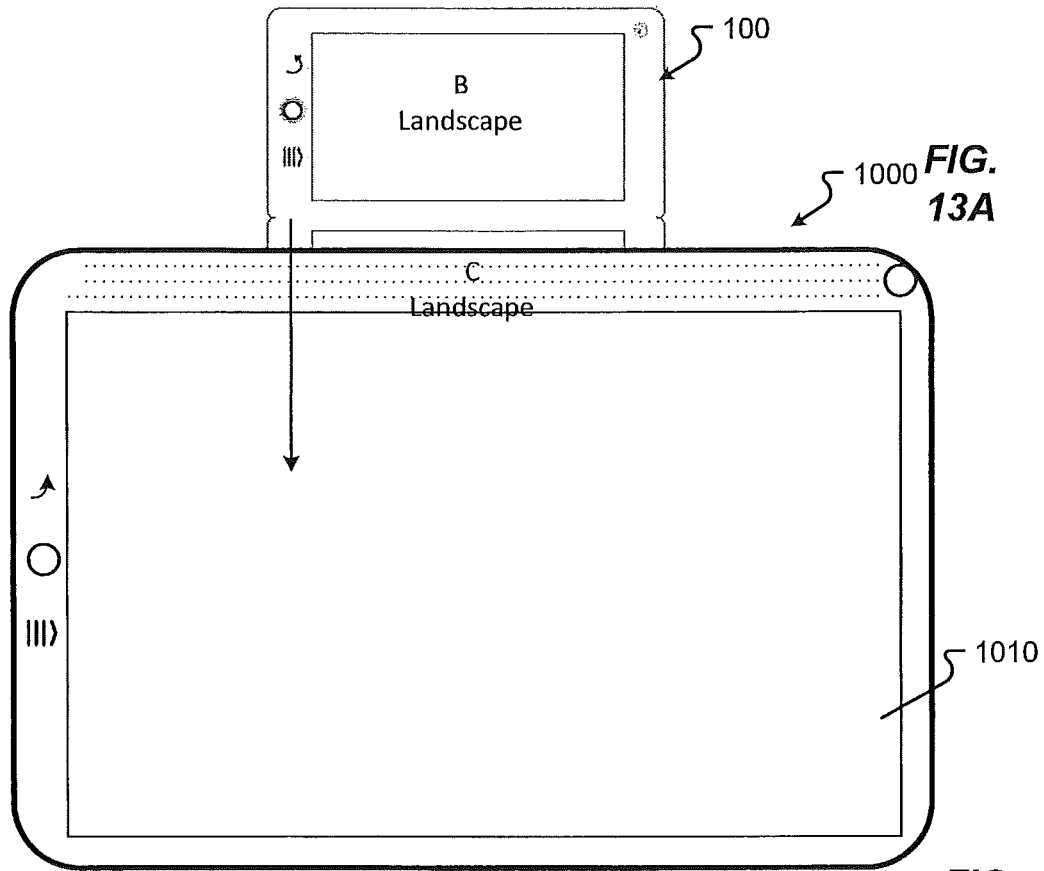
FIGS. 13A-13B illustrate an exemplary method for screen orientation.
Figure 13B:
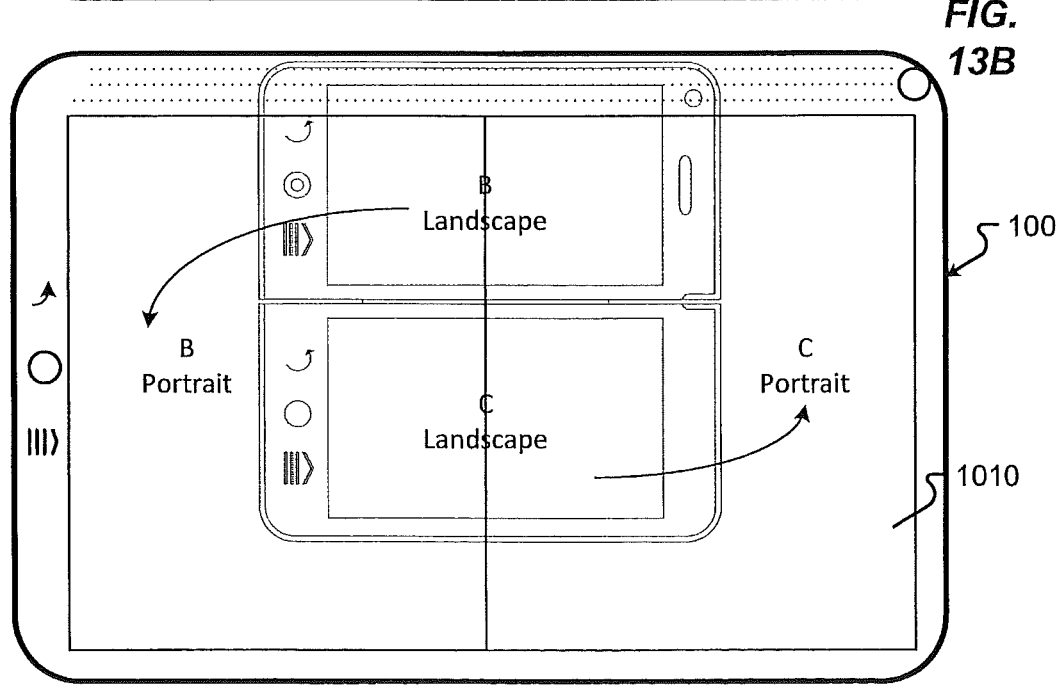

FIGS. 13A-B illustrate application reorientation according to an exemplary embodiment of the invention. In particular, FIG. 13A illustrates the device 100 being inserted into the SP 1000. Before being associated with the SP 1000, the device 100 has two applications, both in the landscape mode, represented by application "B" in landscape on a first screen and application "C" in landscape on a second screen (partially obscured by SP 1000).

FIG. 13B illustrates the re-orientation of the windows for the two applications based on the device 100 being associated with the SP 1000, the SP 1000 being in the landscape orientation. In accordance with this exemplary embodiment, application "B" on the device 100 is re-oriented to be in the portrait orientation on the SP 1000, and in a similar manner, application "C" on the device 100 is reoriented to the portrait orientation on the right-hand side the touch sensitive display 1010. As will be appreciated, the reorientation of the application(s) from the device 100 to the SP 1000 can occur in a similar manner for a single application running on the device 100. For example, if there is only one application running on device 100, and the application is running in landscape mode, when the device 100 is docked with the SP 1000, the orientation of the application is reoriented to be appropriate for the current orientation of the SP 1000. For example, if the application on the device 100 is in portrait mode, and the SP 1000 is in landscape mode, the application is reoriented from portrait mode on the device 100 to landscape mode on the SP 1000. In a similar manner, if the application on the device is in landscape mode, and upon being docked to the SP 1000 in portrait mode, the application is reoriented into portrait mode for appropriate viewing on the SP 1000.

In accordance with one exemplary embodiment, the accelerometer 176 on device 100 is used to determine the orientation of both the device 100 and SP 1000, and consequently the orientation of the touch screen display 1010. Therefore, the accelerometer(s) 176 outputs a signal that is used in connection with the display of information to control the orientation and/or format in which information is to be displayed to the user on display 1010. As is to be appreciated, reorientation can include one or more of a portrait to landscape conversion, a landscape to portrait conversion, a resizing, a re-proportioning and/or a redrawing of the window(s) associated with the application(s).

On reorienting of the running application(s), the application(s) is displayed on display 1010 on SP 1000.

In accordance with an optional exemplary embodiment, priority can be given to the application that is in focus. For example, and using again applications "B" and "C" as illustrated in FIG. 13B, if instead application C was in focus before docking, application C could be reoriented and displayed on the left-hand portion of display 1010, and application B, which was not in focus before docking, displayed on the right-hand portion of display 1010 upon docking In accordance with another optional embodiment, the application in focus could be displayed in full-screen mode on display 1010 with the application(s) not in focus placed into a window stack that is, for example, in a carousel-type arrangement as discussed hereinafter.

Figure 14:
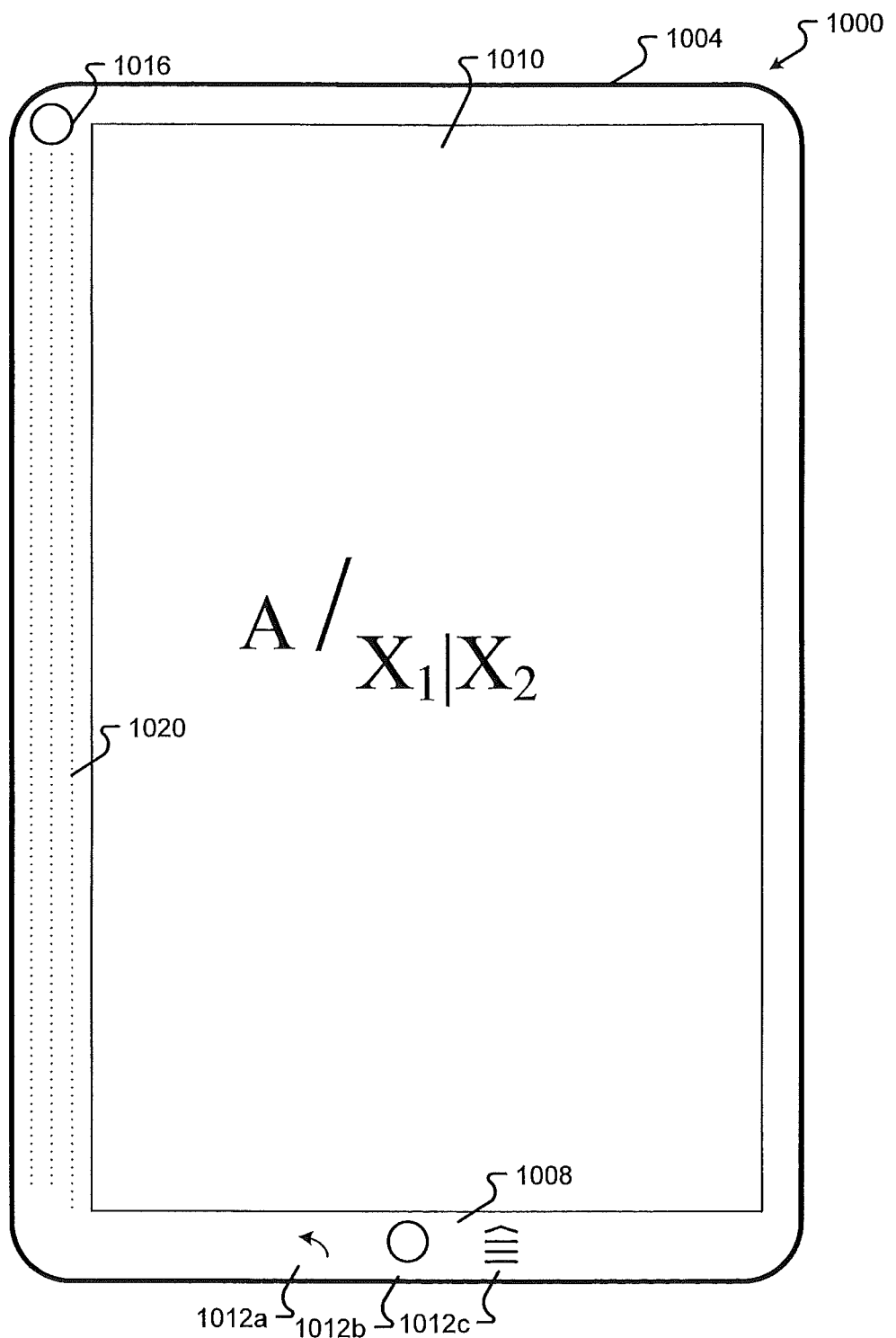
FIG. 14 illustrates a method for displaying an application when the SP is in a landscape mode.

FIG. 14 illustrates an exemplary embodiment of a single application mode for the SP 1000. In the single application mode, all applications are launched and displayed in full screen. The single application mode can be indicated by a multi-tasking icon in the annunciator bar, or at some other location on screen 1004.

Figure 15:
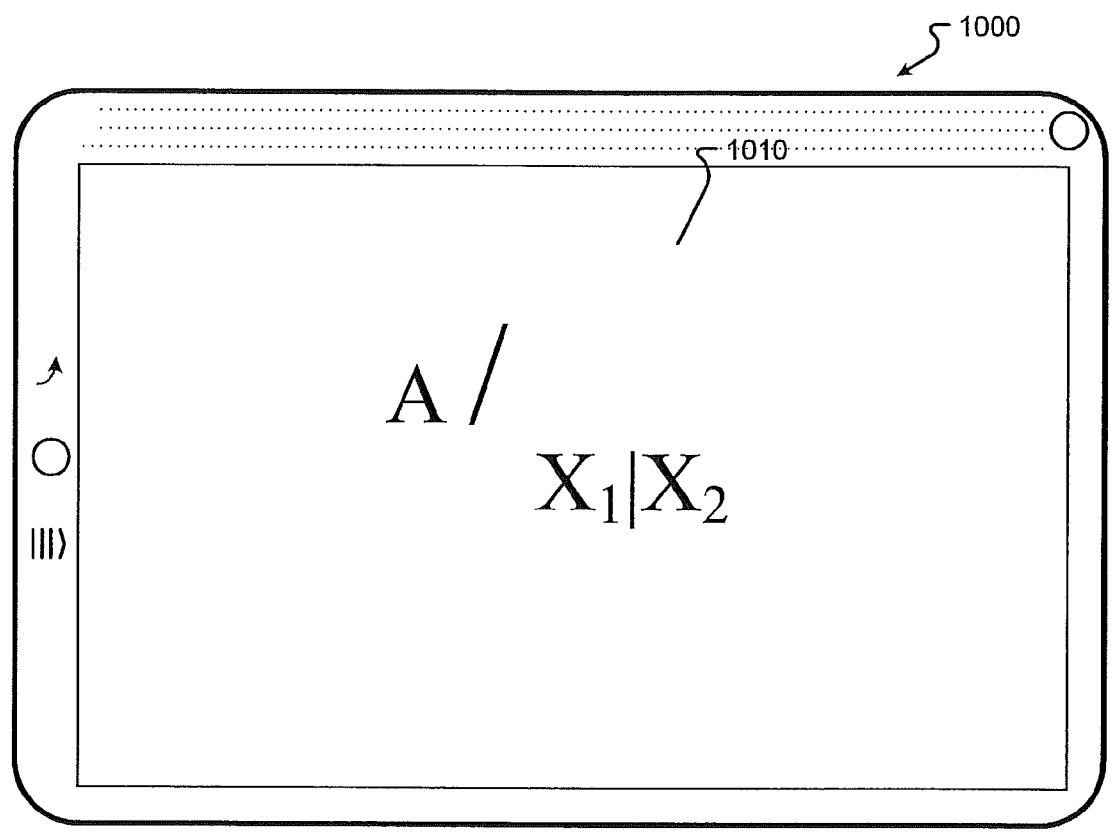
FIG. 15 illustrates a method for displaying an application when the SP is in a portrait mode.

Displaying of the application(s) are managed by one or more of the display controller 544, framework 520, window management module 532, display configuration module 568, as well as middleware 520 and associated classes. In single application mode, all dual screen capable applications can be launched in either a dual screen or max mode, where the application is displayed substantially filling the display 1010. This is applicable to when the SP 1000 is either in the portrait mode, as illustrated in FIG. 14, or in the landscape mode, as illustrated in FIG. 15. In these figures, the "A" represents the single application with the X1, X2 being variables representing the coordinates and/or location of the window in which the application "A" is to be displaced. A similar notation is used hereinafter for the multi-application mode, with it being appreciated that, for example, X1 may contain the coordinate information for the displaying of the window for a first application, and X2 may contain the coordinate information for the displaying of a window corresponding to a second application, and so on.

Therefore, in one exemplar embodiment, when a single application is executed, a single application can launch in the full screen mode and can be correlated to the max mode as discussed in relation to FIG. 6I where a single application spans both screens of the device 100. This max mode is applicable to both the portrait and landscape orientations as illustrated in FIG. 14 and FIG. 15 with the display configuration module 568 appropriately (re)sizing the window for the application to fit on substantially all or all of the display 1010.

This resizing can occur regardless of whether a native application on the device 100 actually supports the orientation of the SP 1000. Therefore, even if the application does not support a particular orientation on device 100, the display configuration module 568 can appropriately re-render and/or re-size the window for the application for appropriate display on the SP 1000.

Figure 16:
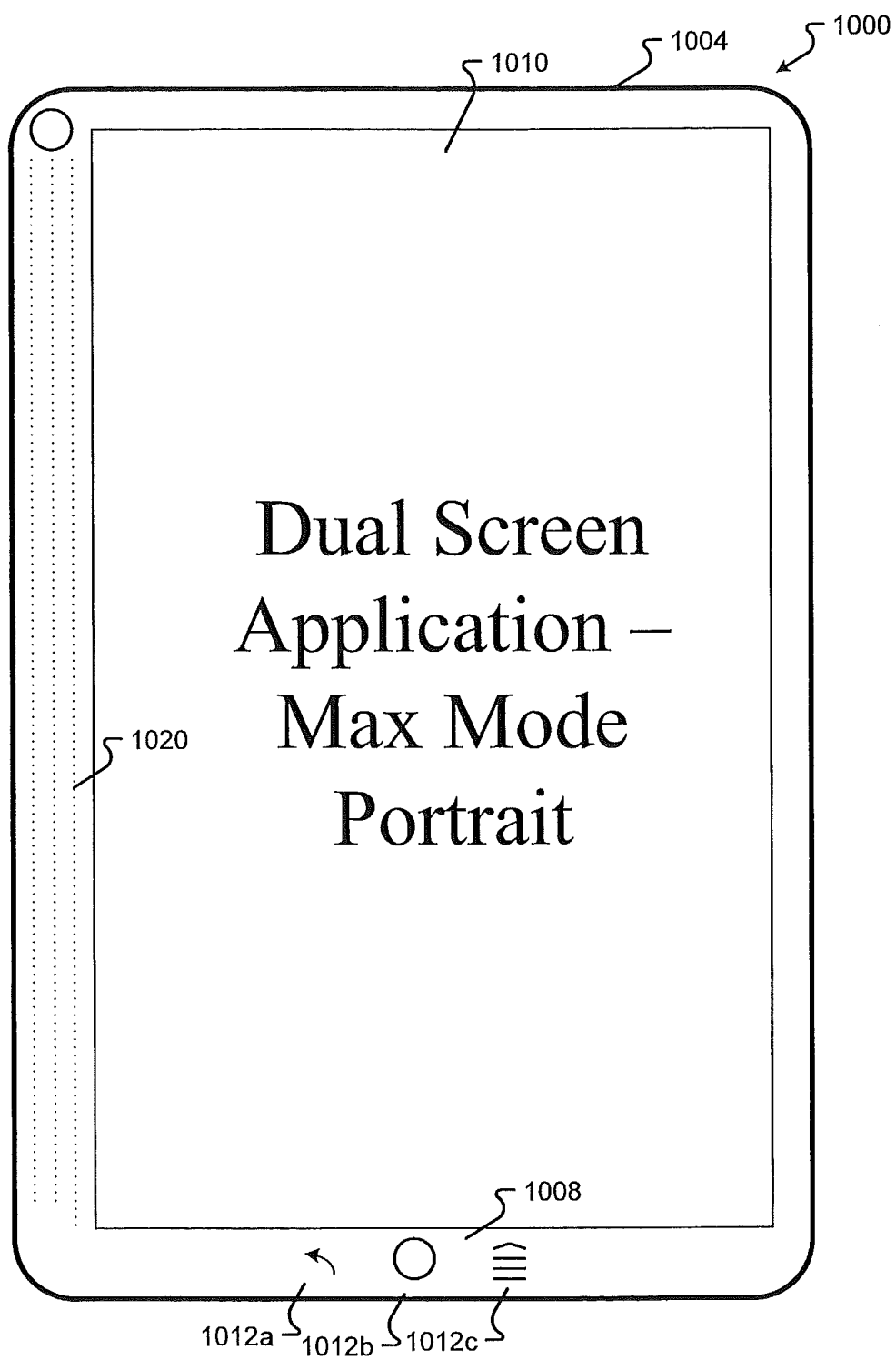
FIG. 16 illustrates an example of a dual screen application in portrait max mode.
Figure 17:
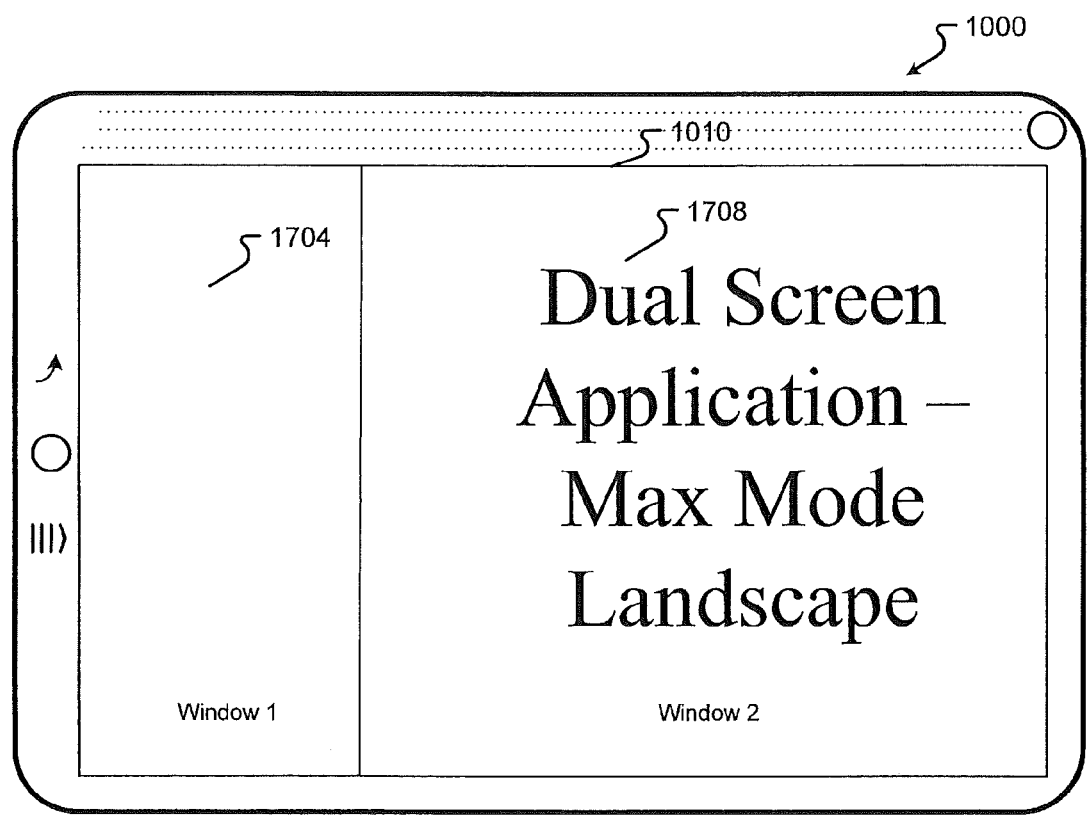
FIG. 17 illustrates an example of a dual screen application in max mode landscape.

FIG. 16 and FIG. 17 illustrate an exemplary method of rending a single application, that is a dual screen application, in the portrait max mode and landscape max mode, respectively. More specifically, in FIG. 16, the rendering of a dual screen application in portrait mode will display on display 1010 one of the two screens substantially or completely filling display 1010. A user then, for example using a gesture, could scroll between the two screens of the single application. In the landscape mode, as illustrated in FIG. 17, the screen 1010 is divided into a first portion 1704 and a second portion 1708. In this exemplary embodiment, the first screen of the dual screen application is rendered in first portion 1704, and the second screen of the dual screen application is rendered in second portion 1708. While a certain portion of the screen 1010 is illustratively logically divided for the first portion 1704 and the second portion 1708, it should be appreciated that the screen real estate assigned to each portion can vary, for example, based on one or more of optimum display for the window(s), type of information being displayed in each portion, user preferences, rules associated with the application, and/or the like.

In accordance with a first example, the first portion is allocated one third of the screen 1010's resolution, while the second portion 1708 is allocated two thirds of the screen real estate. In accordance with another example, the screen 1010 is split 50/50. In accordance with yet another example, the first portion could be allocated 70% of the screen 1010's real estate, while the second portion 1708 could be allocated 30%. The managing and resizing of these windows can again be done in cooperation with the display configuration module 568, as well as the windows management module 532 and display controllers for successful rendering of the location of the window(s) on the SP 1000.

As will be appreciated, and in a manner similar to the operation of device 1000, should the SP 1000 change orientation (e.g., from landscape to portrait or vice versa) the window(s) for the application(s) can be redrawn in the appropriate orientation taking into account window prioritization based on whether a particular application and current focus is for a dual screen application or a single screen application.

Focus can also be taken into consideration when determining which window of the application should be displayed when the SP 1000 is in the portrait position. For example, if the application is an e-mail client, and the application natively is displayed on dual screens on device 1000 (a first screen being directed toward showing inbox content, and the second screen being a preview window for a specific item in the inbox) the system can evaluate which window is currently in focus, and ensure that window is displayed in the portrait max mode when the SP 1000 is in the portrait orientation.

In FIG. 17 the SP 1000 is configured to merge windows from the dual screen application on to a single display 1010. In this landscape orientation, data (e.g., a single image, application, window, icon, video, etc.) from a first window is displayed in a first portion of the display 1010 while data (e.g., a single image, application, window, icon, video, etc.) is shown in a second portion of the display 1010. Similar to other output configurations, it may be possible to transition the SP 1000 from the shown output configuration to any other output configuration described herein, depending on, for example, into which state the SP 1000 is moved.

Some other exemplary embodiments of windows management within the SP 1000 upon the device 100 docking with the SP 1000 are as follows: For example, a device 100 is docked to the SP 1000, with the SP 1000 in a portrait orientation and there are two single-screen applications running on the device 1000, the application in focus is placed in a lower portion of the display 1010, and the application not in focus is placed on an upper portion of the display 1010. Another exemplary scenario, where the device 100 is docked to a portrait-oriented SP 1000 where one dual-screen application is running on the device 100 and the SP 1000 is in a dual application mode, applies gravity drop as discussed herein.

In another exemplary scenario, where the device 100 is running two single-screen applications, and the SP 1000 is in a landscape dual application mode, the first application is assigned to a first portion of the display 1010 and the second application is assigned to a second portion of the display 1010.

In yet another exemplary scenario where the device 100 is running one dual-screen application and the SP 1000 is in dual application landscape mode, both screens of the dual screen application can be shown on the SP 1000.

Stickiness can also apply to the SP 1000 such that, for example, when a first application is in focus, upon docking to a single application mode SP 1000, the application remains visible after docking. As another example of stickiness, if a second application is in focus upon docking to a single application mode SP 1000, application two remains visible after docking In accordance with another example, the device 100 is running one dual-screen application and is docked to a landscape-oriented SP 1000 in max mode, the windows are re-oriented to be side-by-side, opposed to one above the other.

Figure 18:
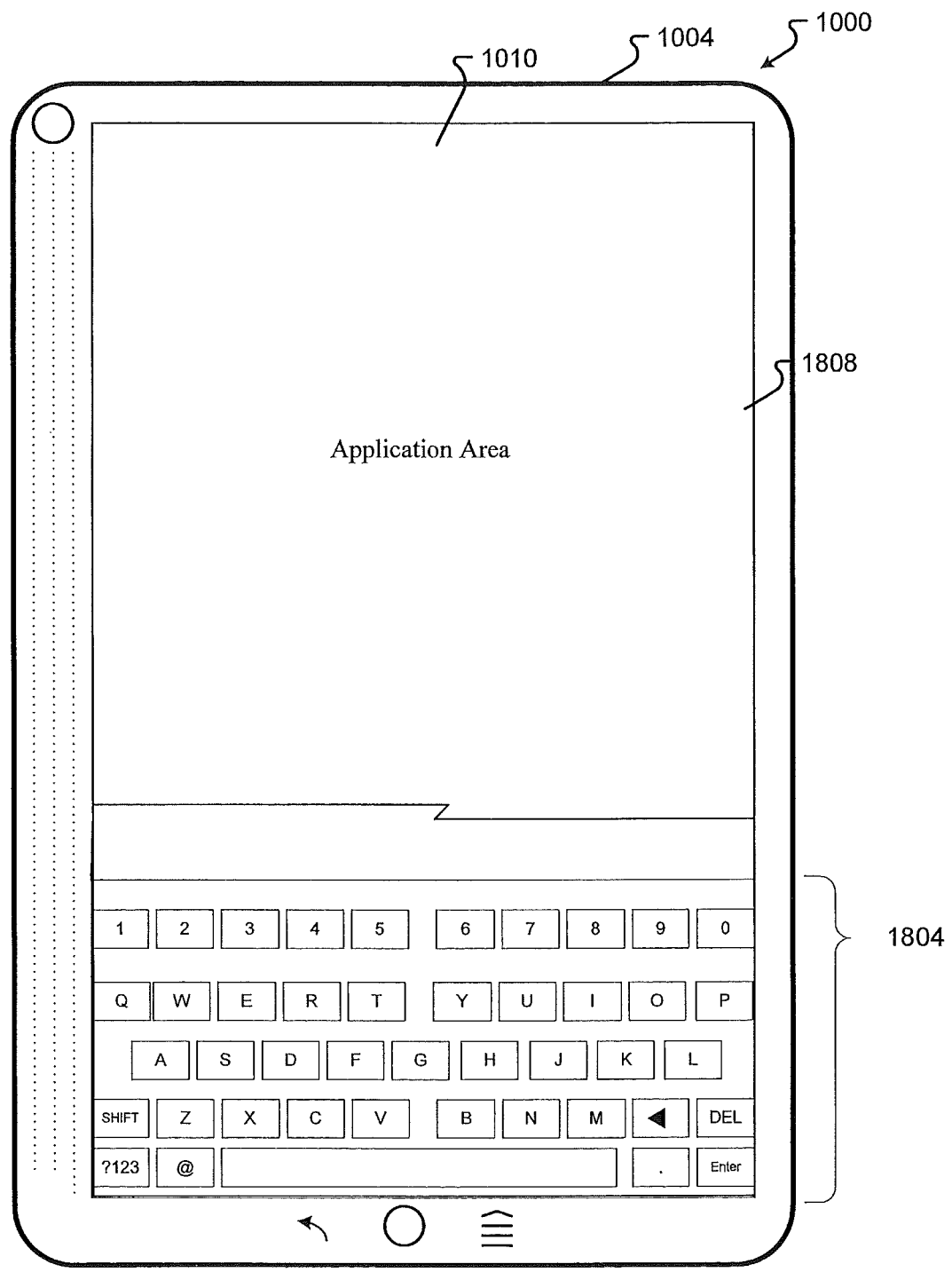
FIG. 18 illustrates an example of keyboard management on the SP.
Figure 19:
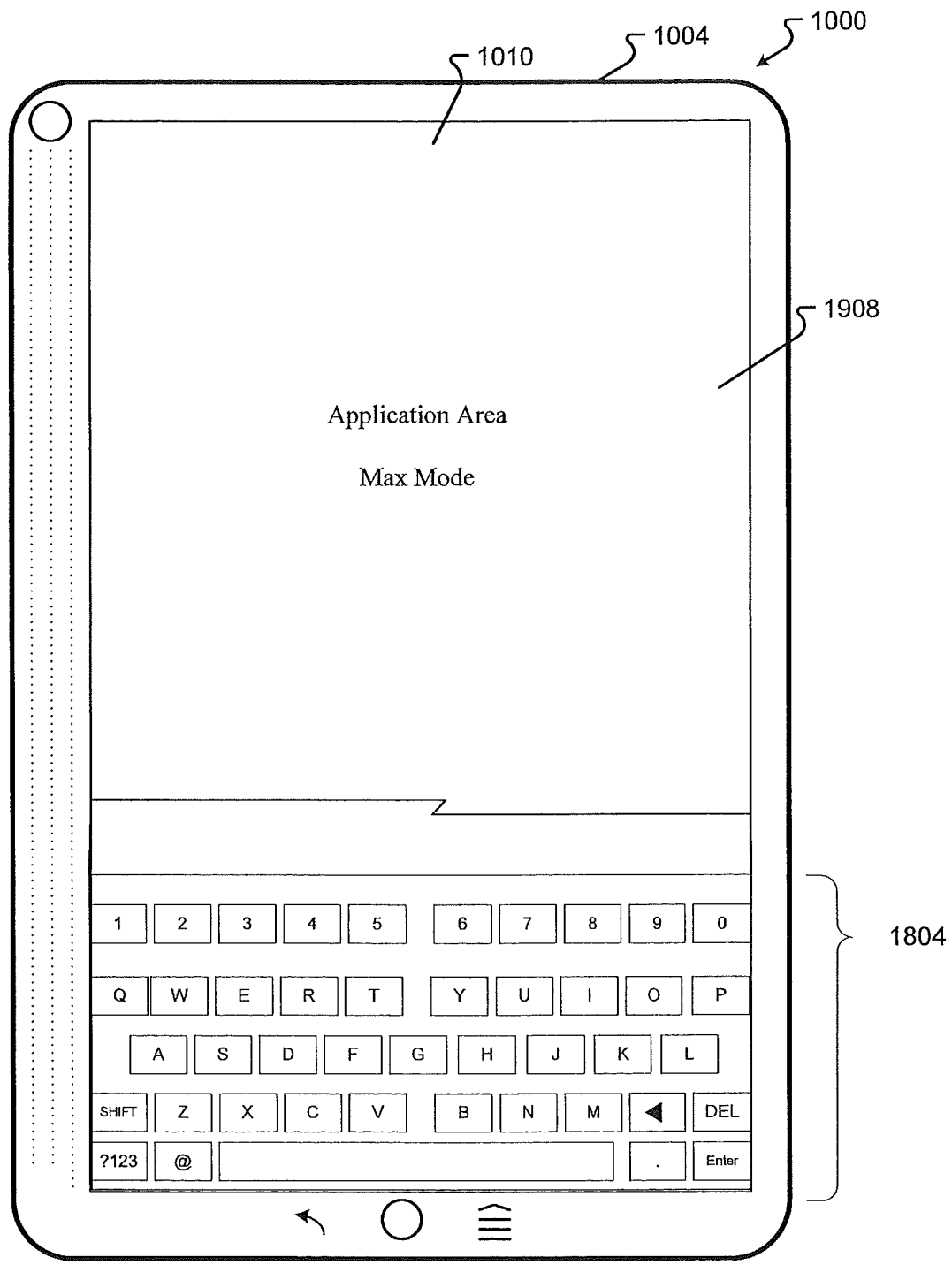
FIG. 19 illustrates an example of keyboard management on the SP with an application area in max mode.

FIGS. 18 through FIG. 21 generally illustrate the management and display of a virtual keyboard 1804 on display 1010. More specifically, in FIG. 18, in portrait mode, the virtual keyboard 1804 is positioned below application area 1808, where an application is displayed in, for example, max mode. In general, it is preferred that the keyboard can be glued to the lower-portion of the display 1010, regardless of whether the SP is in the landscape or portrait mode. However, it is to be appreciated that, for example, based on user preferences, the screen can be glued to another portion of the screen, or can be moved to another location via, for example, a gesture. In FIG. 18, the application area 1808 displays, for example, a standard application with the virtual keyboard 1804 being displayed in the lower portion of display 1010. In FIG. 19, for example, the application area 1908 is showing a dual-screen enabled application in max mode. The keyboard 1804 is again similarly displayed in the lower portion of the display 1010.

Figure 20:
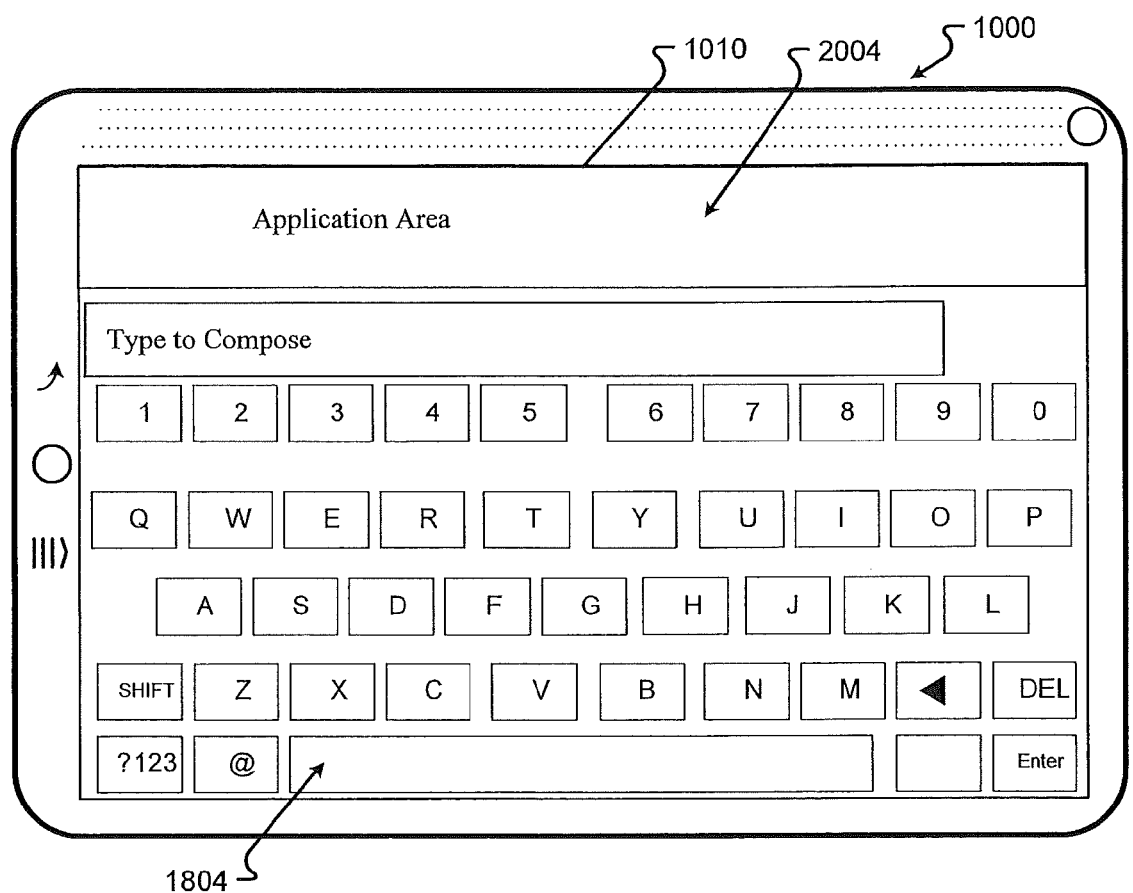
FIG. 20 illustrates another example of keyboard management for the SP in landscape mode.
Figure 21:
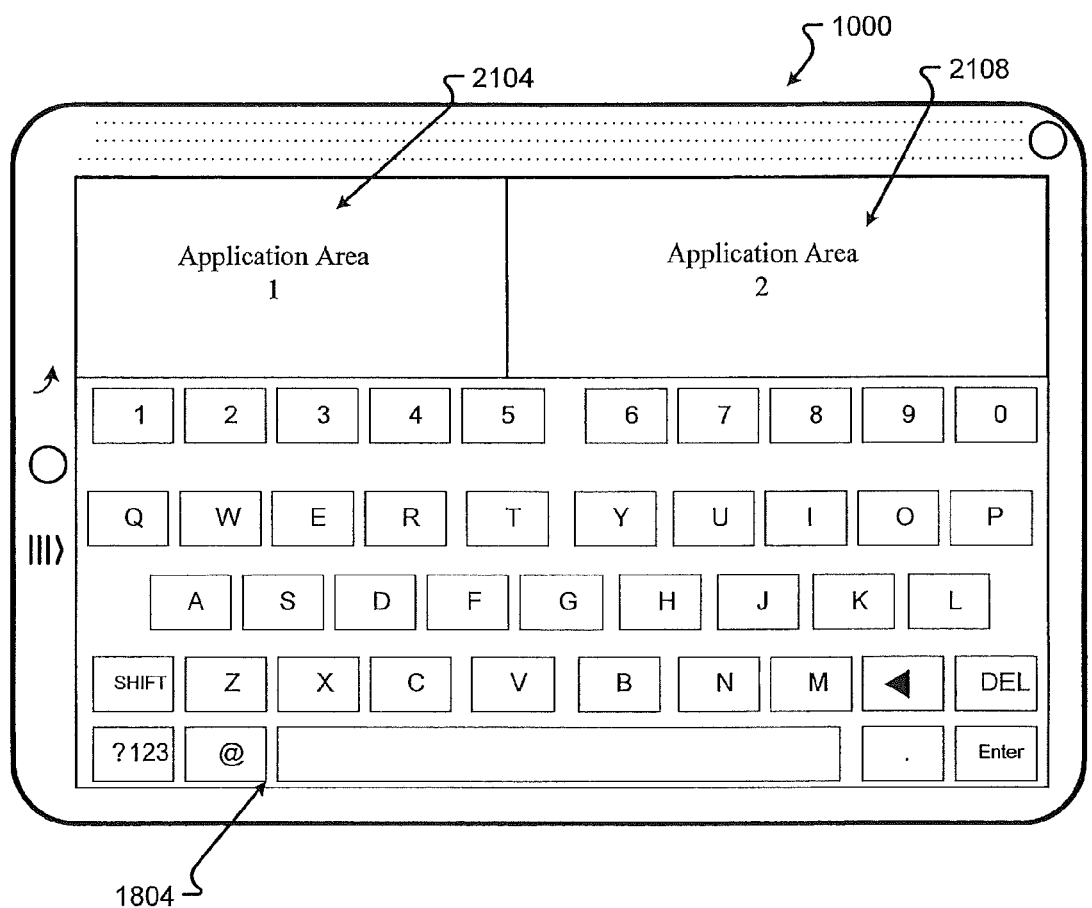
FIG. 21 illustrates an example of a dual screen application running in a dual screen emulation mode on the SP with a virtual keyboard.

In FIG. 20, in SP landscape mode, the keyboard 1804 is displayed in the lower portion of display 1010 with the application area 2004 substantially or completely filling the displayable area above the keyboard 1804. In FIG. 21, the SP is again in landscape mode and displaying a dual-screen enabled application in max mode, the application area 1 2104 and application area 2 2108, the keyboard 1804 is displayed below the two application areas.

In general, in the embodiments illustrated in FIG. 18 through FIG. 21, a first determination is made as to whether a keyboard should be displayed. If the keyboard is to be displayed, the next determination is made as to the orientation of the SP. If the SP is in a portrait mode, the virtual keyboard is presented also in a portrait mode, preferable on the lower portion of the screen. If the SP is in a landscape mode, the keyboard is optionally re-sized to be substantially displayed on a lower portion of the display with, for example, one or more application windows being located above the virtual keyboard. With the orientation of the SP change, the keyboard is also reoriented to be coincident with the orientation of the SP. Similarly, when the keyboard is no longer required, the keyboard is hidden with the application area(s) being expanded to again substantially fill the display 1010.

Figure 22:
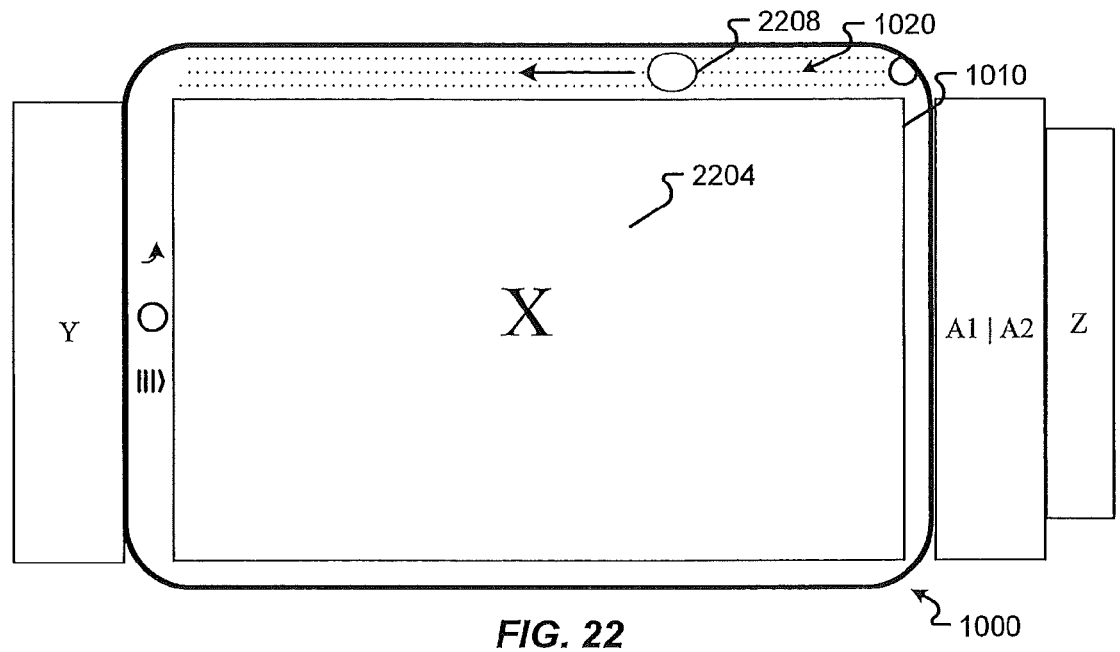
FIG. 22 illustrates an example of application window stack management on the SP.
Figure 23:
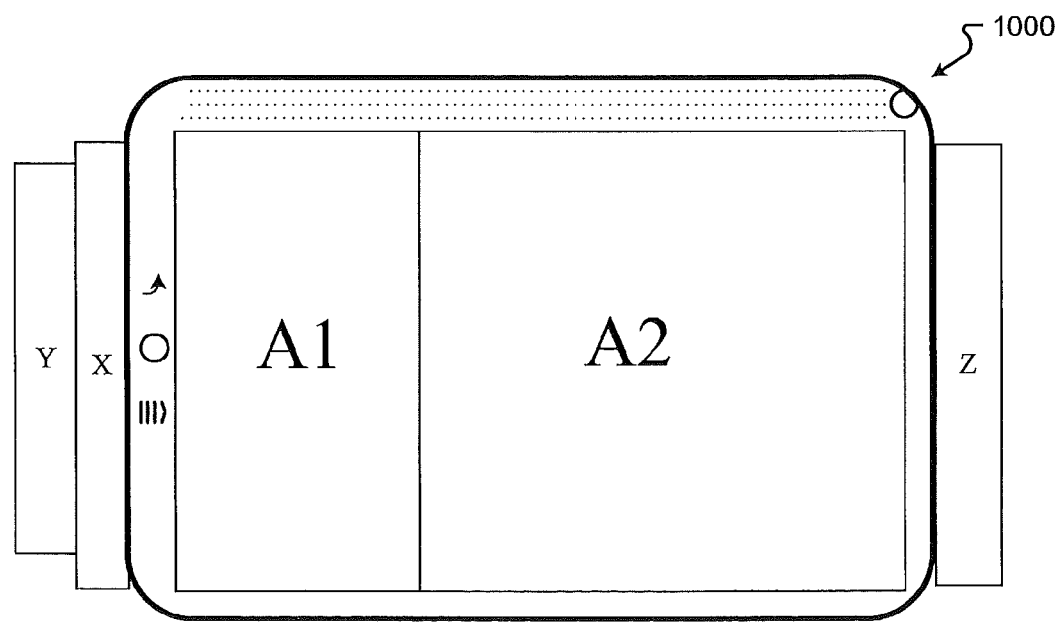
FIG. 23 illustrates another example of application window stack management on the SP.

FIG. 22 and FIG. 23 illustrate exemplary methods of managing window positions on the SP 1000. In particular, in FIG. 22, application X 2204 is in view on display 1010. On receiving user input, such as the swipe motion represented by 2208 in the gesture capture region 1020, application X is "scrolled" to the left to be replaced with the dual-screen application A1|A2, as shown in FIG. 23. If the same gesture 2208 were to be repeated again, application Z would come into view. Similarly, if in FIG. 22 gesture 2208 was in the opposite direction, to the right, application Y would come into view on display 1010. Scrolling through available windows is of course applicable to both the landscape and portrait mode of the SP in a similar manner. For example, in portrait mode, instead of the gesture traversing from left to right or right to left, the gesture could traverse in a downward motion, or in an upward motion, with the virtual stacks of the windows being located "above" or "below" the device, similar to a rolodex. Thus, when the user initiates a downward type gesture, the next application "above" is displayed on display 1010.

Figure 24:
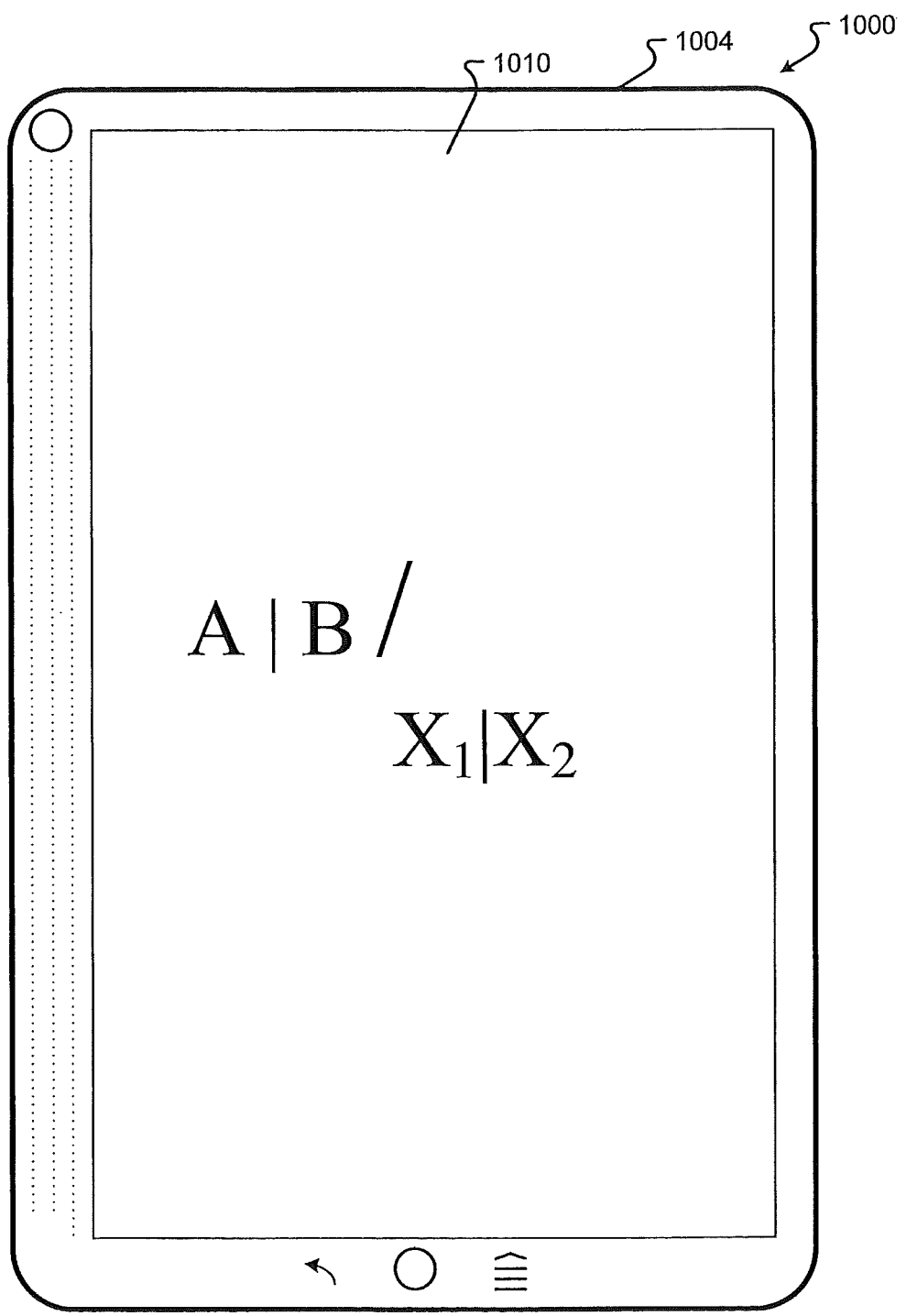
FIG. 24 illustrates an example of multi application mode of the SP, wherein in the multi application mode the SP emulates the device in its mini-tablet form.
Figure 25:
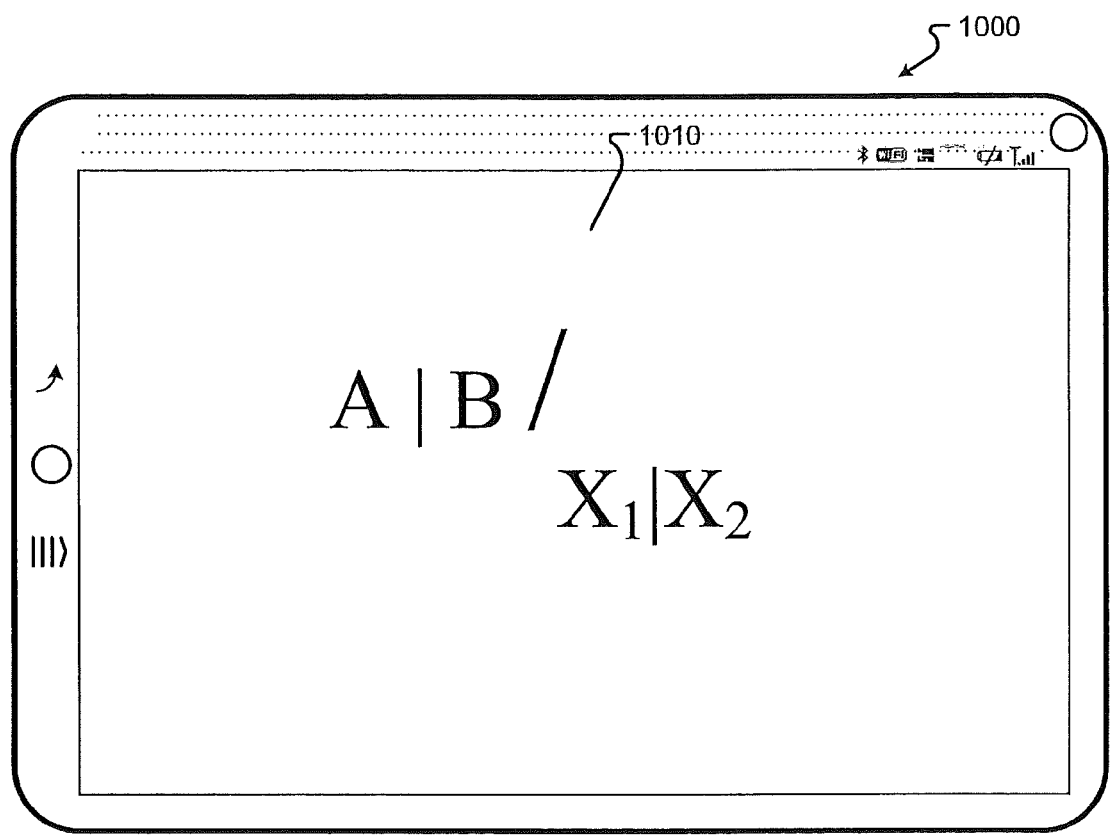
FIG. 25 illustrates another example of multi application mode of the SP.

FIG. 24 illustrates the multi application mode of the SP 1000, wherein in the multi application mode the SP 1000 emulates the device 100 in its mini-tablet form—with this mode optionally being invoked by selection of a multi application button (shown and described hereinafter). A simplified way of understanding this mode is to appreciate that the mode emulates the device 100 being opened. In this multi application mode, the SP 1000 can inherit the rules regarding the display of information on the device 100—For example, that all applications are launched in single screen mode. One exception could be applications that support a max mode can be by default automatically expanded to this mode if provided the opportunity.

In this mode, each application has the ability to determine how the application appears in each orientation (e.g., portrait and landscape).

Figure 26:
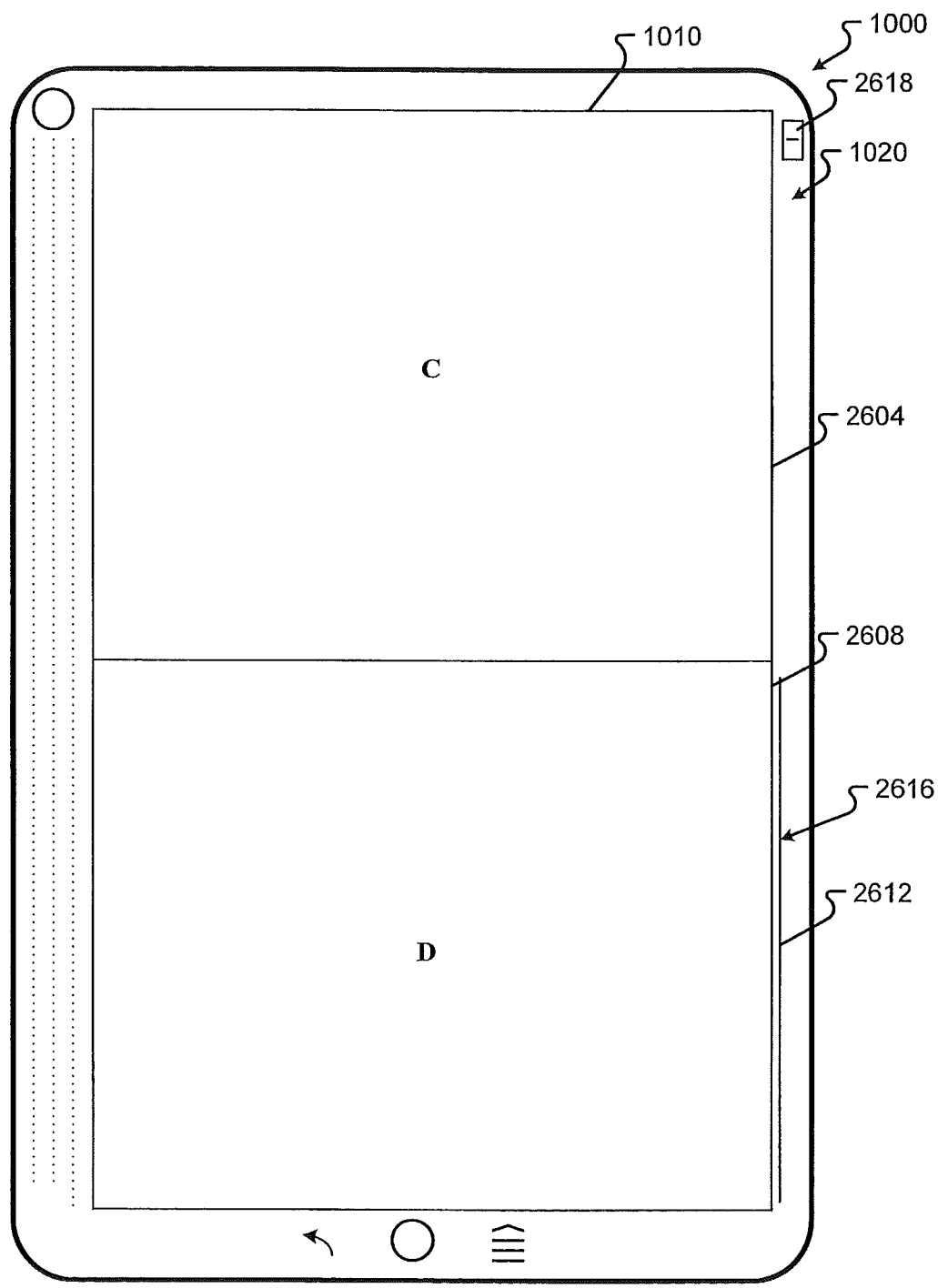
FIG. 26 illustrates another example of multi application mode of the SP.

FIG. 26 illustrates an exemplary method of managing the multiple application mode of the SP 1000. In the multiple application mode, multiple applications can be managed and displayed within the display 1010. In multi application mode, the SP1000 having the single screen emulates the dual screens of the device 100. To initiate the multiple application mode, a button/toggle 2618 is selected, which allows the user to select multiple applications for display in the display 1010. In this exemplary embodiment, a first application 2604 C, is shown in the upper-portion of the portrait mode SP 1000 and a second application 2608 D, is shown in a lower-portion of screen 1010. In conjunction with the displaying of multiple applications in the multiple application mode, focus indicator 2616 can be provided to assist the user with identifying which application is in focus. As discussed, this focus indicator can be a light bar, or other indicator (such as an indicator in the screen 1010 or beside 2608) drawing the user's attention to which application is in focus. In the exemplary embodiment in FIG. 26, application D 2608 is in focus as represented by the focus bar 2616. In accordance with this exemplary embodiment, and while the focus bar 2616 is shown in the gesture capture region 1020, it should be appreciated that the focus indicator could be located in some other portion of the SP 1000. For example, the window for the application in focus could be slightly re-sized to allow for the display of a bar of pixels adjacent to the window, which would similarly alert the user to the fact that that application is in focus. Similarly, the application in focus could appear at normal brightness while the application not in focus could be slightly dimmed. In general, any technique could be used to assist the user in readily determining which application is in focus.

To change focus, a user could use any of the gestures discussed herein or could, for example, simply touch the area where application C is displayed, thereby changing focus to application C, at which point a corresponding relocation of the focus indicator 2616 to adjacent to application C would occur.

Figure 27:
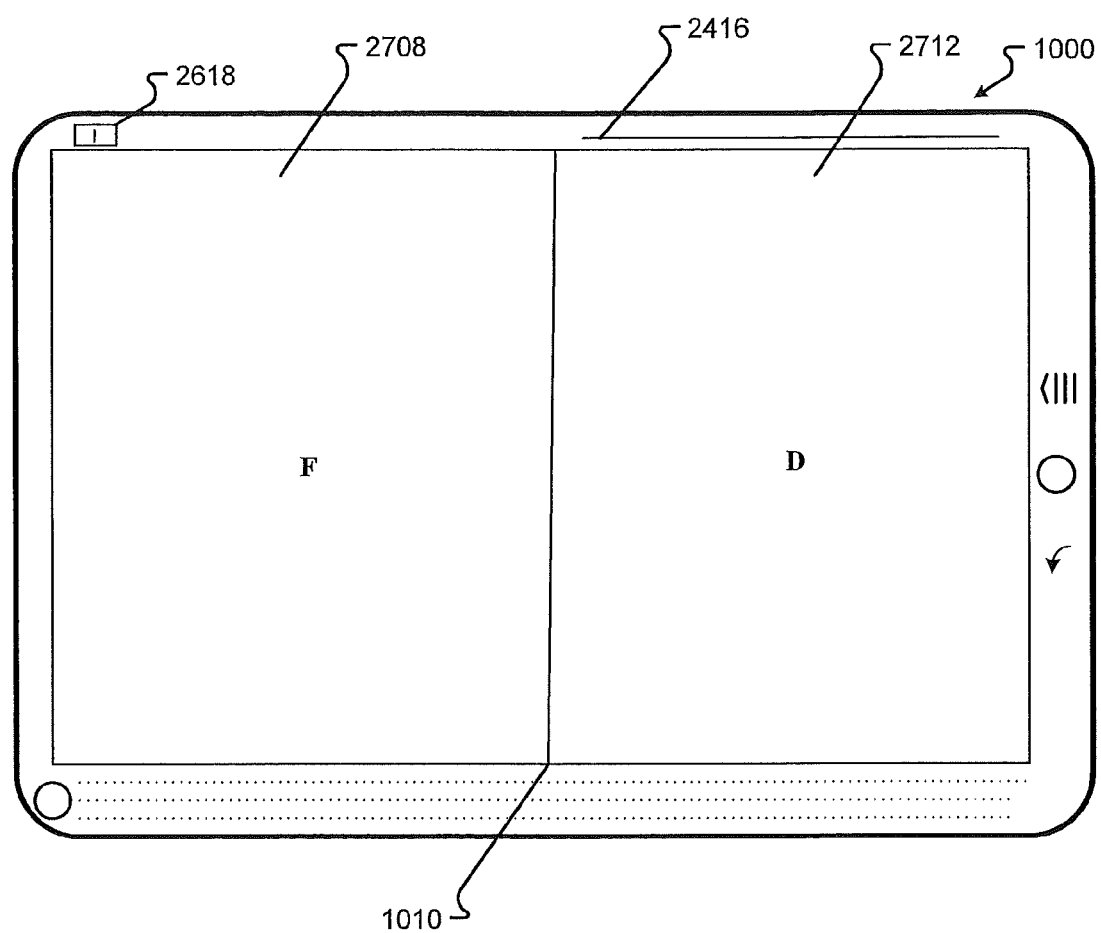
FIG. 27 illustrates another example of multi application mode of the SP.

FIG. 27 illustrates a similar scenario for a landscape mode SP 1000. In particular, and upon selection of the multi application mode, the display 1010 is divided between, in this example, a first application D 2712, and a second application F 2708. Here, application D is displayed on the right-hand portion of display 1010 and application F displayed on the left-hand portion of display 1010. While in this exemplary embodiment, the display real estate is split 50/50 between the two applications, it should be appreciated that one application could be displayed on a larger portion of the display 1010 than the other. In this particular exemplary embodiment, application D is in focus, as represented by focus indicator 2416.

In the multiple application mode, in both portrait and landscape orientations, each application could have its own associated window stack as show in FIG. 22 and FIG. 23, or there could be one stack shared between all of the displayed applications. More specifically, if each application has its own stack, with a stack structure similar to that illustrated in FIG. 22, a stack would be available for the first application, such as application C, and a similar stack would be available for application D. Each of these stacks could be independently scrolled through using, for example, a gesture as discussed above.

Figure 28:
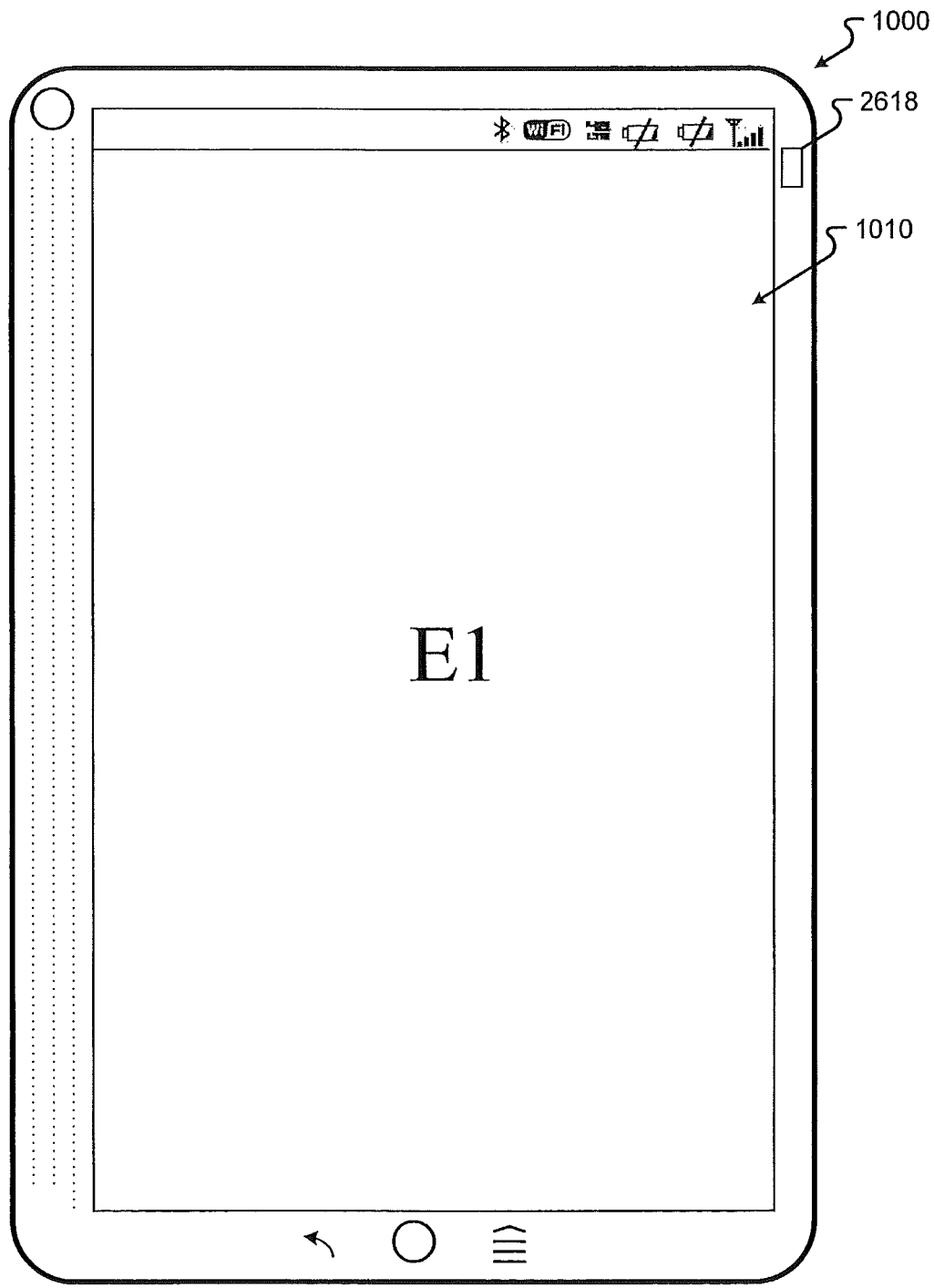
FIG. 28 illustrates a method for managing screen display.

FIG. 28 illustrates an exemplary method for managing screen display characteristics according to another embodiment of this invention. In accordance with this embodiment, a determination is made whether an application can be maximized, and if it can be maximized, it is expanded to the dual screen mode or max mode, as appropriate, to substantially fill the display 1010 as illustrated in the figure. Here, application E1, which is an application that can be maximized, has been expanded using the max mode to substantially or completely fill display 1010.

In FIG. 28, button 2618 allows a user to toggle between a single screen mode (as illustrated in FIG. 28) and an emulated dual screen mode, for example, as illustrated in FIG. 26 and FIG. 27. Here, button 2618 does not include the "|" therefore indicating to the user the SP 1000 is in single screen mode.

Figure 29:
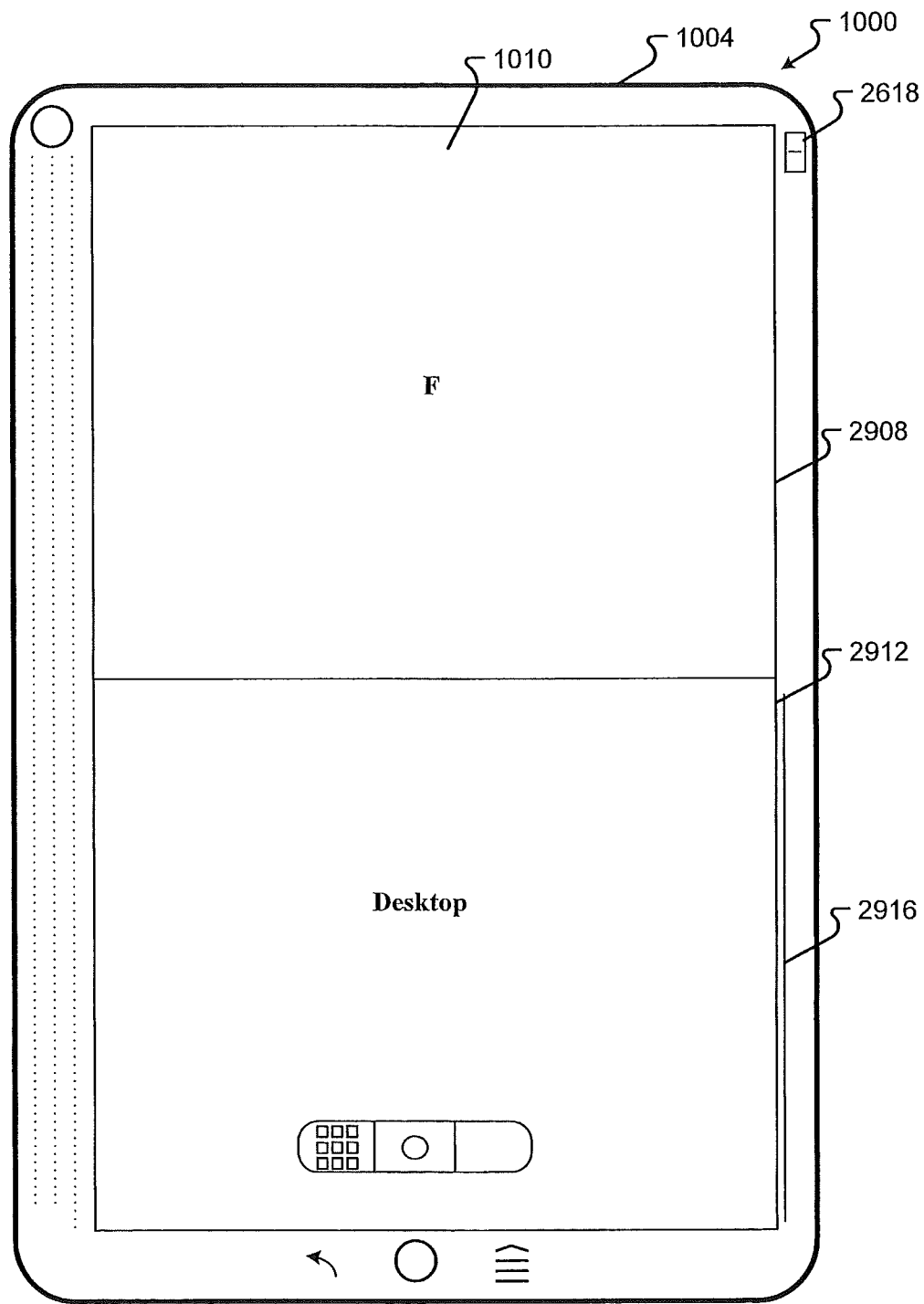
FIG. 29 illustrates an exemplary method for managing screen display with the desktop.

FIG. 29 illustrates an exemplary method of managing windows. In this exemplary embodiment, and similar to the operation of the device 100, when the last application in the stack is moved to the side, the desktop is displayed. Even more specifically, as shown in FIG. 29, application F 2908 is displayed in an upper portion of display 1010 and the desktop 2912 is displayed in the lower portion of display 1010. Here the desktop is in focus, as illustrated by the focus indicator 2916. This configuration is available since the user has selected the dual-screen emulation mode button 2618.

Figure 30:
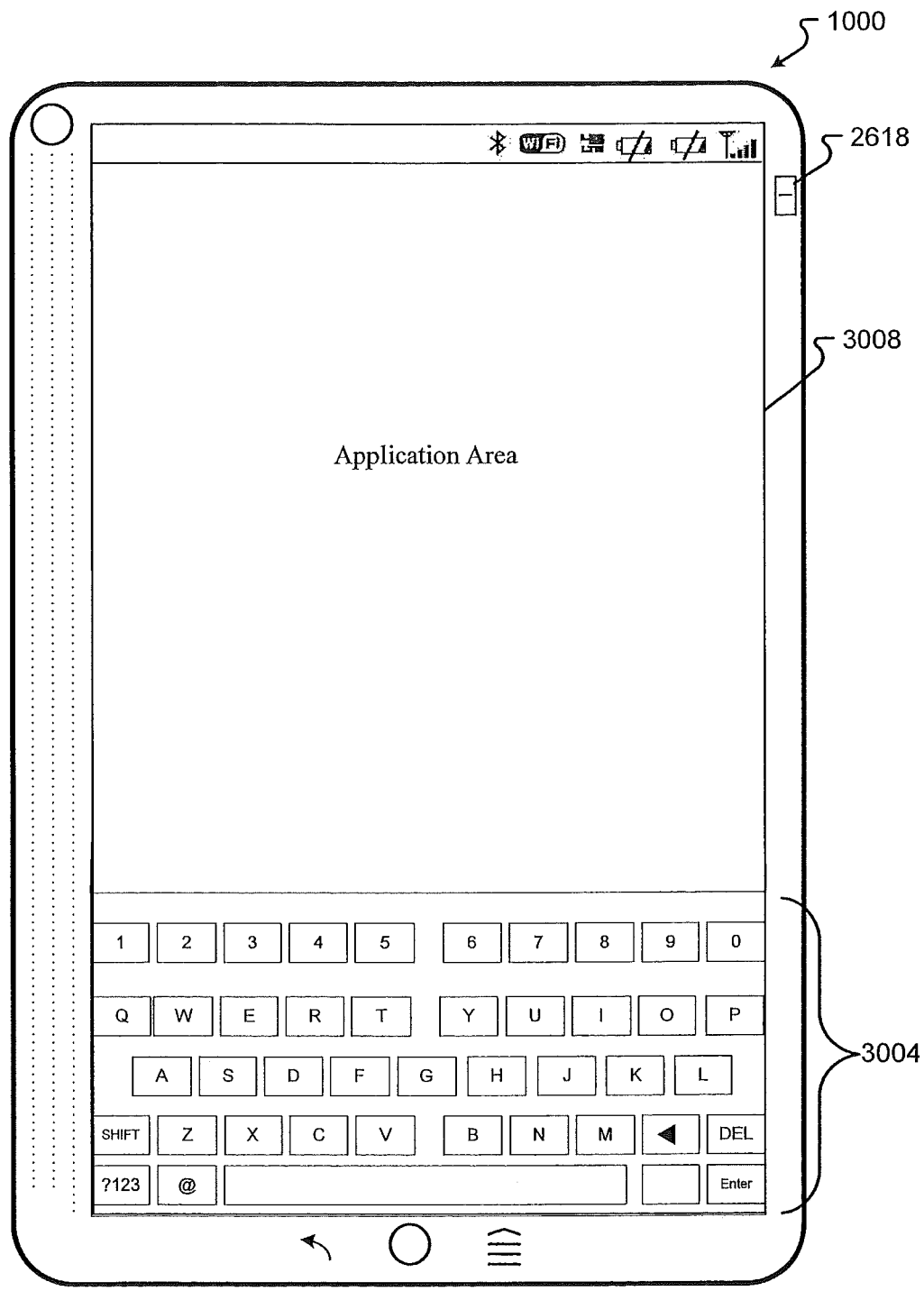
FIG. 30 illustrates an exemplary method of managing screen display with a keyboard.

FIG. 30 illustrates an exemplary method of displaying a keyboard according to one embodiment. In particular, when the SP is in portrait mode, the SP will have a keyboard area 3004 and an application area 3008. Upon display of the keyboard 3004, the application in application area 3008 is resized to substantially or completely fill the area of the screen not occupied by the keyboard 3004.

Figure 31A:
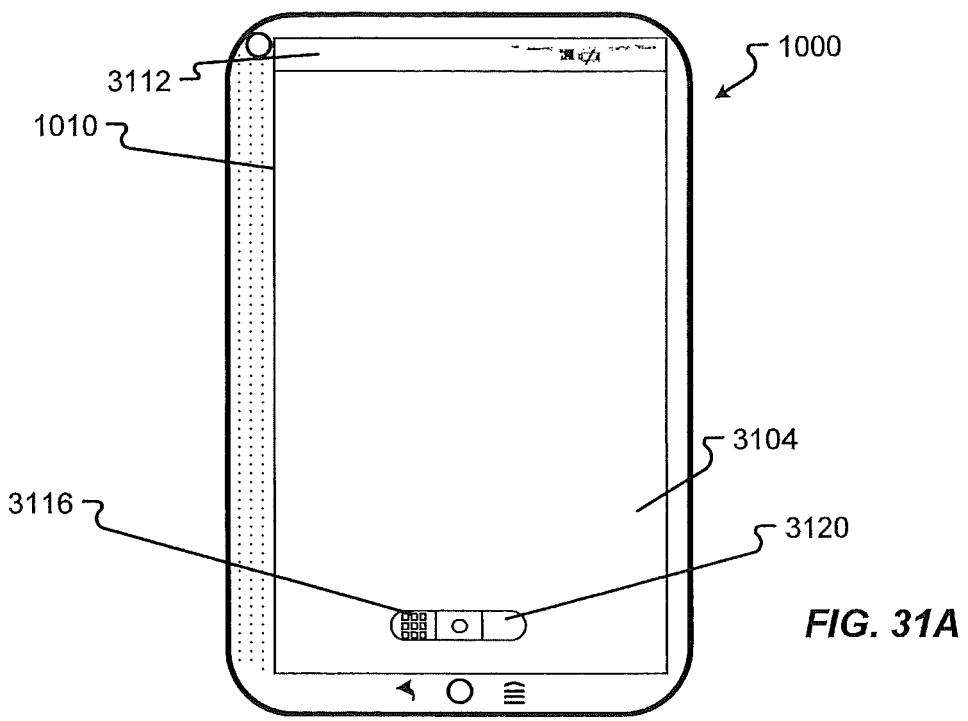
FIGS. 31A and 31B illustrate desktop management on the SP.
Figure 31B:
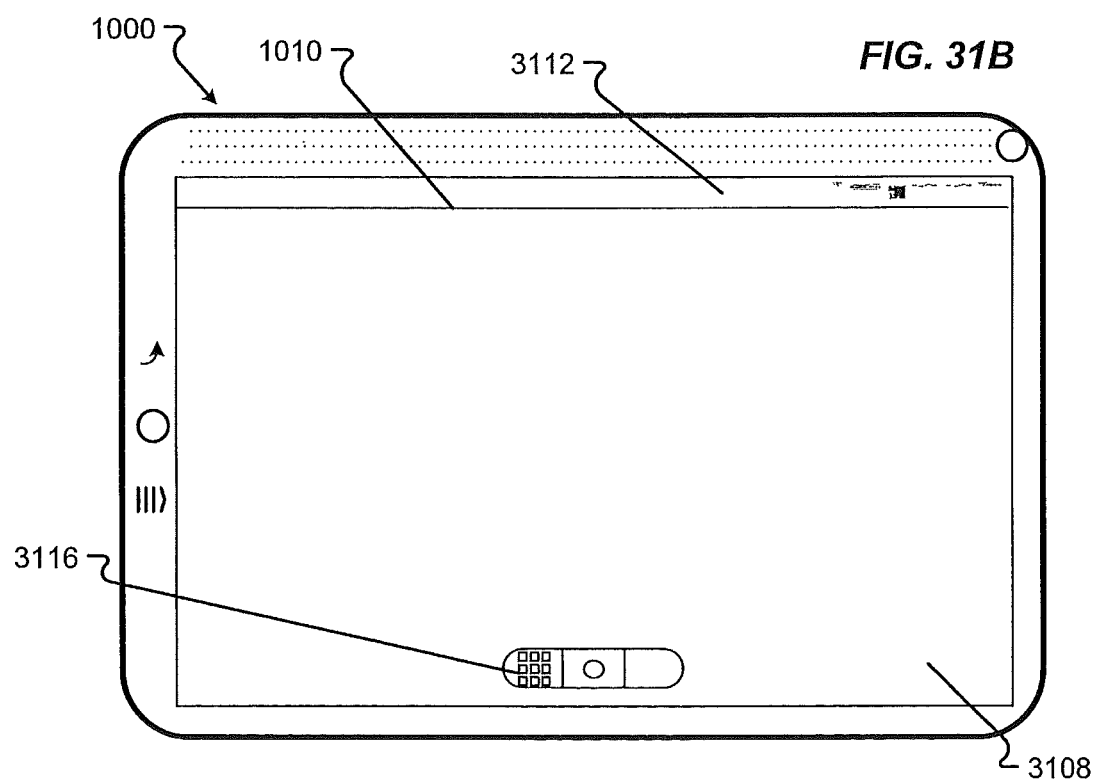

FIG. 31A and FIG. 31B illustrate desktop availability in both the single application mode and dual application mode in both the SP landscape mode and SP portrait mode. In particular, and in accordance with an exemplary embodiment, the desktop 3104 will occupy the entirety of the screen 1010. Additionally, and in accordance with this exemplary embodiment where the desktop is shown in a full-screen mode, the annunciator bar 1312 can be expanded across the entirety of the screen 1010. This can occur in both the portrait mode as shown in FIG. 31A as well as the landscape mode as illustrated in FIG. 31B. From here, upon selection of the application launcher 3116, the application launcher can optionally expand across the entirety of the screen 1010 in either the portrait or landscape mode. Similarly, the file explorer, which is launched by pressing the file explorer button 3120, can be similarly expanded into substantially all or all of the screen 1010 space.

Figure 32A:
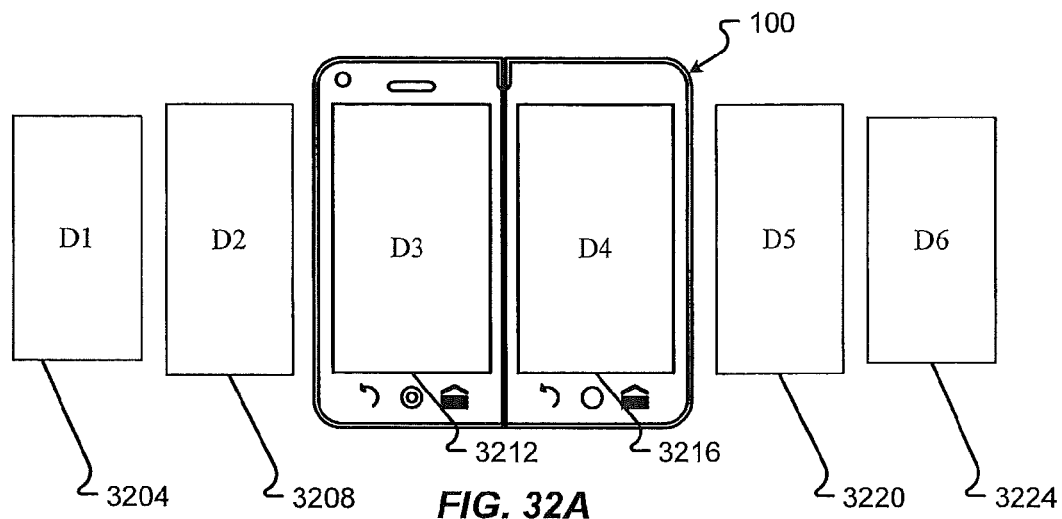
FIGS. 32A and 32 B illustrate exemplary methods for desktop panel management.
Figure 32B:
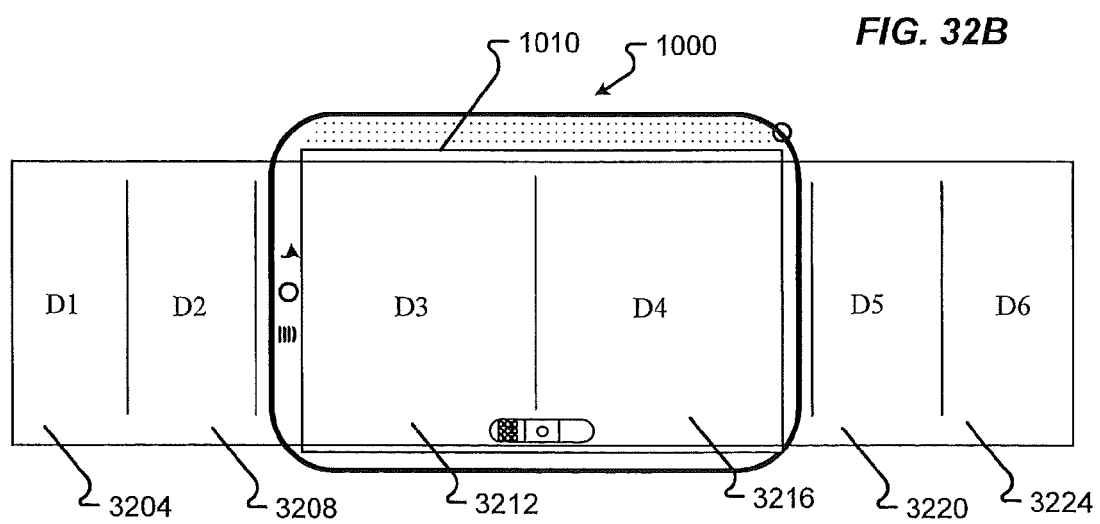

FIG. 32A and FIG. 32B illustrate screen redrawing that may required to transition the desktop from the device 100 to the SP 1000. In particular, in FIG. 32A, six exemplary desktop panels are shown 3204-3224. These desktop panels are moveable in a carousel-like fashion based on gesture input from a user. However, it may not be possible to directly translate these panels to display correctly on the SP 1000 without the panels being distorted or not occupying the entirety of the screen 1010. Accordingly, in accordance with one exemplary embodiment, one or more of the panels 3204-3224 can be resized when displayed on the SP 1000 to accommodate all or substantially all of the screen 1010. In accordance with another exemplary embodiment, more than two of the panels can be shown on the screen 1010, such as a portion of panel D2 3208, a portion of panel D3 3212 and a portion of panel D4 3216. In this manner, the desktop illustrated on the SP 1000 will have a similar look-and-feel to the desktop panels shown on device 100. The same carousel-like motion is available via a gesture input to the SP 1000 such that a user can scroll to the one or more panels of the desktop.

Figure 33:
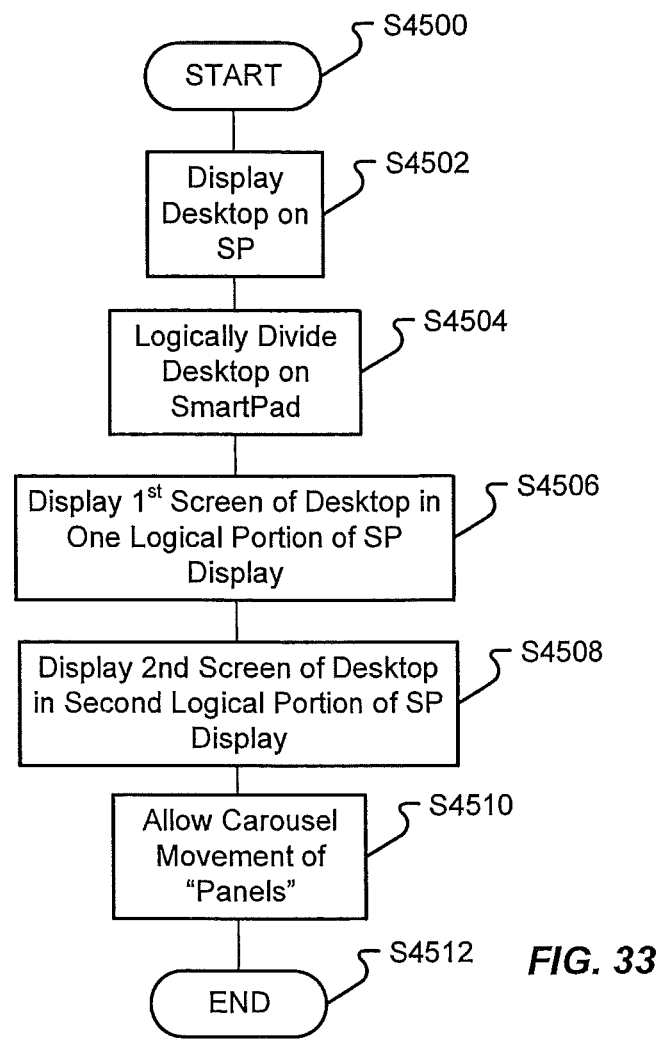
FIG. 33 illustrates an exemplary method for managing the display of the desktop and/or one or more panels on the SP.

FIG. 33 illustrates an exemplary method of emulating the multi-screen display of the device 100 on the SP1000. In particular, control begins in step S4500 and continues to step S4502. In step S4502, the desktop is displayed on the SP. Next, in step S4504, the desktop is logically divided on the SP into, for example, two sections. Then in step S4506, a first screen of the desktop is displayed in a first logical portion of the SP display. Then, in step S4508, a second screen of the desktop is displayed in a second logical portion of the SP display. Control then continues to step S4510.

In step S4510, carousel movement of the "panels" shown in the display can be initiated through user input, such as a gesture. Control then continues to step S4512 where the control sequence ends.

Figure 34:
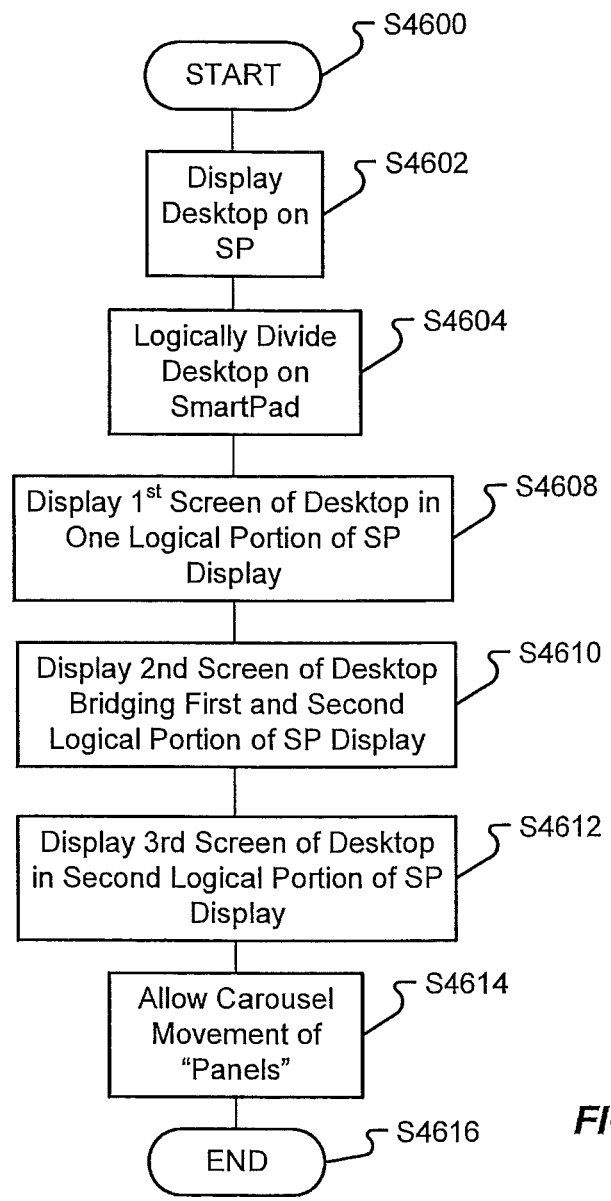
FIG. 34 illustrates an exemplary method for merging panels for display on the SP.

FIG. 34 outlines an exemplary method of displaying multiple "panels" of the desktop on the SP. In particular, control begins in step S4600 and continues to step S4602. In step S4602, a portion of the desktop is displayed on the SP. Next, in step S4604, the desktop is logically divided on the smartpad to accommodate multiple desktop "panels." Then, in step S4608, the first screen or panel of the desktop is displayed in one logical portion of the SP display. Then, in step S4610, a second screen or panel of the desktop is displayed bridging a first and a second logical portion of the SP display. Then, a third screen or panel of the desktop is displayed in the second logical portion of the SP display. Control then continues to step S4614.

In step S4614 carousel movement of the panels can be affected by, for example, an input of a gesture by the user. Control then continues to step S4616 where the control sequence ends.

Figure 35:
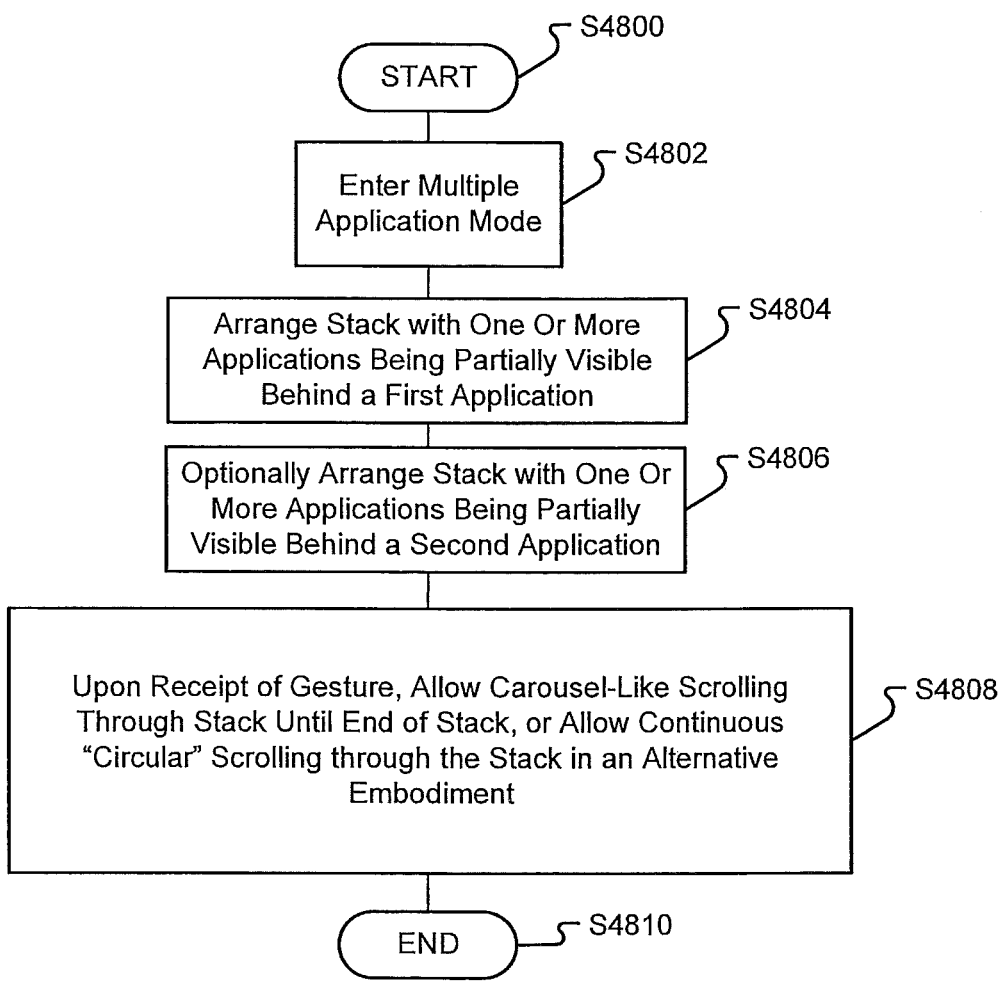
FIG. 35 illustrates an exemplary method for stack management in multi application mode.

FIG. 35 outlines an exemplary method of windows management in multiple application mode. In particular, control begins in step S4800 and continues to step S4802. In step S4802, multiple application mode is entered. Next, in step S4804, the windows stack is arranged with one or more applications being partially visible behind a first application. Next, in step S4806, the stack can be arranged with one or more applications also partially being visible behind a second application. Then, in step S4808, and upon receiving an input gesture from a user, carousel-like scrolling can be enabled through the stack until the end of the stack is reached, or in a second embodiment, the stack can have a "circular" arrangement where continuous scrolling through the stack is possible. Control then continues to step S4810 where the control sequence ends.

To avoid unnecessarily obscuring the present disclosure, the preceding description omits a number of known structures and devices. This omission is not to be construed as a limitation of the scopes of the claims. Specific details are set forth to provide an understanding of the present disclosure. It should however be appreciated that the present disclosure may be practiced in a variety of ways beyond the specific detail set forth herein.

For example, the smartpad could have multiple physical and/or logical screens/displays. Additionally, the smartpad could be used with one or more input devices such as a stylus, mouse, or the like. Moreover, the smartpad could be populated with a processor, memory, communications means and the like that would allow for stand-alone operation. Even further, the smartpad could be associated or docked with other types of communications devices such as a smartphone such that the smartpad could be used as a display and/or I/O interface therefore.

Figure 36:
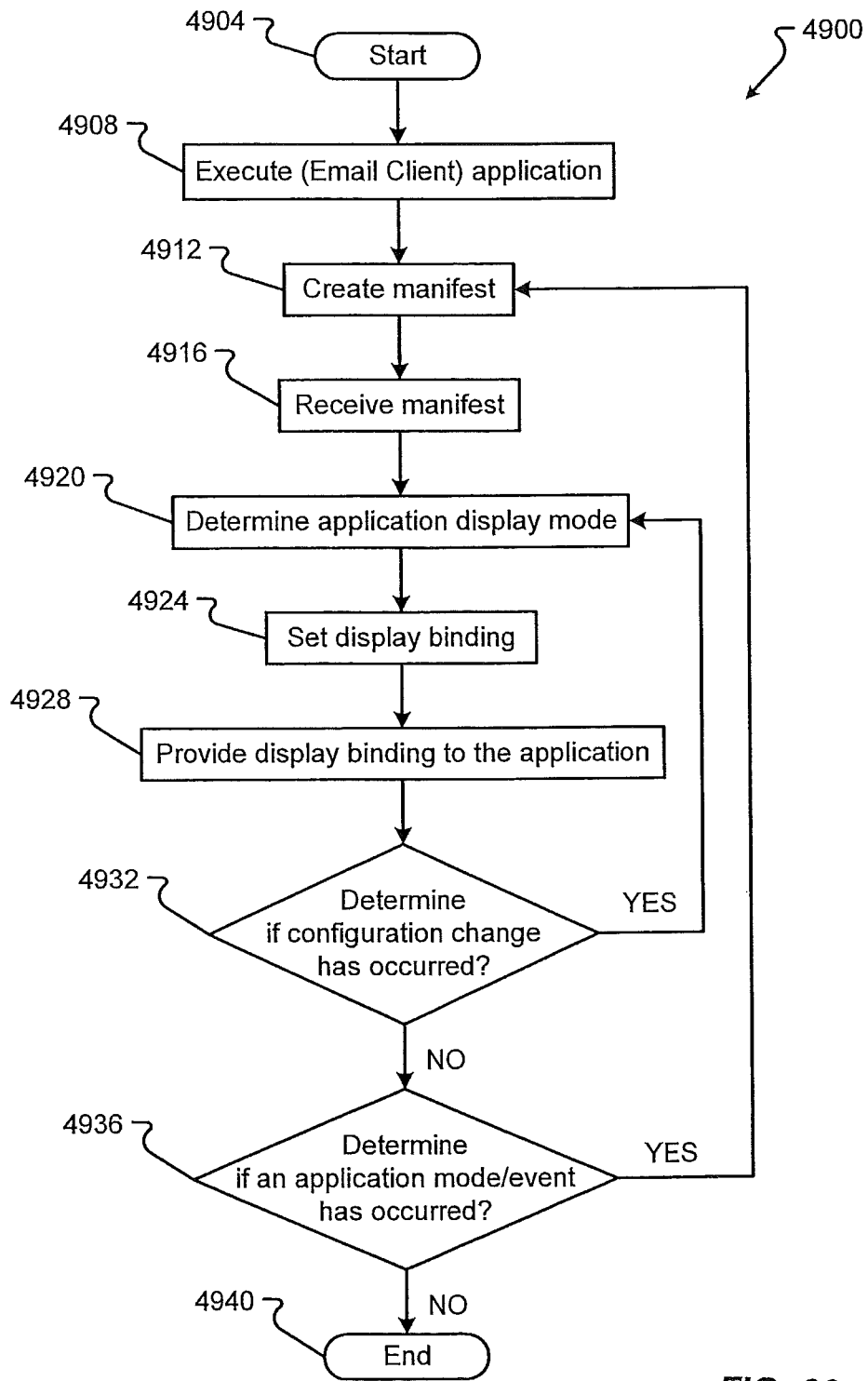
FIG. 36 illustrates an exemplary method for managing the display of an application based on application mode and device configuration.

An embodiment of a method 4900 for executing an application is shown in FIG. 36. While a general order for the steps of the method 4900 is shown in FIG. 36. Generally, the method 4900 starts with a start operation 4904 and ends with an end operation 4940. The method 4900 can include more or fewer steps or can arrange the order of the steps differently than those shown in FIG. 36. The method 4900 can be executed as a set of computer-executable instructions executed by a computer system and encoded or stored on a computer readable medium. Hereinafter, the method 4900 shall be explained with reference to the systems, components, modules, software, data structures, user interfaces, etc. described in conjunction with FIGS. 1-35.

An application is executed, in step 4908. In embodiments, a processor 204 receives indication to execute an application through a user interface 110, 114, 112, 116, etc. The indication can be a selection of an icon associated with the application. In other embodiments, the indication can be a signal generated from another application or event, such as receiving an e-mail or other communication, which causes the application to execute automatically. The processor 204 can retrieve the application 564a from the application store 560 and begin its execution. In executing the application 564a, a user interface can be generated for a user.

In creating a user interface, the application 564a can begin executing to create a manifest, in step 4912. A manifest is a data structure that indicates the capabilities of the application 564a. The manifest can generally be created from the resources in the resources directory of the application 564a. The resources directory can indicate the types of modes, locations, or other indications for how the user interface should be configured in the multi-display device 100. For example, the several modes can include: "classic mode" that indicates that the application 564*a* is capable of being displayed on a single screen or display 110/114; "dual mode" that indicates that the application 564*a* is capable of being displaced on two or more displays 110 and 114; "max mode" that indicates the application 564*a* is capable of being displayed or desires to be displayed across multiple displays 110 and 114; and/or "bilateral mode" that indicates that the application 564*a* is capable of being displayed on 2 or more displays 110 and 114 when the device 100 is in easel mode (see FIGS. 1I and/or 1J).

Similarly, the manifest can include a desired or allowed location within the displays 110/114. The possible locations can include: "left", which indicates that the application 564*a* desires to be displayed on the left display 110; "right", which indicates that the application 564*a* desires to be displayed on the right display 114; and/or other indications of where a location should be including possible "top" and/or "bottom" of one or more of the displays 110/114.

The application 564*a* can also indicate that it desires to be displayed in a "minimum" window, which is a window that occupies less than the full area of a single display. There may be other modes possible for the application 564*a*, which may be included in the manifest. The manifest can be sent from the application 564*a* to the multi-display management module 524.

The multi-display management module 524 can receive the manifest, in step 4916. In receiving the manifest, the multi-display management module 524 can use the information to determine a display binding for the application 564*a*. The manifest may be received more than once from the application 564*a* based on changes in how the application 564*a* is being executed, where the application 564*a* desires to have a different display setting for the new mode. Thus, with the manifest, the application 564*a* can indicate to the multi-display management module 524 how best to or what is the desired for the application's user interface. The multi-display management module 524 can use the information in the manifest to determine the best fit for the user interface depending on how the device 100 is currently configured.

The multi-display management module 524 can determine the application display mode, in step 4920. Here the multi-display management module 524 receives or retrieves an indication of the device 100 configuration. For example, the multi-display management module 524 can determine if the device is in single display configuration (see FIG. 6A, 6B, 6D, or 6E), dual display configuration (see FIG. 6C or 6F), bilateral display configuration (see FIG. 6G or 6H), or one of the other display configurations (see FIG. 6I or 6J).

Further, the multi-display management module 524 can determine if the device 100 is in a portrait or landscape orientation. With this information, the multi-display management module 524 may then consider the capabilities or preferences listed for the application 564*a* in the received manifest. The combined information may then allow the multi-display management module 524 to determine a display binding. The display binding can include which of the one or more displays 110 and/or 114 are going to be used to display the application's user interface(s). For example, the multi-display management module 524 can determine that the primary display 110, the secondary display 114, or all displays 110 and 114 of the device 100 will be used to display the application's user interface.

The display modes setting can be assigned by creating or setting a number in the display binding. This number can be "0" for the primary display 110, "1" for the secondary display 114, or "2" for dual displays 110 and 114. The display mode setting can also indicate if the application 564*a* should display the user interface in portrait or landscape orientation. Further, there may be other settings, for example, providing a max mode or other setting that may indicate how the application 564*a* is to be displayed on the device. The display binding information is stored in a data structure to create and set a binding, in step 4924.

The established display binding may then be provided, by the multi-display management module 524, to the application 564*a*, in step 4928. The provided display binding data structure can become an attribute of the application 564*a*. An application 564*a* may thereinafter store the display binding attribute in the memory of the device 100. The application 564*a* with the display binding may then generate a user interface based on this display binding. The application 564*a* may be unaware of the position of the display 110/114 but may, from the display binding, be able to determine the size of the available user interface to generate a window that has particular characteristics for that display setting.

When a configuration change happens to the device 100, the multi-display management module 524 may change the display binding and send a new display binding to the application 564*a*. In embodiments, the multi-display management module 524 may indicate to the application 564*a* that there is a new binding or, in other embodiments, the application 564*a* may request a display configuration change or a new display binding, in which case the multi-display management module 524 may send a new display binding to the application 564*a*. Thus, the multi-display management module 524 can change the configuration of the display for the application 564*a* by altering the display binding for the application 564*a* during the execution of that application 564*a*.

The multi-display management module 524 thereinafter, while the application 564*a* is executing, can determine if there has been a configuration change to the device 100, in step 4932. The configuration change may be an event (see FIGS. 3A and 3B) triggered by one or more signals from one or more hardware sensor 172, 176, etc. For example, if the device 100 is changed from portrait 304 to landscape 340 orientation, Hall effect sensors 172 may indicate to the framework 520 that a display configuration change has been made. Other changes may include transitions from a single display 304 to a dual display configuration 320, by opening the device. Other types of configuration changes may be possible and may be signaled to alert the multi-display management module 524 of the configuration change. If a configuration change has been made, the method 4900 proceeds YES to step 4920 so that the multi-display management module 524 can determine new application display mode settings and create a new display binding, which may be passed to the application 564*a*. If there are no configuration changes, the method 4900 precedes NO to step 4936.

In step 4936, a new application mode change may be determined. Application mode changes can also occur in the application 564*a*, and thus, the application 564*a* can determine if something has occurred within the application 564*a* that requires a different display setting. The mode change can create a desire to change the display 110/114, and thus, require the application 564*a* to generate a new manifest. If the application 564*a* does sense a mode change or an event has occurred that requires a change in display setting, the method 4900 proceeds YES back to step 4912. At step 4912, a new manifest or preference is created by the application 564*a* that may be received by the multi-display management module 524 to determine if the multi-display management module 524 can change the display binding. If it is possible to provide the preferred display, the multi-display management module 524 can create a new display binding and send display binding back to the application 564a and allow the application 564a to alter its user interface. If no mode change is sensed or an event is not received to create a mode change, the method 4900 proceeds NO to end operation 4940.

Figure 37A:
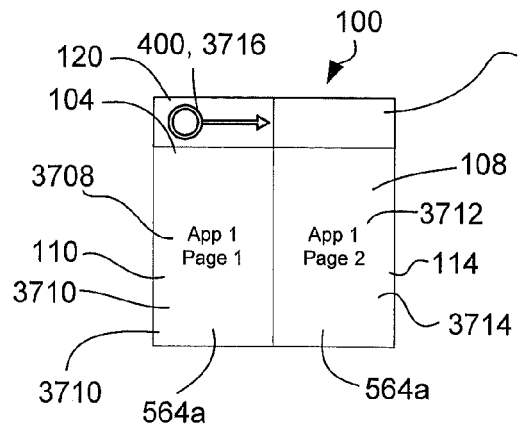
FIG. 37A is a representation of an output of a multiple screen device in accordance with embodiments of the present invention.

FIG. 37A depicts a device 100 with first 104 and second 108 screens. In this example, the screens 104, 108 are in a dual portrait mode or orientation. Moreover, the device 100 is shown executing or accessing a first application 564a. In the state depicted in FIG. 37A, the first screen 104 displays a first set of information comprising a first page 3708 of the first application 564a. The second screen 108 displays a second set of information comprising a second page 3712 of the first application 564a. As an example, and without limitation, the first application 564a may comprise a browser application. Moreover, the first page 3708 may comprise a control page or other ancillary page 3710. For example, and without limitation, the control page 3710 may present a list of bookmarks, a list of most visited websites, or a browsing history. The second page 3712 may comprise a content page or other primary page 3714. As examples, and without limitation, the content page 3714 may comprise the content of a website accessed by the browser application, or a landing page generated by the browser application. The gesture 3716 shown in FIG. 37A depicts a gesture or other touch input provided by a user to minimize the view of the first application 564a from two pages to one. As shown, the gesture 3716 may be entered in an area or region of the screens 104, 108 that is outside of the areas or regions of the screens 104, 108 in which the pages 3708, 3712 of the first application 564a are presented or displayed. For instance, the gesture 3716 can be received in the gesture capture region 120 of the first screen 104 or the gesture capture region 124 of the second screen 108. As a further example, the gesture 3716 may be entered in the touch sensitive display region 110 of a first screen 104 or the touch sensitive display region 114 of the second screen 108. Although the specific gesture 3716 illustrated in the figure comprises a drag gesture 400, other gestures or inputs can be used, depending on the configuration of the device 100.

Figure 37B:
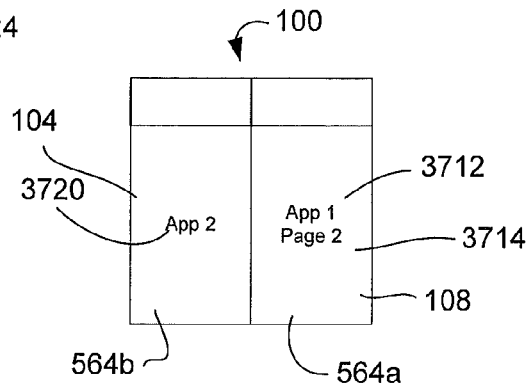
FIG. 37B is a representation of an output of the multiple screen device illustrated in FIG. 37A, after a minimization operation.

FIG. 37B depicts the output of the screens 104, 108 after the receipt of the gesture 3716 from the user. In particular, the first screen 104 now displays a page or other output 3720 related to a second application 564b in a stack 760, or alternatively a desktop view, for example where a second application 564b is not active. The second screen 108 continues to display the second page 3712 of the first application 564a. Accordingly, the minimization operation command entered with respect to the display generated in association with the first application 564a has the effect of discontinuing or dismissing the first page 3708 of the first application 564a. The display of the second page 3712 of the first application 564a continues. In particular, any minimization operation performed with respect to the first application 564a while the first 3708 and second 3712 pages are displayed results in the first page 3708 (in this example the control or ancillary page 3710) being closed, while the second page 3712 (in this example the content or primary page 3714) persists.

Figure 38A:
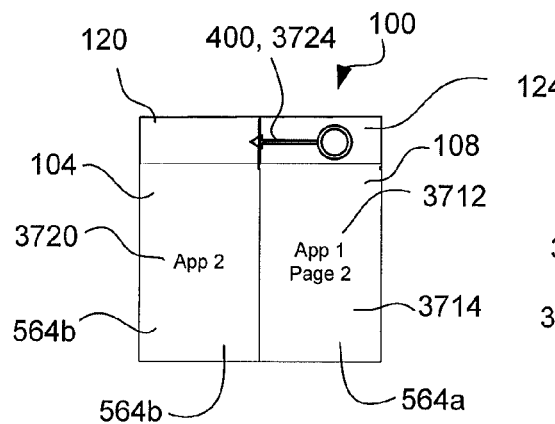
FIG. 38A is a representation of an output of a multiple screen device in accordance with embodiments of the present invention.
Figure 38B:
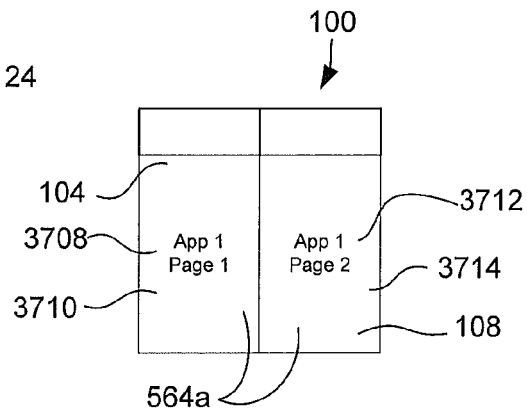
FIG. 38B is a representation of the output of the multiple screen device illustrated in FIG. 38A, after a maximization operation.

FIG. 38A depicts an output configuration similar or the same as that depicted in FIG. 37B. However, in FIG. 38A, input, in this example in the form of a gesture 3724, comprising a maximization operation command is received with respect to the first application 564a. In this example, the gesture 3724 is depicted as a drag gesture 400 received in the gesture capture region 124 of the second screen 108. Alternatively, the input to perform a maximization operation could have been entered through any other gesture or command operable to maximize the first application 564a. The result of the receipt of the gesture 3724 is depicted in FIG. 38B. In particular, the maximization command results in the display of the first page 3708 associated with the first application 564a in the first screen 104, while the second screen 108 continues to display the second page 3712 associated with the first application 564a. Accordingly, when a maximization command is received with respect to the first application 564a, and while the second page 3712 associated with the first application 564a is being displayed, the first page 3708 is displayed by the first screen 104, in place of the page 3720 associated with the second application 564b. In accordance with further embodiments, where the command to maximize the first application 564a is received while the second page 3712 is displayed in the first screen, the maximization operation results in the first page 3708 being displayed in the first screen 104, and the second page 3712 being displayed in the second screen 108.

Figure 39A:
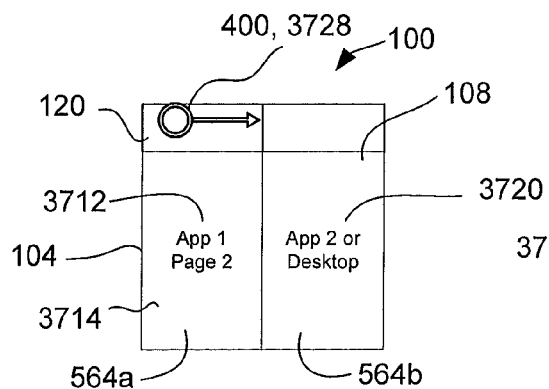
FIG. 39A is a representation of an output of a multiple screen device in accordance with embodiments of the present invention.
Figure 39B:
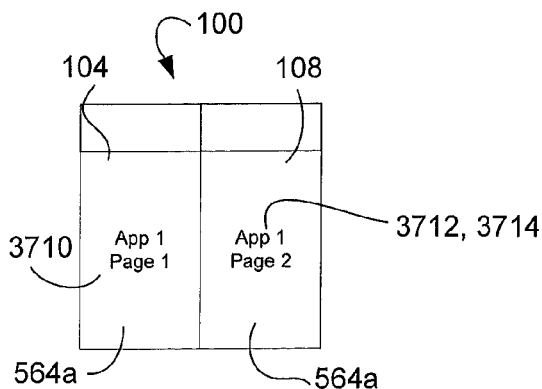
FIG. 39B is a representation of the output of the multiple screen device illustrated in FIG. 39A, after a maximization operation.

FIG. 39A depicts another exemplary output of the screens 104, 108 of the device 100 in accordance with embodiments of the present invention. In this example, the device has been controlled such that the first screen 104 displays the second page 3712 associated with the first application 564a in the first screen 104 of the device 100, while the second screen 108 has been controlled to display a page 3720 associated with a second application 564b, or a desktop view. A gesture 3728 or other input comprising a maximization command is depicted. The result of the maximization operation performed in response to that command is shown in FIG. 39B. In particular, the receipt of the maximization command has resulted in the display of the second page 3712 associated with the first application 564a in the second screen 108 of the device 100, in place of the page 3720 associated with the second application 564b or the desktop display. In addition, the first page 3708 of the first application 564a is displayed in the first screen 104.

Figure 40:
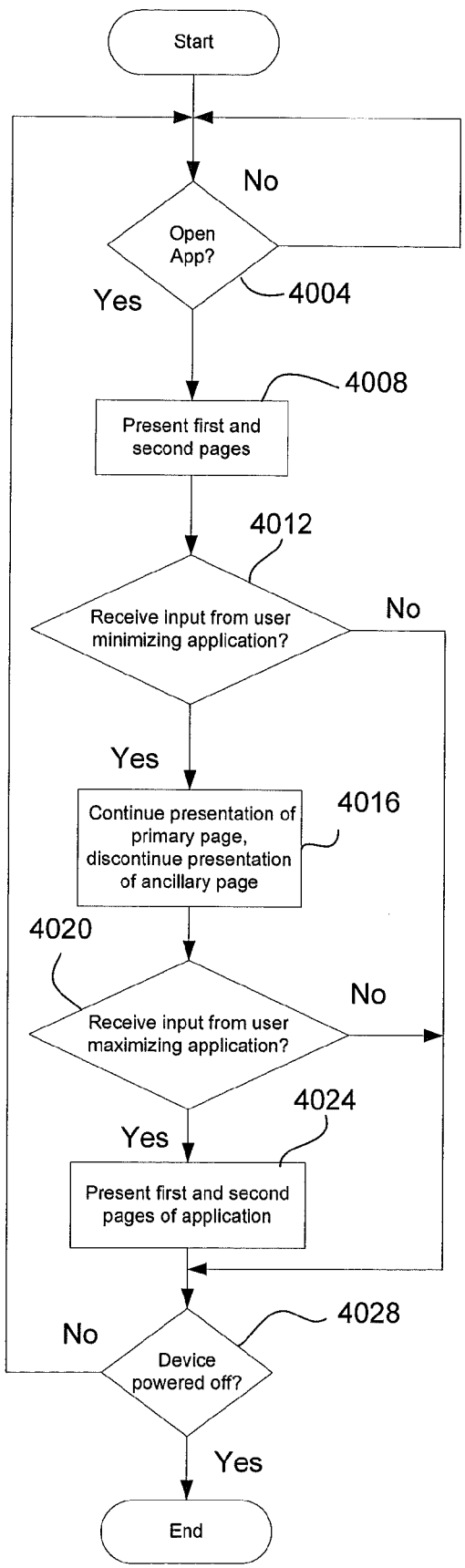
FIG. 40 is a flowchart depicting aspects of a method for minimizing and maximizing between portrait dual display and portrait single display in accordance with embodiments of the present invention.

With reference now to FIG. 40, aspects of a method for minimizing or maximizing a display of application information with respect to an application 564 that presents information in primary and ancillary pages are depicted. Initially, at step 4004, a determination is made as to whether a command to open an application 564 has been received. A command to open an application 564 can be entered by a user providing input to the device 100. Alternatively or in addition, a command to open an application 564 can be received through operation of programming associated with or executed by the device 100, or through a command received by an interconnected device. Until a command to open an application 564 is received, the process may idle at step 4004. After a command to open an application 564 is received, the device 100 presents first and second pages of output associated with the opened application 564 (e.g., a first application 564a) in the first 104 and second 108 screens of the device 108 (step 4008). Moreover, in accordance with embodiments of the present invention, one of the pages 3708 or 3712 is a preferred or primary page 3714, while the other of the pages 3708 or 3712 is an ancillary or secondary page 3710.

At step 4012, a determination is made as to whether input has been received from a user minimizing the opened application 564. If such input has been received, presentation of the preferred or primary page 3714 is continued, while the presentation of the ancillary or secondary page 3710 is discontinued (step 4016). In accordance with embodiments of the present invention, the preferred page 3714 can occupy either the first 104 or second 108 screen of the device 100. Moreover, following the receipt of the minimization command, the preferred or primary 3714 page can continue to be presented in the screen 104 or 108 that originally presented that page 3714. Alternatively, the screen 104 or 108 used to present the primary page 3714 can be changed. Whether the screen 104 or 108 used to present the primary page is switched or not can depend on the nature of the minimization command. For example, if the device 100 is switched from a dual portrait mode to a single portrait mode, the screen 104 or 108 remaining as the primary screen following the change to the single portrait mode can be used to display the primary page 3714.

After performing minimization, a determination can be made as to whether input from a user in the form of a maximization command has been received (step 4020). If a command to perform a maximization operation with respect to the application 564 has been received, the first 3708 and second 3712 pages of the application 564 are presented by the device 100 (step 4024). That is, in accordance with embodiments of the present invention, both the primary 3714 and the secondary 3710 pages are displayed as a result of the maximization operation. Moreover, the maximization command can result in the display of the primary page 3714 in a predetermined one of the first 104 and second 108 screens, without regard to whether doing so results in moving an auxiliary page 3710 displayed when the maximization command was received to a different screen 104 or 108.

After acting on a maximization command at step 4024, or after determining that no input has been received at steps 4012 or 4020, a determination may be made as to whether the device 100 has been powered off (step 4028). If the device 100 has not been powered off, the process can return to step 4004. Alternatively, the process can end.

Figure 41A:
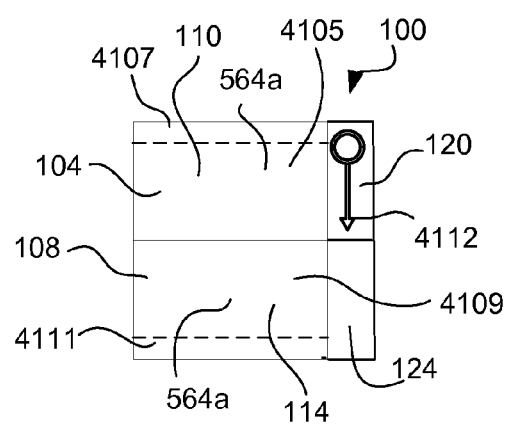
FIG. 41A is a representation of an output of a multiple screen device in accordance with embodiments of the present invention.

FIG. 41A depicts a device 100 with first 104 and second 108 screens. In this example, the screens 104, 108 are in a dual landscape mode or orientation. Moreover, the device 100 is shown executing or accessing a first application 564a. In the state depicted in FIG. 41A, the first screen 104 displays a first set of information comprising a first portion 4105 of the first application 564a. The second screen 108 displays a second set of information comprising a second portion 4109 of the first application 564a. As an example, and without limitation, the first application 564a may comprise a browser application. Moreover, the portions 4105 and 4109 of the first application 564a displayed by the first 104 and second 108 screens may comprise the content of a website accessed by the browser application, or a landing page generated by the browser application. Alternatively or in addition, the portions 4105 and 4109 can include control features or information. For example, the first screen 104 can display content 4105 and an address bar 4107, while the second screen 108 can display additional content 4109 and an action bar 4111. Moreover, the screens 104 and 108 can be operated as different portions of a virtual single screen. Accordingly, the content 4105 and 4109 can, in combination, present a unified image or output. The gesture 4112 shown in FIG. 41A depicts a gesture or other touch input provided by a user to minimize the view of the first application 564a, such that the first application 564a is minimized. As shown, the gesture 4112 may be entered in an area or region of the screens 104, 108 that is outside of the areas or regions of the screens 104, 108 in which the portions of the first application 564a are presented or displayed. For instance, in the example of FIG. 41A, the gesture 4112 can be received in the gesture capture region 120 of the first screen 104 or the gesture capture region 124 of the second screen 108. Moreover, the portions of the first application 564a can be displayed within touch sensitive display regions 110, 114 of the first 104 and second 108 screens respectively. Where, as in the example of FIG. 41A, the gesture 4112 is entered in the gesture capture region 120 of the first screen 104, and where the gesture 4112 comprises a motion that moves in a direction from a top of the first screen 104 towards the bottom of the first screen 104, the effect may be to minimize the display such that the first application 564a is only displayed by the second screen 108, and is no longer displayed by the first screen 104. While the minimization operation is being performed, the content that was displayed by the top screen 104 can appear to slide over the top of the content displayed by the second screen 108. Although the specific gesture 4112 illustrated in the figure comprises a drag gesture 400, other gestures or inputs can be used, depending on the configuration of the device 100.

Figure 41B:
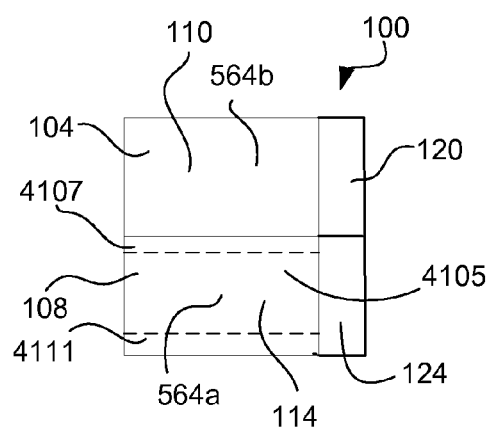
FIG. 41B is a representation of an output of the multiple screen device illustrated in FIG. 41A, after a minimization operation.

FIG. 41B depicts the output of the screens 104, 108 after the receipt of the gesture 4112 from the user. In particular, the first screen 104 now displays a page or other output related to a second application 564b in a stack 760, or alternatively a desktop view, for example where a second application 564b is not active. The second screen 108 continues to display the first application 564a. More particularly, the second screen 108 displays a portion of the first application 564a, that can include all or part of the portion 4105 that had been displayed by the first screen 104 prior to receipt of the gesture 4112. For example, some or all of the content 4105 that was previously displayed by the first screen, the address bar 4107, and the action bar 4111, can all be displayed by the second screen 108 following the minimization operation.

Figure 42A:
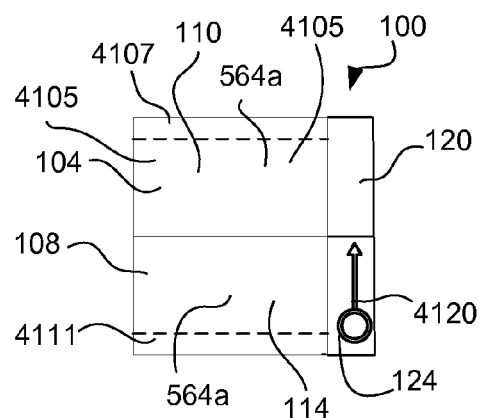
FIG. 42A is a representation of an output of a multiple screen device in accordance with embodiments of the present invention.

FIG. 42A depicts an output configuration similar or the same as that depicted in FIG. 41A. However, in FIG. 42A, a gesture 4120 is received in the gesture capture region 124 of the second screen 108. In addition, the gesture 4120 in this example may comprise an input that moves along a line in a direction from the bottom of the second screen 108 towards the top of the second screen 108. This gesture 4120 has the effect of minimizing the application 564a so that it is no longer displayed by the second screen 108.

Figure 42B:
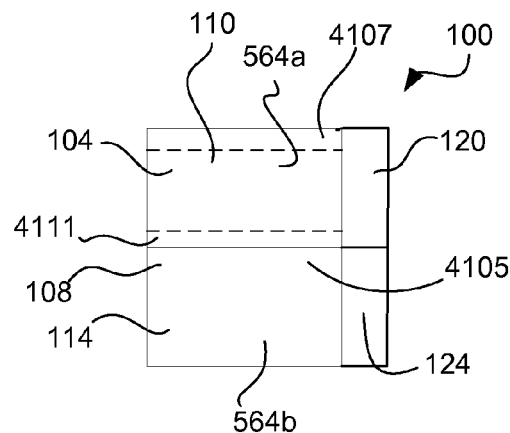
FIG. 42B is a representation of an output of the multiple screen device illustrated in FIG. 42A, after a minimization operation.

FIG. 42B depicts the output of the screens 104, 108 after the receipt of the gesture 4120 from the user. In particular, the first screen 104 presents a view of at least some of the application 564a, while the display of the first application 564a in the second screen 108 is discontinued. Accordingly, following entry of the gesture 4120, a portion of the first application 564a is displayed by the first screen 104. The second screen 108, following the minimization operation, displays a page or other output related to a second application 564b in a stack 760, or alternatively a desktop view. Accordingly, the minimization operation entered with respect to the second screen 108 has the effect of discontinuing or dismissing the presentation of a portion of the first application 564a by the second screen 108. Moreover, where the minimization operation is performed upward from the lower, second screen 108, towards the upper, first screen 104, the portion presented by the first screen 104 may contain at least some of the information presented by the portion presented by the first screen 104 prior to entry of the minimization gesture 4120. For example, and without limitation, where the first application 564a comprises a browser application, the portion 4128 presented by the first screen 104 can comprise at least some of the content of a webpage presented by the first screen 104 prior to the minimization operation, but with the addition of at least some controls or information previously displayed by the second screen 108. Examples of such additional information can include, but are not limited to, a notification bar, a tab bar, an action bar 4111, or other control inputs. In addition, while the minimization operation is being performed, the content displayed by the second screen 108 can be depicted as being slid under the content displayed by the first screen 104.

Figure 43A:
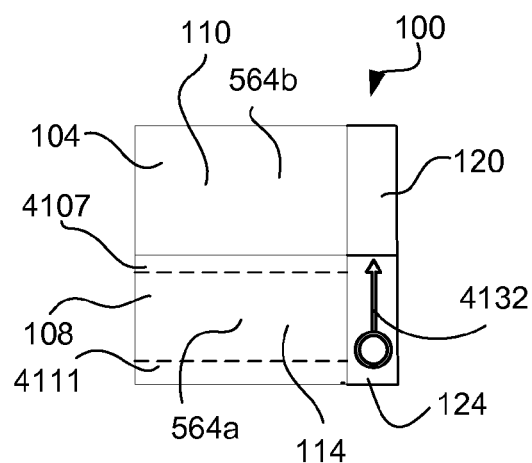
FIG. 43A is a representation of an output of a multiple screen device in accordance with embodiments of the present invention.
Figure 43B:
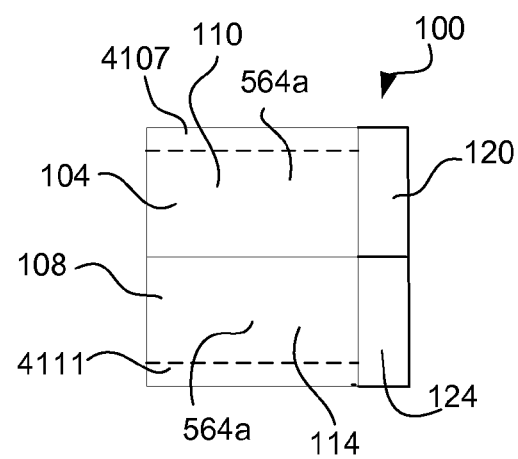
FIG. 43B is a representation of the output of the multiple screen device illustrated in FIG. 43A, after a maximization operation.

FIG. 43A depicts an output configuration similar to or the same as that depicted in FIG. 41B. However, in FIG. 43A, input, in this example in the form of a gesture 4132 comprising a maximization operation command is received with respect to the first application 564a, while that first application 564a has been minimized to the second screen 108. In this example, the gesture 4132 is depicted as a drag gesture 400 received in the gesture capture region 124 of the second screen 108. Alternatively, the input to perform a maximization operation could have been entered through some other gesture or command operable to maximize the first application 564a. The result of the receipt of the gesture 4132 is depicted in FIG. 43B. As a result of the maximization operation, the display of the second application 564b or the desktop view by the first screen 104 is replaced by a portion of the view of the first application 564a. More particularly, the portion of the view of the first application 564a displayed by the first screen 104 can include at least some of the view previously presented by the second screen 108. Moreover, after entry of the maximization command, the second screen 108 can display a further portion of the view of the control of the first application 564a. Accordingly, the view of the content of the first application 564a and/or controls or other information associated with the first application 564a can be expanded. In addition, a display of, for example, an address bar 4107, which prior to the maximization operation was presented by the second screen 108, can be presented by the first screen 104 after the maximization operation. A display of other information, for example of a tab or action bar 4111 may continue to be presented by the second screen 108. As can be appreciated by one of skill in the art after consideration of the present disclosure, the effect of the maximization operation can therefore be to display additional content from a page accessed by a browser or other application 564 as compared to the minimized configuration shown in FIG. 43A.

Figure 44A:
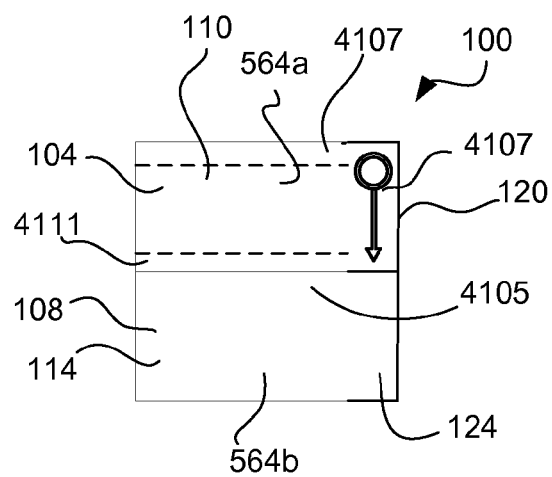
FIG. 44A is a representation of an output of a multiple screen device in accordance with embodiments of the present invention.
Figure 44B:
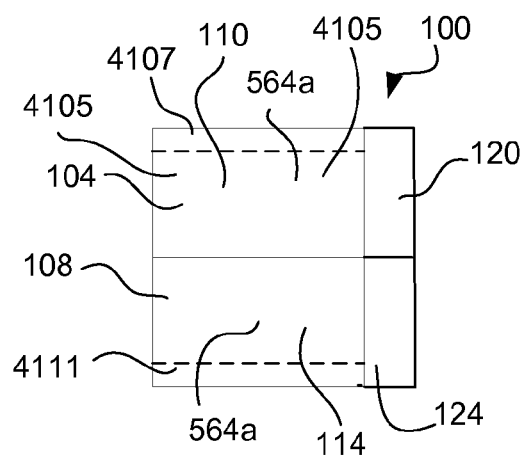
FIG. 44B is a representation of the output of the multiple screen device illustrated in FIG. 44A, after a maximization operation.

FIG. 44A depicts an output configuration similar to or the same as that depicted in FIG. 42B. However, in FIG. 44A, input, in this example in the form of a gesture 4135 comprising a maximization operation command is received with respect to the first application 564a, while that first application 564a has been minimized to the first screen 104. In this example, the gesture 4135 is depicted as a drag gesture 400 received in the gesture capture region 120 of the first screen 104. Alternatively, the input to perform a maximization operation could have been entered through some other gesture or command operable to maximize the first application 564a. The result of the receipt of the gesture 4135 is depicted in FIG. 44B. More particularly, as a result of the maximization operation, the display of the second application 564b or the desktop view by the second screen 108 is replaced by a portion of the view of the first application 564a. More particularly, the portion of the view of the first application 564a displayed by the second screen 108 can include at least some of the view previously presented by the first screen 104. Moreover, after entry of the maximization command, at least one of the first screen 104 and the second screen 108 can display a further portion of the view of the content of the first application 564a. Accordingly, the view of the content of the first application 564a and/or control or other information associated with the first application 564a can be expanded from only the second screen 108, to both the first screen 104 and the second screen 108. In addition, the display of, for example an action bar 4111 that prior to the maximization operation was presented by the first screen 104, can be presented by the second screen 108 after the maximization operation. A display of other information, for example of an address bar 4107, may continue to be presented by the first screen 104. As can be appreciated by one of skill in the art after consideration of the present disclosure, the effect of the maximization operation can therefore be to display additional content from a page accessed by a browser or other application 564 as compared to a minimized configuration.

Figure 45:
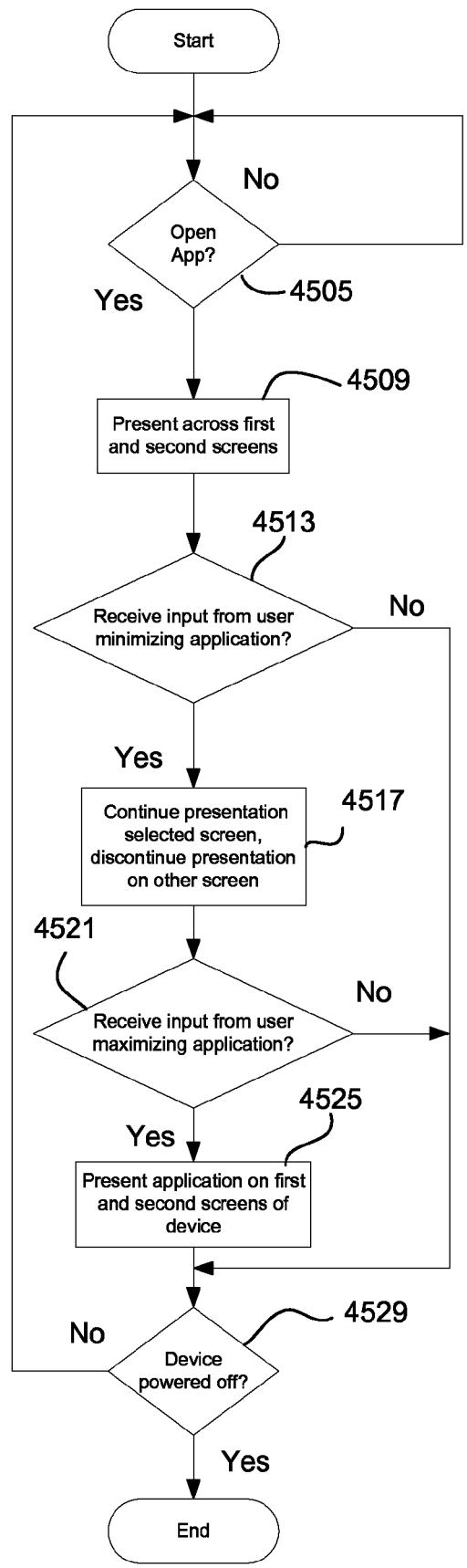
FIG. 45 is a flowchart depicting aspects of a method for minimizing and maximizing between landscape dual display and landscape single display in accordance with embodiments of the present invention.

With reference now to FIG. 45, aspects of a method for minimizing or maximizing a display of application information with respect to an application 564 that presents information to a user in connection with a multiple screen device 100 are depicted. Initially, at step 4505, a determination is made as to whether a command to open an application 564 has been received. A command to open an application 564 can be entered by a user providing input to the device 100. Alternatively or in addition, a command to open an application 564 can be received through operation of programming associated with or executed by the device 100, or through a command received by an interconnected device. Until a command to open an application 564 is received, the process may idle at step 4504. After a command to open an application 564 is received, the device 100 can, in an exemplary default configuration, present portions of the opened application 564 (e.g., a first application 564a) in the first 104 and second 108 screens of the device 100 (step 4509). Alternatively, user input can be provided to control the format of the initial presentation of an opened application 564.

At step 4513, a determination is made as to whether input has been received from a user minimizing the opened application 564. If such input has been received, the presentation of at least a portion of the opened application 564 is continued with respect to a selected screen 104 or 108, while presentation of portions of the opened application 564 is discontinued with respect to the other screen 104 or 108 (step 4517). In accordance with embodiments of the present invention, at least portions of the application 564 displayed by the screen 104, 108 prior to the minimization operation that was not selected are, following the minimization operation, presented by the selected screen 104 or 108. For example, a control input overlay or other information can be presented by the selected screen. As a further example, for instance where the second screen 108 is the selected screen, and where a device 100 is oriented such that the second screen 108 is below the first screen 104, content of the first application 564, as well as control overlays, can be presented by the selected screen following the minimization operation.

At step 4521, a determination can be made as to whether input from the user in the form of a maximization command has been received. If a command to perform a maximization operation with respect to the application 564 has been received, portions of the first application are displayed by both the first 104 and second 108 screens (step 4525). As an example, where the top 104 screen presented a view of the application 564 prior to the maximization operation, following the maximization operation the view of the application 564 is expanded to the second screen 108. For instance, the maximization operation enables the device 100 to present additional content. In addition, a control input overlay or other information previously presented by the first screen 104 can be presented by the second screen 108 following the maximization operation. As a further example, where the second screen 108 presented a view of the first application 564 prior to the maximization operation, the view can be expanded to the first screen 104, and additional content can be displayed. In addition, at least some control overlay or other information previously presented by the second screen 108 can, following the maximization operation, be presented by the first screen 104.

After acting on a maximization command at step 4524, or after determining that no input has been received at steps 4512 or 4520, a determination may be made as to whether the device 100 has been powered off (step 4529). If the device 100 has not been powered off, the process can return to step 4505. Alternatively, the process can end.

Although particular examples have been discussed in which minimization and maximization operations are performed in connection with a device 100 having first 104 and second 108 screens, other embodiments can be implemented in connection with a device 100 incorporating or controlling more than two screens. For example, embodiments can perform minimization and maximization operations across multiple devices where each of the devices are operated cooperatively, and where each of the devices incorporates one or more screens. In accordance with still other embodiments, minimization and maximization operations can be performed in connection with devices having virtualized multiple screens.

Figure 46:
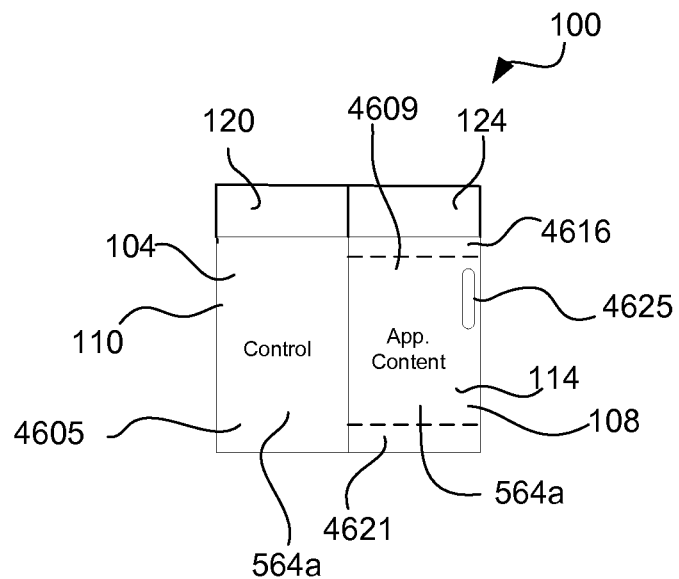
FIG. 46 is a representation of an output of a multiple screen device in a portrait dual orientation in accordance with embodiments of the present invention.

FIG. 46 is a representation of the output of a multiple screen device 100 while in a dual portrait orientation in accordance with embodiments of the present invention. More particularly, the device 100 is shown executing or accessing a first application 564a. The first screen 104, in a default mode, displays control information 4605 associated with the first application 564a. The second screen 108 presents content information 4609 associated with the first application 564a. The second screen 108 can additionally display control information, for example as part of a first control information area 4617 and/or a second control information area 4621. In accordance with still other embodiments, a page scroll overlay or input 4625 may be displayed by the second screen 108. Accordingly, as can be appreciated by one of skill in the art, the first 104 and second 108 screens generally comprise touch sensitive display 110 and 114 areas, to display information to a user, and to receive input from the user in connection with display controls or content.

In accordance with at least some embodiments, while presenting control information 4605 in the first screen 104, input scrolling the application content 4609 displayed by the second screen 108 has the effect of scrolling the application content 4609 within the second screen 108, while leaving the presentation of control information 4605 by the first screen 104 unaltered. In accordance with still other embodiments, a full screen mode can be entered, in which application content 4609 is expanded, to occupy both the first 104 and second 108 screens. In the full screen view, the control information 4605 is therefore replaced by application content 4609 information.

In an exemplary embodiment, the first application 564a is a browser application. Accordingly, control information 4605 can include bookmark tabs, most viewed tabs, history tabs, and the like. The content information 4609 can include a browser canvas, for example presenting the content of a webpage accessed by the browser application 564a. Moreover, control information 4617 and/or 4621 displayed on the first screen 104 can include controls that supplement or that are in addition to controls 4605 presented by the first screen 104.

Figure 47:
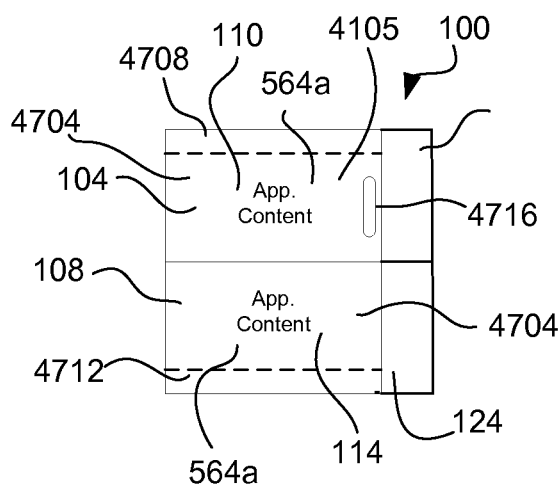
FIG. 47 is a representation of an output of a multiple screen device in a landscape dual orientation in accordance with embodiments of the present invention.

FIG. 47 depicts the device 100 as shown in FIG. 46, but in a dual landscape orientation. In the dual landscape orientation, application content 4704 is displayed by both the first 104 and second 108 screens. In addition, a first set of control information 4708 may be displayed by the first screen 104, and a second set of control information 4712 can be displayed by the second screen 108. In the dual landscape orientation, input entered by a user to scroll the displayed application content 4704 has the effect of scrolling or otherwise moving that application content 4704 across both the first screen 104 and the second screen 108. As an example, a scroll command can be entered by a user through a scroll bar 4716 presented within a touch sensitive display area 110 or 114 of the first 104 or second 108 screens respectively. As another example, in the dual landscape orientation, a user can scroll application content 4704 within both screens 104 and 108 simultaneously by entering a gesture within a gesture capture region 120 associated with the first screen 104, or within a gesture capture region 124 associated with the second screen 108.

In accordance with at least some embodiments, the control information 4708 and 4712 displayed while the device 100 is in the dual landscape mode can include some or all of the control information 4617 and/or 4621 presented by the second screen 108 while the device 100 is in the dual portrait orientation. Moreover, in at least some embodiments, the control information areas 4708 and 4712 in the dual landscape orientation can include controls that are in addition to those presented by the control information areas 4617 and 4621 while the device 100 is in the dual portrait orientation, due to the larger available screen area provided for the control information 4708 and 4712 in the dual landscape orientation. In addition, a user can choose to access a control panel while the device 100 is in the dual landscape orientation. For instance, a user can choose to access the control information that would be displayed by the device 100 in the dual portrait orientation. If the user chooses to access a control panel while in the dual landscape mode, the display of application content 4704 by the first 104 and second 108 screens is discontinued, and the accessed control panel is displayed across both the first 104 and second 108 screens.

Figure 48:
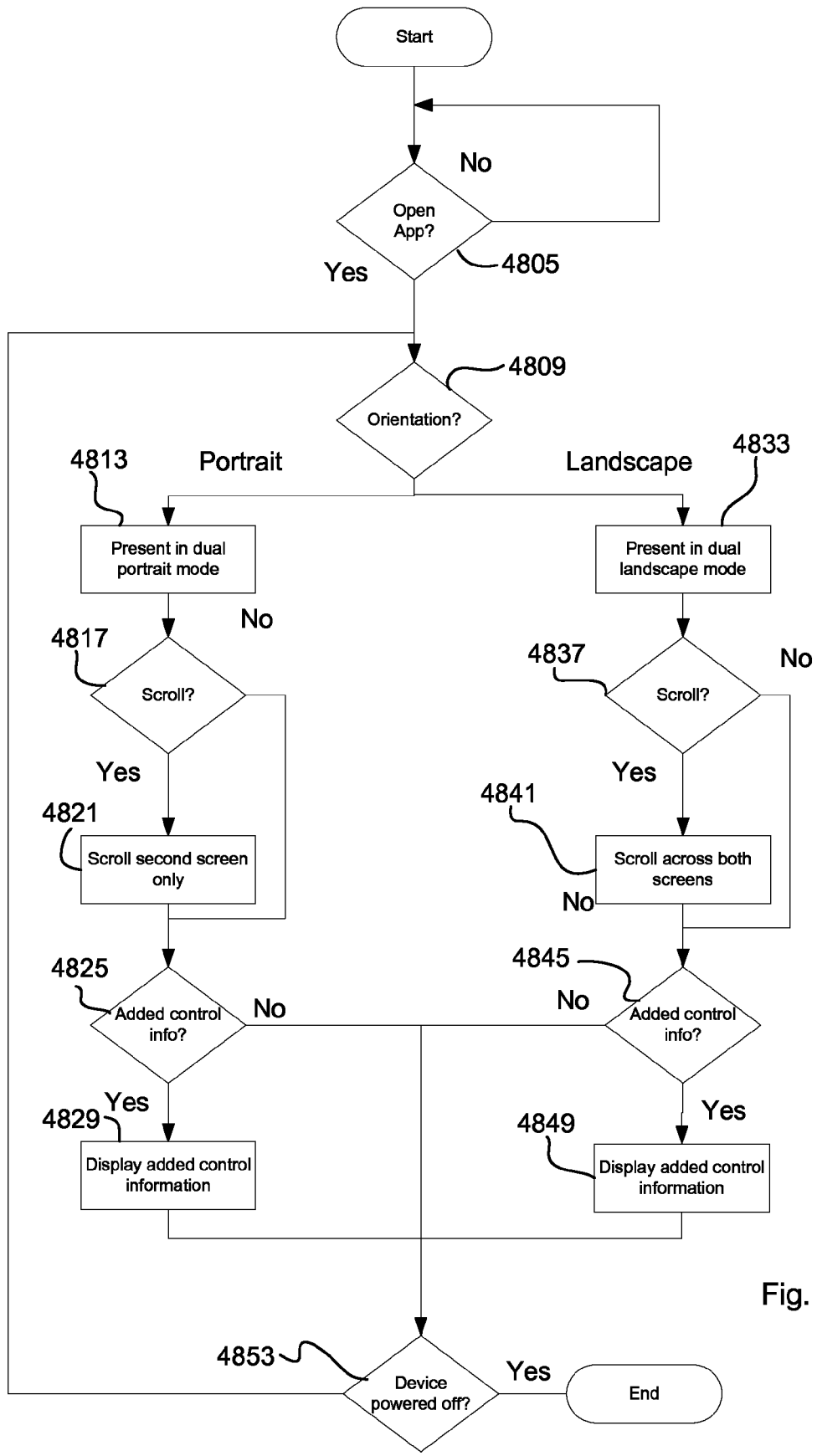
FIG. 48 is a flowchart depicting aspects of a method for presenting information using a dual screen device in accordance with embodiments of the present invention.

With reference now to FIG. 48, aspects of a method for controlling the displays of a multiple screen device are depicted. Initially, at step 4805, a determination is made as to whether a command to open an application 564 has been received. A command to open an application 564 can be entered by a user providing input to the device 100. Alternatively or in addition, a command to open an application 564 can be received through operation of programming associated with or executed by the device 100, or through a command received by an interconnected device. Until a command to open an application 564 is received, the process may idle at step 4805. After a command to open an application 564 is received, the device 100 determines the orientation of the device 100 (step 4809).

If the device 100 is in a dual portrait orientation, the application is presented in a default view for the opened application 564 and the dual portrait operating mode (step 4813). More particularly, the first screen 104 may be used to present control information, while the second screen 108 may be used to present content information. At step 4817, a determination is made as to whether control input is received from a user to scroll the application content. If control input to scroll the application content is received, the application content presented by the second screen 108 is scrolled, while the display of the first screen 104 remains unaltered (step 4821). At step 4625, a determination can be made as to whether input has been received to access additional control information. If such input is received, the additional control information can be displayed (step 4829). For example, if the additional input includes a command to display enhanced control information with respect to the second screen 108, one or both of the control areas 4617 and 4621 can be altered or expanded. Alternatively, where the input is received with respect to the first screen 104, the displayed control panel can be altered and/or replaced by a different control panel.

If the orientation is determined at step 4809 to be a dual landscape orientation, the display is configured in the dual landscape default view for the selected application 564 (step 4833). At step 4837, a determination can be made as to whether a scroll input has been received. If a scroll input has been received, the displayed application content is scrolled across both the first 104 and second 108 screens (step 4841). The scroll input can be received as a manipulation of a scroll bar 4716 presented by the first 104 or second 108 screens. Alternatively or in addition, the scroll command can be received as a gesture entered in one of the gesture capture regions 120 or 124. At step 4845, a determination can be made as to whether a command to display additional control information has been received. If such a command has been received, one or both of the control information areas 4708 or 4712 can be expanded or otherwise modified (step 4849). For example, control information 4708 on the first screen 104 and/or control information 4712 on the second screen 108 can be expanded or otherwise modified.

After displaying added or modified control information at step 4829 or 4849, or after determining that a command to display additional or modified control information has not been received, a determination may be made as to whether the device 100 has been powered off (step 4853). If the device has not been powered off, the process can return to step 4809. Otherwise, the process can end.

In accordance with embodiments of the present invention, methods disclosed herein can be performed by the execution of application programming stored in memory 208, 508 and by a processor 204, 504. For example, a windows management module or class 532 can include functionality to receive and act on input received from a user. Moreover, such input can include window management input, and can include the execution of steps to open or close applications 564, or windows presenting pages associated with such application 564, for example in connection with minimization and maximization operations. In addition, although certain embodiments have been described in connection with operation on a device 100 having first 104 and second 108 screens, the invention is not limited to operation on such a device. For example, embodiments of the present invention can be performed on a device or a combination of devices operating in concert with one another that have more than two screens, and/or in connection with a screen comprising virtual screens or windows.

Furthermore, while the exemplary aspects, embodiments, and/or configurations illustrated herein show the various components of the system collocated, certain components of the system can be located remotely, at distant portions of a distributed network, such as a LAN and/or the Internet, or within a dedicated system. Thus, it should be appreciated, that the components of the system can be combined in to one or more devices, such as a tablet-like device, or collocated on a particular node of a distributed network, such as an analog and/or digital telecommunications network, a packet-switch network, or a circuit-switched network. It will be appreciated from the preceding description, and for reasons of computational efficiency, that the components of the system can be arranged at any location within a distributed network of components without affecting the operation of the system. For example, the various components can be located in a switch such as a PBX and media server, gateway, in one or more communications devices, at one or more users' premises, or some combination thereof. Similarly, one or more functional portions of the system could be distributed between a telecommunications device(s) and an associated computing device.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

Also, while the flowcharts have been discussed and illustrated in relation to a particular sequence of events, it should be appreciated that changes, additions, and omissions to this sequence can occur without materially affecting the operation of the disclosed embodiments, configuration, and aspects.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the disclosed embodiments, configurations and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, subcombinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method for controlling a display of a device, comprising:
    placing the device in a first orientation, wherein the first orientation is a portrait dual orientation where first and second screens are in a portrait orientation joined by a hinge;
    while the device is in the first orientation, presenting a view of a first application across first and second screens of the device, wherein the first screen presents control information associated with the first application in a first window associated with the first application, the first window being managed in a first window stack associated with the first screen, and wherein the second screen presents content information associated with the first application in a second window associated with the first application, the second window being managed in a second window stack associated with the second screen, the first and second window stacks being respective logical arrangements within the operating system of one or more of active and inactive windows for the device, wherein an application model manager converts the logical window stack maintained in a task manager module to a linear organization that a user perceives;
    a stack position identifier associated with each window to identify the positions of the one or more active and inactive windows in the first or second window stacks;
    placing the device in a second orientation, wherein the second orientation is a landscape dual orientation where the first and second screens are in a landscape orientation joined by the hinge; and
    while the device is in the second orientation, presenting a view of the first application across the first and second screens of the device, wherein the first screen presents a first portion of content information associated with the first application, and wherein the second screen presents a second portion of content information associated with the first application.

2. The method of claim 1, wherein in the first orientation the second screen presents control information associated with the first application in addition to the content information, and wherein the control information presented by the second screen is different than the control information presented by the first screen.

3. The method of claim 2, wherein while the device is in the second orientation the at least one of the first and second screens presents control information associated with the first application in addition to content information, and wherein the control information presented by the at least one of the first and second screens while the device is in the second orientation includes the control information presented by the second screen when the device is in the first orientation.

4. The method of claim 3, wherein the control information presented by the at least one of the first and second screens while the device is in the second orientation includes control information that is in addition to the control information presented by the second screen when the device is in the first orientation.

5. The method of claim 3, wherein the control information associated with the first application presented by the second screen in the first orientation and by at least one of the first and second screens in the second orientation includes a scroll bar, the method further comprising:
    receiving input from a user to operate the scroll bar, wherein operation of the scroll bar in the first orientation scrolls the content information presented by the second screen, and wherein operation of the scroll bar in the second orientation scrolls the content information presented by the first and second screens.

6. The method of claim 3, further comprising:
receiving input from a user while the device is in the first orientation selecting a full screen view;
in response to the input selecting a full screen view, presenting content information associated with the first application in both the first screen and the second screen.

7. The method of claim 2, further comprising:
receiving input from a user while the device is in the first orientation to access additional control information using the second screen;
in response to the input to access additional control information using the second screen, presenting additional control information on the second screen, wherein the control information presented by the first screen is not altered by the input to access additional control information on the second screen.

8. The method of claim 1, wherein the first and second screens are each associated with a gesture capture region, wherein the gesture capture region is operable to scroll the content information in response to user input.

9. The method of claim 8, further comprising:
receiving input from a user in one of the gesture capture region associated with the first screen and the gesture capture region associated with the second screen, wherein with the device in the second orientation the content information is scrolled in both the first and second screens in response to the input.

10. The method of claim 1, further comprising:
while the device is in the second orientation, receiving input from a user to access control information;
in response to the input to access control information while the device is in the second orientation, presenting a view of the accessed control information across the first and second screens of the device, wherein the first screen presents a first portion of the accessed control information, and wherein the second screen presents a second portion of the control information.

11. The method of claim 10, wherein after receiving the input to access control information, and while in the second orientation, the first and second screens do not display content information associated with the first application.

12. The method of claim 3, wherein the first application is a web browser, and wherein the control information that is displayed by the first screen of the device while the device is in the first orientation and by the at least one of the first and second screens of the device while the device is in the second orientation includes at least one of a notification bar, a tab bar, and address bar, an action bar, and a page scroll overlay.

13. The method of claim 12, wherein the content information associated with the first application is a browser canvas.

14. A device, comprising:
a first screen, including:
a first touch screen display, wherein the first touch screen display is located within a first area of the first screen; and
a first gesture capture region, wherein the first gesture capture region is located within a second area of the screen;
a second screen, including:
a second touch screen display, wherein the second touch screen display is located within a first area of the second screen; and
a second gesture capture region, wherein the second gesture capture region is located within a second area of the second screen;

memory;
a processor; and
application programming stored in the memory and executed by the processor, wherein the application programming is operable to:
determine an orientation of the device;
while the device is in a dual portrait orientation, where first and second screens are in a portrait orientation joined by a hinge, and in association with the execution of a first application:
present a first portion of a view of the first application within the first touch screen display in a first window associated with the first application, the first window being managed in a first window stack associated with the first screen, wherein the first portion includes control information associated with the first application;
present a second portion of a view of the first application within the second touch screen display in a second window associated with the first application, the second window being managed in a second window stack associated with the second screen, wherein the second portion includes content information associated with the first application, the first and second window stacks being respective logical arrangements within the operating system of one or more of active and inactive windows for the device, wherein an application model manager converts the logical window stack maintained in a task manager module to a linear organization that a user perceives;
a stack position identifier associated with each window to identify the positions of the one or more active and inactive windows in the first or second window stacks; and
while the device is in a dual landscape orientation where the first and second touch screens are in a landscape orientation joined by the hinge:
present a third portion of a view of the first application within the first touch screen display, wherein the third portion includes content information associated with the first application; and
present a fourth portion of a view of the first application within the second touch screen display, wherein the fourth portion includes content information associated with the first application.

15. The device of claim 14, wherein the application programming is further operable to receive input from a user to scroll the content information associated with the first application, wherein:
while the device is in the dual portrait orientation, scroll the content information presented by the second touch screen display, while leaving the first portion of the view of the application presented by the first touch screen display unaltered;
while the device is in the dual landscape orientation, scroll the content information presented by the first and second touch screen displays.

16. The device of claim 15, wherein the device is in the dual landscape orientation, and wherein the input received from a user to scroll the content information associated with the first application is received in one of the first and second gesture capture regions.

17. The device of claim 16, wherein the application programming is further operable to receive input from a user while the device is in the dual landscape orientation to access control information, wherein in response to the input to access control information the requested control information is presented by the first and second touch screen displays, and wherein no content information is presented by the first and second touch screen displays.

18. A non-transitory computer readable medium having stored thereon computer-executable instructions, the computer-executable instructions causing a processor to execute a method for selectively presenting an application across a display of a device, the computer-executable instructions comprising:

instructions to determine an orientation of the device;

while the device is in a portrait dual orientation, instructions to present control information associated with a first application in a first screen of the device in a first window associated with the first application, the first window being managed in a first window stack associated with the first screen, and to present content information in a second screen of the device in a second window associated with the first application, the second window being managed in a second window stack associated with the second screen, where first and second screens are in a portrait orientation joined by a hinge, the first and second window stacks being respective logical arrangements within the operating system of one or more of active and inactive windows for the device, wherein an application model manager converts the logical window stack maintained in a task manager module to a linear organization that a user perceives;

a stack position identifier associated with each window to identify the positions of the one or more active and inactive windows in the first or second window stacks; and while the device is in a landscape dual orientation, where first and second touch screens are in a landscape orientation joined by the hinge, instructions to present content information associated with the first application in the first and second screens of the device.

19. The non-transitory computer readable medium of claim 18, wherein no content is presented by the first screen while the device is in the portrait dual orientation and while the first screen is presenting control information.

20. The non-transitory computer readable medium of claim 19, wherein in response to input from a user to access control information while the device is in the landscape dual orientation, no content is presented by either the first screen or the second screen.

\* \* \* \* \*